(12) United States Patent
Kanno et al.

(10) Patent No.: US 9,077,209 B2
(45) Date of Patent: Jul. 7, 2015

(54) POWER GENERATION SYSTEM, POWER GENERATING MODULE, MODULE FIXING DEVICE AND METHOD FOR INSTALLING POWER GENERATION SYSTEM

(75) Inventors: Hiroshi Kanno, Osaka (JP); Hiroshi Yamamoto, Osaka (JP); Tomokazu Sada, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 788 days.

(21) Appl. No.: 13/352,457

(22) Filed: Jan. 18, 2012

(65) Prior Publication Data

US 2012/0187767 A1 Jul. 26, 2012

Related U.S. Application Data

(60) Provisional application No. 61/434,617, filed on Jan. 20, 2011.

(51) Int. Cl.
*H01F 27/42* (2006.01)
*H01F 37/00* (2006.01)
(Continued)

(52) U.S. Cl.
CPC ............ *H02J 17/00* (2013.01); *Y10T 29/49018* (2015.01); *Y10T 29/49826* (2015.01);
(Continued)

(58) Field of Classification Search
CPC ........... H02J 5/005; H02J 7/025; H02J 17/00; B60L 11/182; H01F 38/14
USPC ............. 307/104, 39, 44, 45, 82, 87, 153, 43; 375/295, 297; 355/75, 72; 506/30; 399/69, 329
See application file for complete search history.

(56) References Cited

U.S. PATENT DOCUMENTS 8,411,332 B2* 4/2013 Saiki .............................. 358/474
2008/0278264 A1 11/2008 Karalis et al.
(Continued)

FOREIGN PATENT DOCUMENTS

JP 09-275644 A 10/1997
JP 10-014139 A 1/1998
(Continued)

OTHER PUBLICATIONS

International Search Report for corresponding International Application No. PCT/JP2012/000290 mailed Apr. 24, 2012.
(Continued)

*Primary Examiner* — Rexford Barnie
*Assistant Examiner* — Jagdeep Dhillon
(74) *Attorney, Agent, or Firm* — Renner, Otto, Boisselle & Sklar, LLP.

(57) ABSTRACT

A power generation system includes power generating modules, and a module fixing device configured to fix the power generating modules. Each power generating module includes a power generating module body including a power generator that generates DC energy, and a power transmitter attached to the power generating module body. The power transmitter includes an oscillator that converts the DC energy into RF energy with a frequency f0, and a power transmitting antenna that transmits the RF energy as a resonant magnetic field. The module fixing device includes a first fixing member configured to fix the power generating modules, power receiving antennas each of which receives at least a part of the RF energy transmitted by the corresponding power transmitting antenna, and a second fixing member configured to fix the power receiving antennas. The respective outputs of the power receiving antennas are combined in parallel by the combining section.

36 Claims, 31 Drawing Sheets

(51) Int. Cl.
*H01F 38/00* (2006.01)
*H02J 17/00* (2006.01)
*H01L 31/02* (2006.01)
*H01L 31/05* (2014.01)
*H01L 31/042* (2014.01)
*H02S 40/36* (2014.01)

(52) U.S. Cl.
CPC .......... *H01L31/02021* (2013.01); *H01L 31/05* (2013.01); *Y02E 10/50* (2013.01); *H02S 20/00* (2013.01); *H02S 40/36* (2014.12)

(56) References Cited

U.S. PATENT DOCUMENTS

| | | | |
|---|---|---|---|
| 2009/0003868 A1* | 1/2009 | Namiki et al. | 399/69 |
| 2010/0033156 A1 | 2/2010 | Abe et al. | |
| 2010/0231340 A1 | 9/2010 | Fiorello et al. | |
| 2010/0259108 A1 | 10/2010 | Giler et al. | |
| 2010/0277120 A1* | 11/2010 | Cook et al. | 320/108 |
| 2010/0314947 A1* | 12/2010 | Baarman et al. | 307/104 |
| 2011/0158344 A1* | 6/2011 | Kawamura et al. | 375/295 |

FOREIGN PATENT DOCUMENTS

| | | |
|---|---|---|
| JP | 2006-136045 | 5/2006 |
| JP | 2010-541531 T | 12/2010 |

OTHER PUBLICATIONS

Form PCT/ISA/237 for corresponding International Application No. PCT/JP2012/000290 dated Apr. 24, 2012 and partial English translation.

Tenti et al., "Optimum Control of $N$-Input $K$-Output Matrix Converters", IEEE Transactions on Power Electronics, vol. 7, No. 4, pp. 707-713, Oct. 1992 (cited in [0221] of the specification).

Office Action and Search Report dated Dec. 29, 2014 for corresponding Chinese patent application No. 201280001956.2.

* cited by examiner (a)

(b)

POWER GENERATION SYSTEM, POWER GENERATING MODULE, MODULE FIXING DEVICE AND METHOD FOR INSTALLING POWER GENERATION SYSTEM

BACKGROUND OF THE INVENTION

1. Field of the Invention

The present invention relates to a resonant magnetic coupling type non-contact power transmission technology for transmitting power wirelessly by using resonant magnetic coupling instead of electromagnetic induction or electromagnetic waves. The present invention also relates to a power generation system for increasing the voltage of electric energy that has been generated by a power generating section such as a solar cell by the resonant magnetic coupling type non-contact power transmission technology.

2. Description of the Related Art

Recently, people have been paying more and more attention to solar power generation. In fact, a power plant for generating a lot of electric power by installing a huge number of solar power generators (i.e., so-called "solar cells", which will be sometimes simply referred to herein as "cells") in a wide area has become a reality.

A solar power generation system ordinarily uses a so-called "solar cell module" in which a huge number of cells are arranged inside a metallic module frame and connected together. A glass plate is arranged in front of the solar cell module (which will be simply referred to herein as a "module") so that the respective cells operate without being exposed to the air. And by assembling a number of such solar cell modules together, a solar power generation system can be established.

Use of such a solar power generation system, however, has not been widespread yet because the cost of manufacturing those modules, power conditioners and other components is too high, which is one of the major obstacles to its introduction. On top of that, the cost of establishing such a system by installing those modules is also too high to neglect. Among other things, the higher the altitude of the place of installation, the riskier and the more expensive the installation work will be, which is a serious problem to overcome in order to further popularize the solar power generation system.

As will be described later, in a conventional solar power generation system, the output voltage of each of its cells is so low that a great many solar cells should be connected together in series to obtain a voltage that is high enough to operate an electronic device or to output a utility grid voltage to sell and buy. If some of those solar cells that are connected together in series went out of order or exposed to a partial shade, the output power of the overall system would decline. And the presence of such a very large number of connection points is a decisive factor in the decline of the long-term reliability of the overall system. In addition, if those modules and cables deteriorate with a long-term use, their replacements should also be installed at such a height. Consequently, the cost of maintenance of the overall system will also rise.

To avoid throwing such a partial shade on the surface of a module, the terminals of the module are arranged on the back surface of the module, and therefore, the module terminals should be wired together on the back surface of the module, too. On the other hand, to generate as much electric power as possible, the modules should be arranged closely to each other with substantially no gaps left between them. Furthermore, as the areas of those modules have been further increasing lately, the work of connecting those big modules with cables at such a height have become even riskier and even more difficult these days.

As a conventional solar power generator that would overcome such problems, a power supply system for supplying energy wirelessly from outside of a building and through the walls of the building has been proposed (see Japanese Patent Application Laid-Open Publication No. 2006-136045 (Embodiment 5 and FIG. 16), for example). Such a power supply system transmits RF (radio frequency) energy through the walls by electromagnetic induction.

On the other hand, in another conventional solar power generator, a technique for connecting together those modules more simply has been proposed (see Japanese Patent Application Laid-Open Publication No. 9-275644 (FIGS. 4 and 5)). In the power supply system, the modules are connected together in series or in parallel by electromagnetic induction.

On the other hand, United States Patent Application Publication No. 2008/0278264 (FIGS. 11B and 14) discloses a new type of wireless energy transfer system for transferring energy wirelessly (through a space) from one of two resonators to the other, and vice versa. That wireless energy transfer system couples those two resonators with each other via the evanescent tail of the oscillation energy of the resonant frequency that is produced in the space surrounding those two resonators, thereby transferring the oscillation energy wirelessly (i.e., by a non-contact method).

The solar power generation system that uses the electromagnetic induction technology as disclosed in Japanese Patent Application Laid-Open Publications No. 2006-136045 and No. 9-275644, however, cannot overcome the solar power generation device's own problem that the output voltage of each cell is low. In the field of solar power generation, a crystalline silicon based solar cell, which is currently used broadly due to its high energy conversion efficiency, has an output voltage Vc of just about 0.5 V, which is very low. For example, if the DC output of a solar power generating section needs to be converted into an AC power of about 200 V, the operation efficiency of a normal power conditioner should be maximized with low distortion characteristic realized in response to an input voltage of at least approximately 350 Vdc. Consequently, to increase the output voltage of the solar power generating section to approximately 350 V, as many as several hundreds of cells should be connected together in series.

It should be noted that even if the DC voltage is not converted into AC power through frequency conversion within such a solar power generation system, a similar problem will also arise. For example, in a DC power supply system that has attracted a lot of attention these days, its working voltage will be either 48 Vdc or within the range of 300 to 400 Vdc. That is why even when solar energy needs to be supplied to a DC power supply system, several tens to several hundreds of solar cells also need to be connected together in series.

However, the greater the number of cells or modules to be connected in series together in a system, the more easily the overall performance of the system will decline due to either so-called "partial shading" (i.e., some of the installation zone goes into the shade) or deterioration in the property of some of those cells or modules to be installed. To overcome such a problem, normally a countermeasure such as introduction of a bypass diode into each module is taken. Such a measure is not preferred because an excessive quantity of heat will be generated or the cost will rise significantly in that case. Meanwhile, even when the voltage needs to be increased using a normal DC/DC converter with a voltage boosting function, it is also difficult to achieve efficiently a voltage step-up ratio that is high enough to significantly reduce the number of cells to be connected in series together.

Also, the voltage boosting characteristic of the wireless energy transfer system disclosed in Japanese Patent Application Laid-Open Publication No. 9-275644 is nothing but a slight improvement achieved by the conventional transformer technology, and is not effective enough to overcome the problems to be solved by the present invention.

Furthermore, according to the electromagnetic induction techniques adopted in Japanese Patent Application Laid-Open Publications No. 2006-136045 and No. 9-275644, RF energy can be transmitted over a very short distance from the power transmitting antenna to the power receiving antenna. In addition, its tolerance with respect to a positional shift parallel to the respective faces of the power transmitting and power receiving antennas that are opposed to each other is also too low to transmit power highly efficiently with a realistic arrangement. What is more, the characteristic of a transformer that can be used in the conventional electromagnetic induction technology is mere an ideal one. That is why to increase the input or output voltage at a high rate, the number of turns should also be set to be a very high value.

Likewise, the voltage boosting characteristic of the wireless energy transfer system disclosed in United States Patent Application Publication No. 2008/0278264 is too nothing but a slight improvement achieved by the conventional transformer technology, and is not effective enough to overcome the problems to be solved by the present invention, either.

SUMMARY OF THE INVENTION

A power generation system of an embodiment of the present invention includes a plurality of power generating modules, a module fixing device configured to fix the power generating modules onto an object, and a combining section. Each of the plurality of power generating modules includes a power generating module body including a power generator configured to generate DC energy, and a power transmitter attached to the power generating module body. The power transmitter includes an oscillator that converts the DC energy into RF energy with a frequency f0 and a power transmitting antenna that is supplied with the RF energy from the oscillator and that transmits the RF energy as a resonant magnetic field. The module fixing device includes a first fixing member configured to fix the power generating modules, a plurality of power receiving antennas, each of the plurality of power receiving antennas corresponding to one of the plurality of power generating modules and configured to receive at least a part of the RF energy transmitted by a corresponding power transmitting antenna, and a second fixing member configured to fix the power receiving antennas. The first fixing member and the second fixing member are configured to fix the plurality of power generating modules and the plurality of power receiving antennas, respectively, such that each of the power receiving antennas faces at least partially the corresponding power transmitting antenna. The combining section is configured to combine the respective outputs of the power receiving antennas in parallel. The power transmitting antenna is a series resonant circuit in which a first inductor and a first capacitor are connected in series. The power receiving antenna is a parallel resonant circuit in which a second inductor and a second capacitor are connected in parallel. A resonant frequency fT of the power transmitting antenna and a resonant frequency fR of the power receiving antenna are set to be equal to the frequency f0 of the RF energy. The voltage step-up ratio Voc of the oscillator, the respective inductances L1 and L2 of the first inductor and the second inductor, and a coupling coefficient k between the power transmitting antenna and the power receiving antenna satisfy $(L2/L1) \geq 4(k/Voc)^2$.

Still another power generation system according to another embodiment of the present invention includes a plurality of power generating modules, a module fixing device configured to fix the power generating modules onto an object, a combining section, and a rectifier. Each of the plurality of power generating modules includes a power generating module body including a power generator configured to generate DC energy, and a power transmitter attached to the power generating module body. The power transmitter includes an oscillator that converts the DC energy into RF energy with a frequency f0 and a power transmitting antenna that is supplied with the RF energy from the oscillator and that transmits the RF energy as a resonant magnetic field. The module fixing device includes a first fixing member configured to fix the power generating modules, a plurality of power receiving antennas, each of the plurality of power receiving antennas corresponding to one of the plurality of power generating modules and configured to receive at least a part of the RF energy transmitted by a corresponding power transmitting antenna, and a second fixing member configured to fix the power receiving antennas. The first fixing member and the second fixing member are configured to fix the plurality of power generating modules and the plurality of power receiving antennas, respectively, such that each of the power receiving antennas faces at least partially the corresponding power transmitting antenna. The combining section is configured to combine the respective outputs of the power receiving antennas in parallel. The rectifier is configured to rectify the combined output of the combining section. The power transmitting antenna is a series resonant circuit in which a first inductor and a first capacitor are connected in series. The power receiving antenna is a parallel resonant circuit in which a second inductor and a second capacitor are connected in parallel. A resonant frequency fT of the power transmitting antenna and a resonant frequency fR of the power receiving antenna are set to be equal to the frequency f0 of the RF energy. The voltage step-up ratio Voc of the oscillator, the voltage step-up ratio Vrr of the rectifier, the respective inductances L1 and L2 of the first inductor and the second inductor, and a coupling coefficient k between the power transmitting antenna and the power receiving antenna satisfy $(L2/L1) \geq 4(k/(Voc \times Vrr))^2$.

Yet another power generation system according to another embodiment of the present invention includes a plurality of power generating modules, a module fixing device configured to fix the power generating modules onto an object, a combining section, and a plurality of rectifiers. Each of the plurality of power generating modules includes a power generating module body including a power generator configured to generate DC energy, and a power transmitter attached to the power generating module body. The power transmitter includes an oscillator that converts the DC energy into RF energy with a frequency f0 and a power transmitting antenna that is supplied with the RF energy from the oscillator and that transmits the RF energy as a resonant magnetic field. The module fixing device includes a first fixing member configured to fix the power generating modules, a plurality of power receiving antennas, each of the plurality of power receiving antennas corresponding to one of the plurality of power generating modules and configured to receive at least a part of the RF energy transmitted by a corresponding power transmitting antenna, and a second fixing member configured to fix the power receiving antennas. The first fixing member and the second fixing member are configured to fix the plurality of power generating modules and the plurality of power receiving antennas, respectively, such that each of the power receiving antennas faces at least partially the corresponding power transmitting antenna. The plurality of rectifiers is configured to rectify the respective outputs of the plurality of power receiving antennas. The combining section is configured to combine the respective outputs of the rectifiers in parallel. The power transmitting antenna is a series resonant circuit in which a first inductor and a first capacitor are connected in series. The power receiving antenna is a parallel resonant circuit in which a second inductor and a second capacitor are connected in parallel. A resonant frequency fT of the power transmitting antenna and a resonant frequency fR of the power receiving antenna are set to be equal to the frequency f0 of the RF energy. The voltage step-up ratio Voc of the oscillator, the voltage step-up ratio Vrr of the plurality of rectifiers, the respective inductances L1 and L2 of the first inductor and the second inductor, and a coupling coefficient k between the power transmitting antenna and the power receiving antenna satisfy $(L2/L1) \geq 4(k/(Voc \times Vrr))^2$.

Yet another power generation system according to another embodiment of the present invention includes a plurality of power generating modules, a module fixing device configured to fix the power generating modules, a combining section, and a frequency converter. Each of the plurality of power generating modules includes a power generating module body including a power generator configured to generate DC energy, and a power transmitter attached to the power generating module body. The power transmitter includes an oscillator that converts the DC energy into RF energy with a frequency f0 and a power transmitting antenna that is supplied with the RF energy from the oscillator and that transmits the RF energy as a resonant magnetic field. The module fixing device includes a first fixing member configured to fix the power generating modules, a plurality of power receiving antennas, each of the plurality of power receiving antennas corresponding to one of the plurality of power generating modules and configured to receive at least a part of the RF energy transmitted by a corresponding power transmitting antenna, and a second fixing member configured to fix the power receiving antennas. The first fixing member and the second fixing member are configured to fix the plurality of power generating modules and the plurality of power receiving antennas, respectively, such that each of the power receiving antennas faces at least partially the corresponding power transmitting antenna. The combining section is configured to combine the respective outputs of the power receiving antennas in parallel. The frequency converter is configured to convert the frequency of the combined output of the combining section. The power transmitting antenna is a series resonant circuit in which a first inductor and a first capacitor are connected in series. The power receiving antenna is a parallel resonant circuit in which a second inductor and a second capacitor are connected in parallel. A resonant frequency fT of the power transmitting antenna and a resonant frequency fR of the power receiving antenna are set to be equal to the frequency f0 of the RF energy. The voltage step-up ratio Voc of the oscillator, the voltage step-up ratio Vtr of the frequency converter, the respective inductances L1 and L2 of the first inductor and the second inductor, and a coupling coefficient k between the power transmitting antenna and the power receiving antenna satisfy $(L2/L1) \geq 4(k/(Voc \times Vtr))^2$.

Yet another power generation system according to another embodiment of the present invention includes a module fixing device, which fixes the power generating modules onto an object, a combining section, and a plurality of frequency converters. Each of the plurality of power generating modules includes a power generating module body including a power generator configured to generate DC energy, and a power transmitter attached to the power generating module body. The power transmitter includes an oscillator that converts the DC energy into RF energy with a frequency f0 and a power transmitting antenna that is supplied with the RF energy from the oscillator and that transmits the RF energy as a resonant magnetic field. The module fixing device includes a first fixing member configured to fix the power generating modules, a plurality of power receiving antennas, each of the plurality of power receiving antennas corresponding to one of the plurality of power generating modules and configured to receive at least a part of the RF energy transmitted by a corresponding power transmitting antenna, and a second fixing member configured to fix the power receiving antennas. The first fixing member and the second fixing member are configured to fix the plurality of power generating modules and the plurality of power receiving antennas, respectively, such that each of the power receiving antennas faces at least partially the corresponding power transmitting antenna. The plurality of frequency converters is configured to convert the respective frequencies of the outputs of the power receiving antennas. The combining section is configured to combine the respective outputs of the frequency converters in parallel. The power transmitting antenna is a series resonant circuit in which a first inductor and a first capacitor are connected in series. The power receiving antenna is a parallel resonant circuit in which a second inductor and a second capacitor are connected in parallel. A resonant frequency fT of the power transmitting antenna and a resonant frequency fR of the power receiving antenna are set to be equal to the frequency f0 of the RF energy. The voltage step-up ratio Voc of the oscillator, the voltage step-up ratio Vtr of the frequency converters, the respective inductances L1 and L2 of the first inductor and the second inductor, and a coupling coefficient k between the power transmitting antenna and the power receiving antenna satisfy $(L2/L1) \geq 4(k/(Voc \times Vtr))^2$.

A power generating module according to an embodiment of the present invention includes a power generating module body including a power generator configured to generate DC energy, and a power transmitter attached to the power generating module body. The power transmitter includes an oscillator that converts the DC energy into RF energy with a frequency f0 and a power transmitting antenna that is supplied with RF energy from the oscillator and that transmits the RF energy as a resonant magnetic field. The power transmitting antenna is a series resonant circuit in which a first inductor and a first capacitor are connected in series.

A module fixing device according to an embodiment of the present invention includes: a first fixing member configured to fix a plurality of power generating modules onto an object, each of the plurality of power generating modules including a power generating module body including a power generator configured to generate DC energy, and a power transmitter attached to the power generating module body, the power transmitter including an oscillator that converts the DC energy into RF energy with a frequency f0 and a power transmitting antenna that is supplied with the RF energy from the oscillator and that transmits the RF energy as a resonant magnetic field and that is a series resonant circuit in which a first inductor and a first capacitor are connected in series; a plurality of power receiving antennas, each of the plurality of power receiving antennas configured to receive at least a part of the RF energy transmitted by the corresponding power transmitting antenna, and being a parallel resonant circuit in which a second inductor and a second capacitor are connected in parallel; a second fixing member configured to fix the power receiving antennas, wherein each of the plurality of power receiving antennas faces at least partially the corresponding power transmitting antenna; and a cable, to which the outputs of at least two of the plurality of power receiving antennas are input in parallel.

Another module fixing device according to another embodiment of the present invention includes at least one first elongate member, which runs in a first direction and which is provided with the cable, and a plurality of second elongate members, which run in the first direction but which are not provided with the cable. The first elongate member is interposed between two of the second elongate members. Powers that have been received from the power transmitting antennas of the power generating modules that are arranged on both sides of the elongate member of the first type are combined together through the cable that is provided for the elongate member of the first type.

A method for installing a power generation system according to an embodiment of the present invention includes providing the module fixing device, putting the module fixing device on the object, providing the power generating modules, and fixing the power generating modules onto the object with the first fixing member of the module fixing device.

A power generation system according to the present invention can increase the voltage highly effectively while power is being transmitted between antennas by using resonant magnetic coupling. In addition, in the power generation system, power generating module, module fixing device and power generation system installing method according to the present invention, the cost of installation can be reduced and the work of replacing a deteriorated part of the power generating section can be simplified.

Furthermore, even if the voltage increasing effect of the present invention is applied to a power generating module with a low output voltage, the number of times of series connection of the power generating module can also be reduced significantly. On the other hand, sine the number of times of parallel connection increases, deterioration in performance due to partial shading or a failure of some cells or modules in a solar power generation system can be avoided and power can be supplied with good stability.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Before preferred embodiments of a power generation system according to the present invention are described, the basic arrangement of the present invention will be described briefly with reference to FIGS. 1A through 1C and FIG. 2.

Figure 1A:
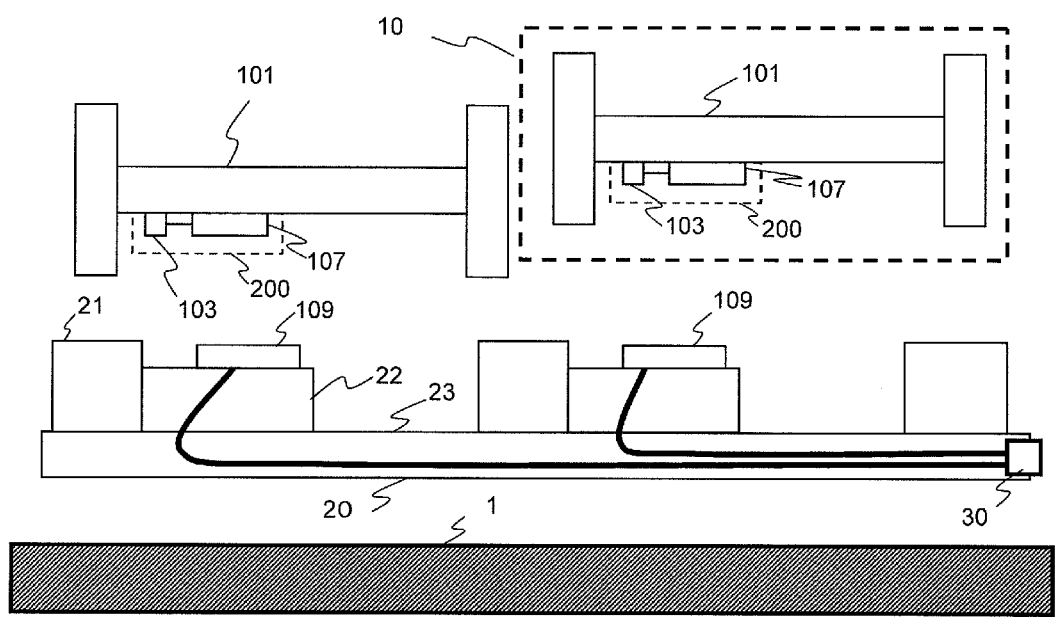
FIG. 1A is a cross-sectional view illustrating the basic arrangement of a power generation system according to an embodiment of the present invention yet to be installed.
Figure 1B:
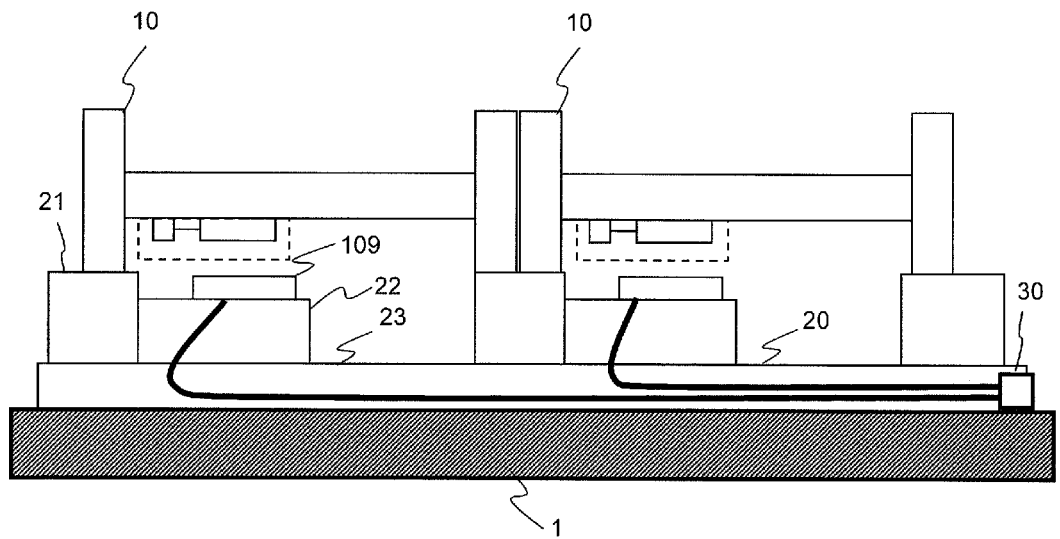
FIG. 1B is a cross-sectional view illustrating the basic arrangement of the power generation system of an embodiment of the present invention that has been installed.

First of all, look at FIGS. 1A and 1B. Specifically, FIG. 1A is a cross-sectional view schematically illustrating a state where respective components of a power generation system are still being assembled together. On the other hand, FIG. 1B is a cross-sectional view schematically illustrating a state where those components have been assembled together to form one power generation system.

As shown in FIGS. 1A and 1B, the power generation system of the present invention includes a plurality of power generating modules 10 and a module fixing device 20 for fixing those power generating modules 10 onto an object 1. In the example shown in FIGS. 1A and 1B, only two power generating modules 10 are illustrated for the sake of simplicity. Naturally, however, the number of the power generating modules 10 is not required be two. A preferred embodiment of a power generation system according to the present invention may have three or more power generating modules 10. In this description, the "power generating module" will sometimes be simply referred to herein as a "module".

Each of the power generating modules 10 includes a power generating module body 101 with a power generator that produces DC energy and a power transmitter 200, which is attached to the power generating module body 101. The power transmitter 200 includes an oscillator 103 that converts DC energy into RF energy with a frequency f0 and a power transmitting antenna 107 that is supplied with the RF energy from the oscillator 103 and that transmits the RF energy as a resonant magnetic field to a space.

The module fixing device 20 includes a first fixing member 21, power receiving antennas 109 and a second fixing member 22. In the example illustrated in FIGS. 1A and 1B, the first and second fixing members 21 and 22 are joined together with another member 23. However, this is just an example of the present invention and the module fixing device of the present invention does not always have to have such an arrangement.

The first fixing member 21 is configured to fix the power generating modules 10 onto the object 1. In the example illustrated in FIGS. 1A and 1B, another member 23 is interposed between the first fixing member 21 and the object 1. However, the first fixing member 21 and the object 1 may directly contact with each other.

Each of the power receiving antennas 109 corresponds to one of the power generating modules 10 and receives at least a part of the RF energy that has been sent out from the power transmitting antenna 107 of its associated one of the power generating modules 10. The first fixing member 21 and the second fixing member 22 are configured to fix the plurality of power generating modules and the plurality of power receiving antennas, respectively, so that each of the power receiving antennas 109 faces at least partially the corresponding power transmitting antenna 107.

This power generation system further includes a combining section 30 that combines together the respective outputs of the power receiving antennas 109 in parallel with each other. In the example illustrated in FIGS. 1A and 1B, the combining section 30 is connected to the respective power receiving antennas 109 with wires. The combining section 30 is not required be arranged inside of the module fixing device 20 but may be arranged outside of the module fixing device 20 as well. If a number of wires are connected together at one or multiple points, then each connection point functions as the "combining section 30".

As will be described in detail later, the power transmitting antenna 107 of the present invention is a series resonant circuit in which a first inductor and a first capacitor are connected together in series, while the power receiving antenna 109 is a parallel resonant circuit in which a second inductor and a second capacitor are connected together in parallel. The resonant frequencies fT and fR of the power transmitting and power receiving antennas 107 and 109 are both set to be equal to the frequency f0 of the RF energy.

The voltage step-up ratio Voc of the oscillator 103, the respective inductances L1 and L2 of the first and second inductors, and a coupling coefficient k between the power transmitting and power receiving antennas 107 and 109 satisfy $(L2/L1) \geq 4(k/Voc)^2$.

The frequency f0 may be set to fall within the range of 50 Hz to 300 GHz, and preferably falls within the range of 20 kHz to 10 GHz, more preferably within the range of 20 kHz to 20 MHz, and even more preferably within the range of 20 kHz to 1 MHz. In this description, the radio frequency is supposed to be a frequency falling within any of these ranges.

Next, the power generation system of the present invention will be described in further detail with reference to FIG. 1C.

The oscillator 103 receives the DC energy (power) that has been generated by the power generating module body 101 and converts the frequency of the DC energy into the frequency f0 of RF energy (i.e., makes a DC/RF conversion). The RF energy is output from the oscillator 103 to the power transmitting antenna 107 that is connected to the oscillator 103. The power transmitting antenna 107 and the power receiving antenna 109, which are resonators that have been designed so as to have the same resonant frequency, have their resonators coupled together via a resonant magnetic field that is generated in the surrounding space. And the power receiving antenna 109 can receive efficiently at least part of the RF energy that has been sent out by the power transmitting antenna 107. The power receiving antenna 109 is not in mechanical contact with the power transmitting antenna 107 but is preferably located at a distance of about several millimeters to about several ten centimeters from the power transmitting antenna 107, for example.

The non-contact transmission power transmitter 200, which is made up of the oscillator 103 and the power transmitting antenna 107, is fixed in advance onto the back surface of the power generating module body 101 before the power generating module body 101 is set up. Alternatively, the power transmitter 200 may also be fixed to an end face of the power generating module body 101. Respective DC output terminals of the power generating module body 101 and the oscillator 103 are connected together by using a cable or directly soldering their electrodes so as to be conductive with each other either.

Also, in the example illustrated in FIG. 1B, the non-contact transmission power receiving section, including the power receiving antenna 109, is fixed onto the first fixing member 21 of the module fixing device 20. In this case, the first fixing member 21 may either be replaced with the roof itself on which the module 20 is installed or form part of the member 23 for fixing the module 10 on the roof.

Figure 1C:
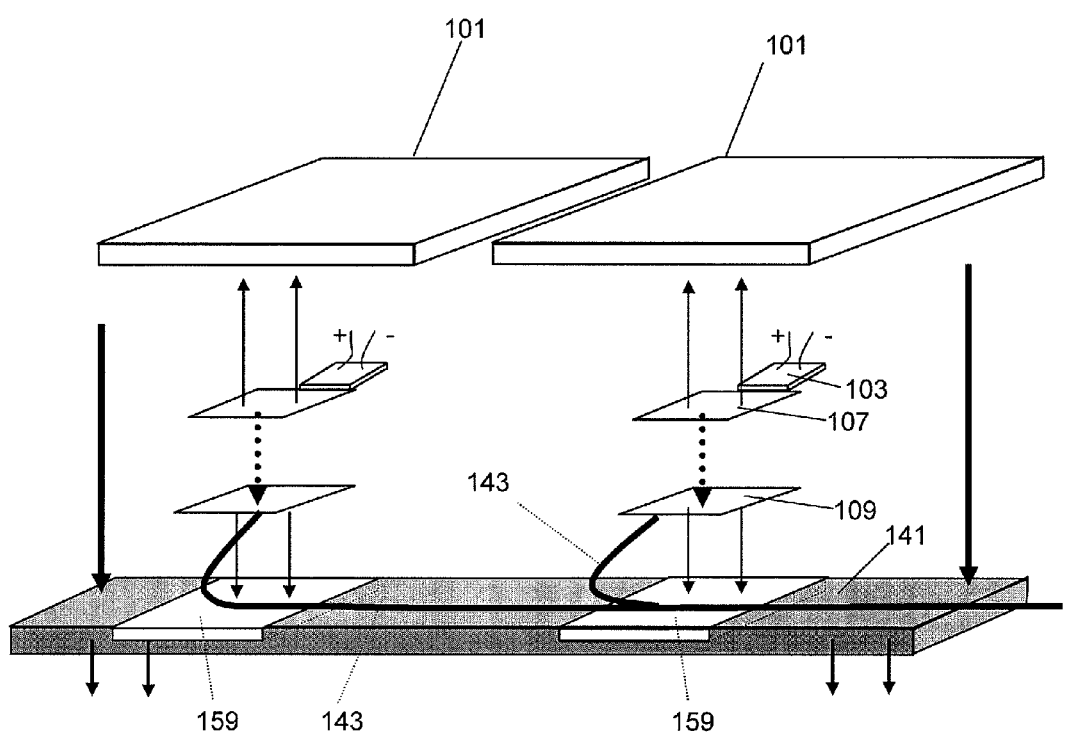
FIG. 1C is a perspective view illustrating a basic arrangement for a power generation system according to an embodiment of the present invention.

In the example illustrated in FIG. 1C, the first and second fixing members 21 and 22 and that another member 23 shown in FIGS. 1A and 1B are integrated together into a single elongate fixing member 141. This fixing member 141 functions as both the first fixing member 21 that fixes a plurality of power generating modules 10 onto the object 1 and the second fixing member 22 that fixes a plurality of power receiving antennas 109 onto the object 1 so that each of the power receiving antennas 109 faces at least partially the corresponding power transmitting antenna 107. Optionally, this power generation system may be designed so that a part of the roof itself functions as this fixing member 141.

The elongate fixing member 141 shown in FIG. 1C includes a cable 143, which may be either fixed on the surface of the fixing member 141 or put inside of the fixing member 141. In this system, there may be a plurality of output terminals of the power receiving antennas 109 that are arranged along the fixing member 141. A plurality of input terminals of the cable 143 are connected to those output terminals. Eddy current avoiding spaces 159 are defined on the surface of the fixing member 141 so as to face the lower surface of the power receiving antennas 109 (that is not opposed to the power transmitting antennas 107).

Figure 2:
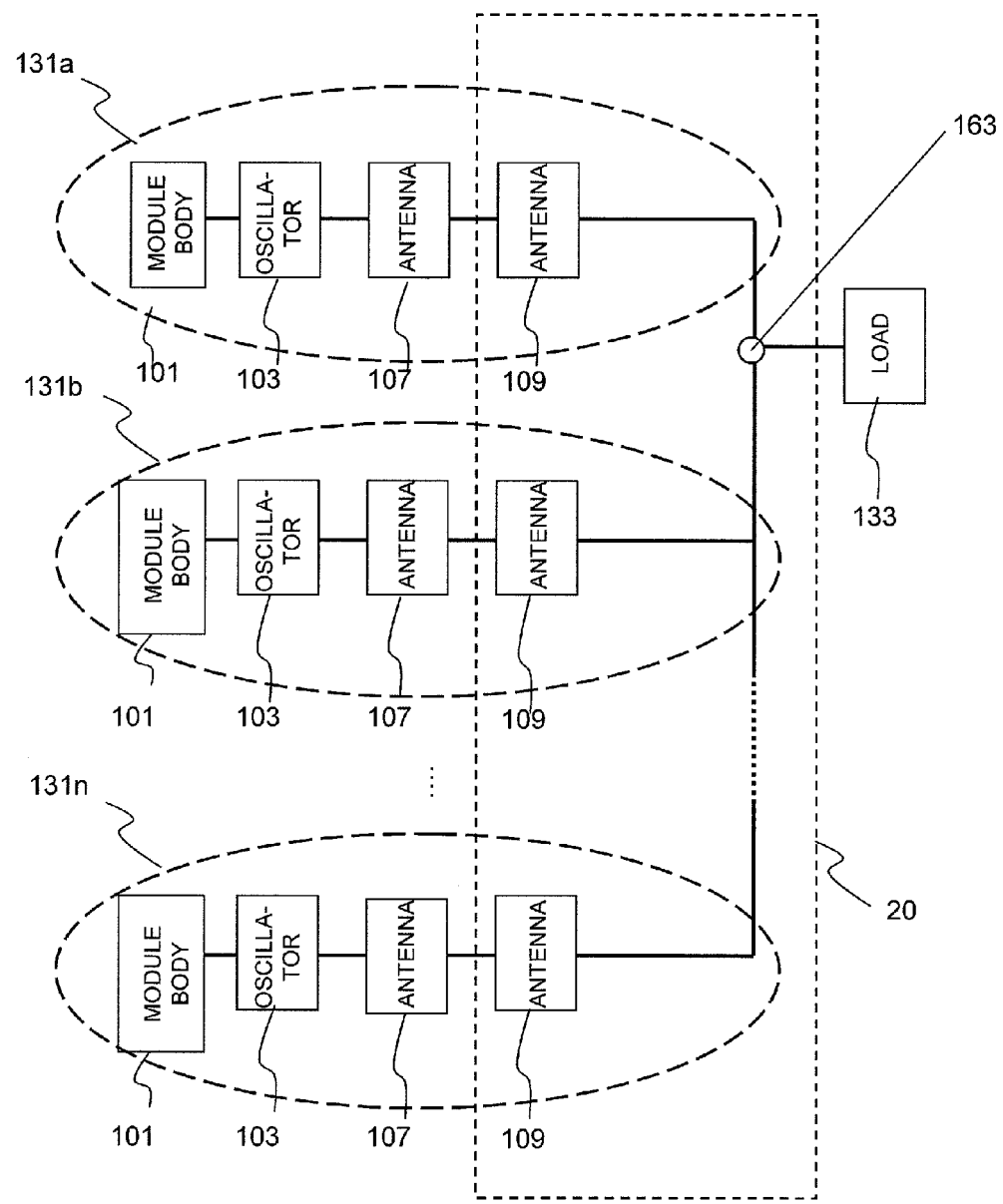
FIG. 2 is a block diagram illustrating a first power generation system according to the present invention.

FIG. 2 is a block diagram illustrating a power generation system according to an embodiment of the present invention. The power generation system of the present invention includes a number of power generation system components 131a, 131b, ... and 131n that are connected in parallel with each other.

Each of these power generation system components 131a through 131n includes a power generating module body 101, an oscillator 103, a power transmitting antenna 107 and a power receiving antenna 109, which are connected together in series. The DC energy that has been generated by the power generating module body 101 is converted highly efficiently into RF energy by the oscillator 103. That RF energy is transferred by non-contact method from the power transmitting antenna 107 on the transmitting end to the power receiving antenna 109 on the receiving end, and vice versa. Thereafter, the RF energies (or powers) that have been output by the respective power generation system components 131a through 131n are added together by the parallel connection and then the sum is supplied to a load 133. The load 133 in this preferred embodiment is an ordinary electronic device, which operates with RF energy supplied. According to this preferred embodiment, the output voltage supplied by each of these power generation system components 131a through 131n is much higher than the output voltage of its own module. For that reason, even if the power generation system components 131a through 131n are connected in parallel with each other, the output voltage of the system can be easily raised to a high voltage value required by the load 133.

Since a scheme for getting various pre-processing steps done before the module installing work is started is provided for a power generation system according to an embodiment of the present invention, the installation and module replacing jobs can get done with much less trouble, which directly leads to cutting down not only the amount of time (and eventually the cost) it takes, but also the risk to run, in order to get both of these two jobs done.

For example, it is possible to finish, before the module installing work is started, at least one of the following processing steps of: i) fixing the oscillator 103 and power transmitting antenna 107 onto each of the power generating module bodies 101; ii) connecting the output terminal of each of the power receiving antennas 109 to its associated input terminal of the cable 143; iii) fixing the power receiving antenna 109 onto the fixing member; and iv) wiring and connecting in order to combine the respective output powers of the a plurality of power receiving antennas 109 together in the fixing member. By getting at least one (and preferably all) of these processing steps done in the provision process before the module installing process without carrying out them at a height, the installation work and the part replacement work can get done more easily.

On top of that, since a number of power generation system components 131a through 131n are connected in parallel with each other, the performance of this solar power generation system should be more stabilized than the conventional power generation system even if any of those power generation system components 131a through 131n deteriorated or if some difference was produced in the condition for irradiating the power generation system components 131a through 131n with sunlight.

Each of the oscillators 103 preferably adjusts its phase of oscillation because by matching to each other the phases of the RF energies that are output from the respective power receiving antennas 109, the efficiency of combining the powers generated can be maximized. If the oscillators 103 have a telecommunications function, information can be exchanged wirelessly between the oscillators 103. That is why such an adjustment would never make the installation method of this system less easy.

According to the present invention, the "antenna" is not an ordinary antenna for transmitting or receiving an electromagnetic field radiated but an element for transferring energy from one of two objects to the other, and vice versa, by using a coupling phenomenon that has been produced by the evanescent tail of the magnetic field of the resonator. According to such a wireless power transmission technique that uses the resonant magnetic field, energy loss (radiation loss), which would otherwise be caused when an electromagnetic wave is transferred to a distant location, will not be caused, and therefore, the power can be transmitted with very high efficiency. Such an energy transfer technique that uses the coupling phenomenon of a resonant magnetic field (i.e., a near field) will cause much less loss than a known non-contact power transmission that uses the Faraday's law of electromagnetic induction. Rather, energy can be transmitted efficiently between two resonators (or antennas), which have an interval of as much as several meters between them.

To carry out a wireless power transmission based on such a principle, coupling needs to be produced between two resonant antennas. As described above, according to the present invention, the resonant frequencies fT and fR are both set to be equal to the frequency f0 of the oscillator 103. However, fT and/or fR are not required to be exactly equal to, but may be substantially equal to, f0. That is to say, neither fT nor fR needs to completely agree with f0. To transfer energy with high efficiency by taking advantage of the coupling phenomenon between the two resonators, ideally fT=fR should be satisfied. But actually there will be no problem as long as there is only a little difference between fT and fR. In this description, if the frequency fT is equal to the frequency fR, then the following inequality (1) should be satisfied:

$$|fT-fR| \leq fT/QT + fR/QR \quad (1)$$

where QT is the Q factor of the power-transmitting antenna as a resonator and QR is the Q factor of the power-receiving antenna as a resonator. In general, if the resonant frequency is identified by X and the Q factor of a resonator is identified by Qx, a frequency range in which that resonator produces resonance is obtained by X/Qx. If this inequality $|fT-fR| \leq fT/QT + fR/QR$ is satisfied, energy can be transferred between the two resonators by resonant magnetic coupling.

Optionally, a device that performs an MPPT function such as what is called "dc-dc solution" may be inserted between each module body 101 and its associated oscillator 103. Specifically, such a device keeps up with the maximum power while variably increasing and/or decreasing the voltage of the power generated so as to maximize the quantity of the power generated by the module. As to determining whether the quantity of the power generated has been maximized or not, the decision may be made either after the power receiving antenna 109 or before the oscillator 103. In any case, the maximum power can be kept up with by controlling variably the voltage increase or decrease ratio based on the decision information.

Cable Structure

Number of Input/Output Terminals and Number of Output Terminals

Figure 3:
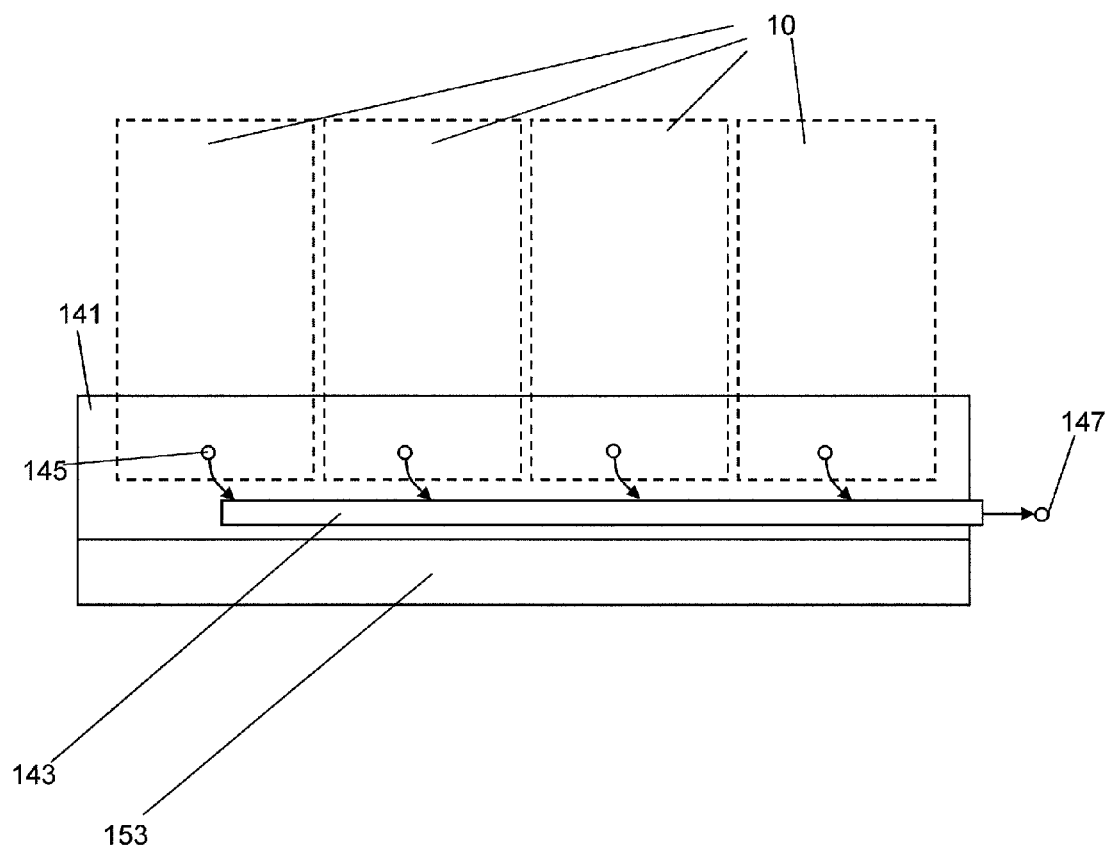
FIG. 3 is a schematic representation of the first power generation system of the present invention as viewed see-through from under the back surface of the modules.

FIG. 3 is a schematic representation of the fixing member 141 as viewed see-through from under the back surface of the modules 10. A cable structure in which the output powers are combined in parallel at least once within the fixing member 141 is preferably adopted so that the number Ncout of pairs of the output terminals 147 of the cable 143 becomes smaller than the number Ncin of pairs of the input terminals 145. In the example illustrated in FIG. 3, Ncin=4 and Ncout=1. That is to say, in this example, the powers that have been obtained from four modules 10 are combined together in parallel. Naturally, Ncin and Ncout are not required to be the numbers illustrated in FIG. 3.

It should be noted that when power or energy is transmitted, the cable should use a different arrangement of terminals according to the type of the output power that may be DC, RF or AC power. Specifically, the cable needs to have a structure consisting of two lines that are either positive and negative lines or signal and ground lines, or a coaxial structure, or a structure consisting of three lines, of which the phases shift from each other by 120 degrees if there are three phases. That is why in the following description, the "number of terminals (or the number of pairs of terminals) will herein mean how many sets of terminals are needed in order to transmit energy.

If modules 10 are arranged in M rows and N columns in the installation area for the modules 10, then a portion of the fixing member 141 that is extended in one direction may perform the function of fixing either M or N modules on a roof area, for example. In the example illustrated in FIG. 3, only a horizontally running portion of the fixing member 141 is illustrated, and is used to fix one side and its surrounding portion of the four modules onto a roof, for example.

Even in a system configuration of which the M×N value becomes enormous, such an increase in the number of times of cable connections at the final output position can be avoided by combining the outputs of a plurality of power receiving antennas 109 in parallel with each other. And it is most preferred to adopt a cable structure, of which Ncout is equal to one.

Figure 4:
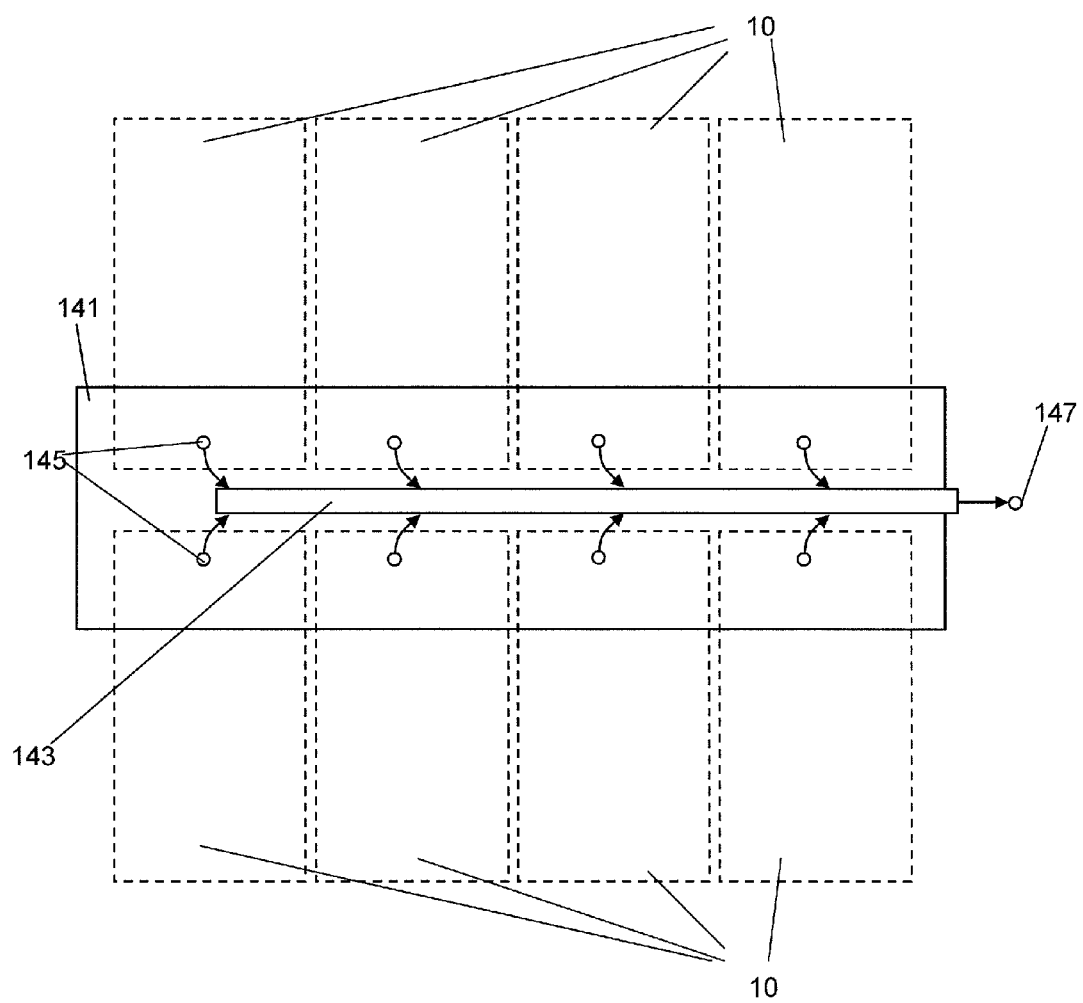
FIG. 4 is a schematic representation of the first power generation system of the present invention as viewed see-through from under the back surface of the modules.

Modules are not required to be arranged on just one side of the fixing member 141 as shown in FIG. 3 but may also be arranged on both sides of the fixing member 141 as shown in FIG. 4. Anyway, there is no need to arrange cables 145 on the fixing member 145 on a column-by-column basis.

Figure 5:
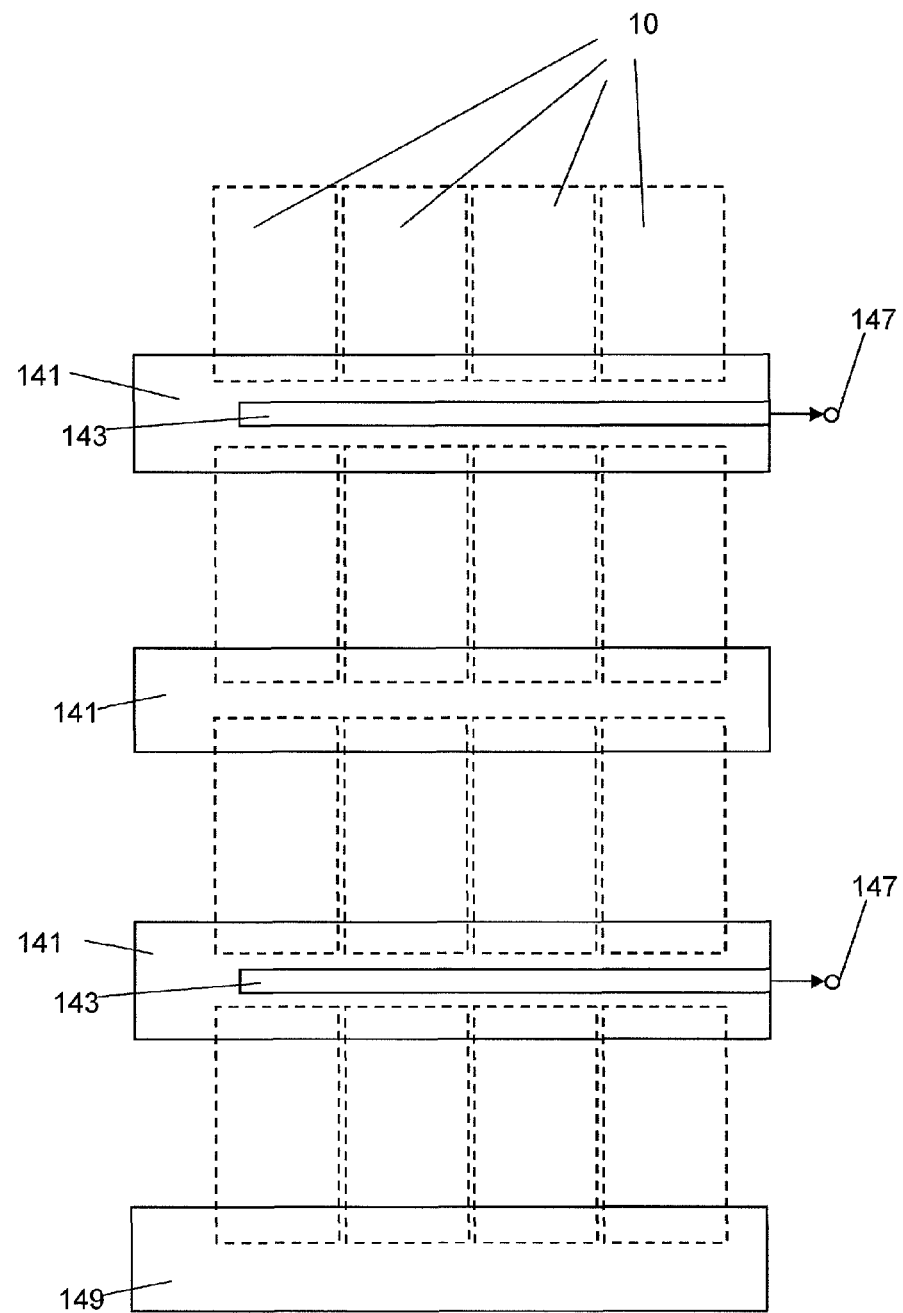
FIG. 5 is a simplified schematic representation of the first power generation system of the present invention as viewed see-through from under the back surface of the modules.

FIG. 5 illustrates four fixing members 141 to fix sixteen modules 10 that are arranged in four rows and four columns. In the example illustrated in FIG. 5, the cables 143 are provided for every other one of the four fixing members 141, not all of them. In this case, since the number of cables needed for the overall system can be cut down, the installation cost involved with wiring and connection work at a height can be further reduced.

On Equivalent Circuit and Principle of Voltage Boosting

Figure 6:
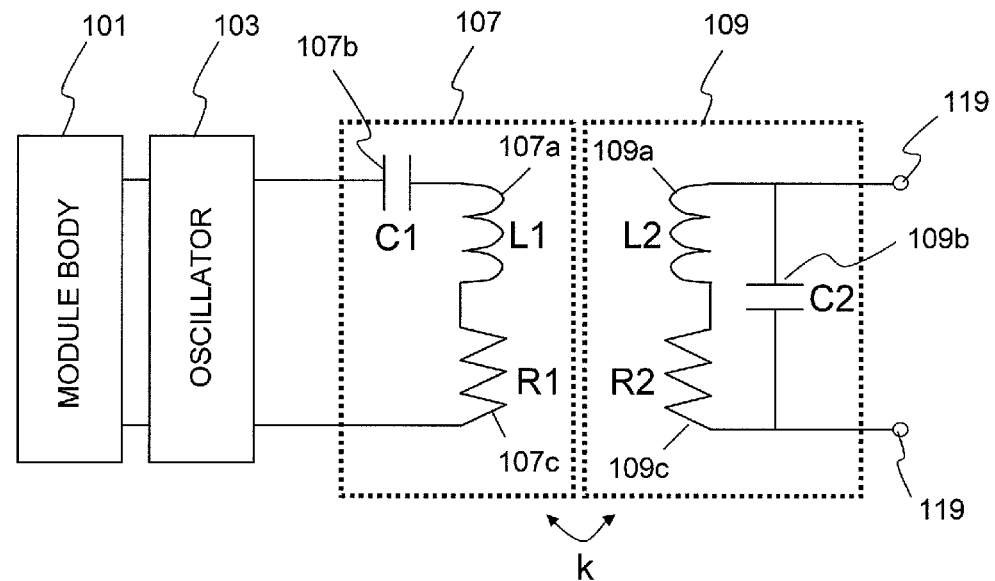
FIG. 6 illustrates an equivalent circuit for antennas.

Next, look at FIG. 6, which illustrates an equivalent circuit for a non-contact transmission section according to an embodiment of the present invention. As shown in FIG. 6, according to the embodiment of the present invention, the power-transmitting antenna 107 is a series resonant circuit in which a first inductor 107a and a first capacitor 107b are connected in series together, while the power-receiving antenna 109 is a parallel resonant circuit in which a second inductor 109a and a second capacitor 109b are connected in parallel with each other. The series resonant circuit of the power-transmitting antenna 107 has a parasitic resistance component R1 and the parallel resonant circuit of the power-receiving antenna 109 has a parasitic resistance component R2.

According to the embodiment of the present invention, if the voltage step-up ratio of the oscillator 103 is identified by Voc, the respective inductances of the first and second inductors 107a and 109a are identified by L1 and L2, and the coupling coefficient between the power transmitting and power receiving antennas 107 and 109 is identified by k, the values of L1, L2, k and Voc are determined so as to satisfy:

$$(L2/L1) \geq 4(k/Voc)^2$$

If this relation is satisfied, the voltage of the input DC energy can be at least doubled (i.e., the voltage step-up ratio is two or more) as a result of the non-contact power transmission. The reason why the voltage can be increased that much will be described in detail later.

The non-contact transmission section in the embodiment of the present invention can efficiently increase a low voltage of the energy (power) being transmitted wirelessly between the antennas. That is why even if the output voltage of the power generating module body 101 is low, the components of the solar power generation system of the embodiment of the present invention can still output power with high voltage thanks to the voltage increase effect. As a result, the number of cells that should have been connected together in series in a conventional arrangement can be reduced significantly. Thus, the embodiment of the present invention provides a new solar power generation system, which can be popular quickly and easily, with the costs of installation and maintenance cut down.

Figure 7:
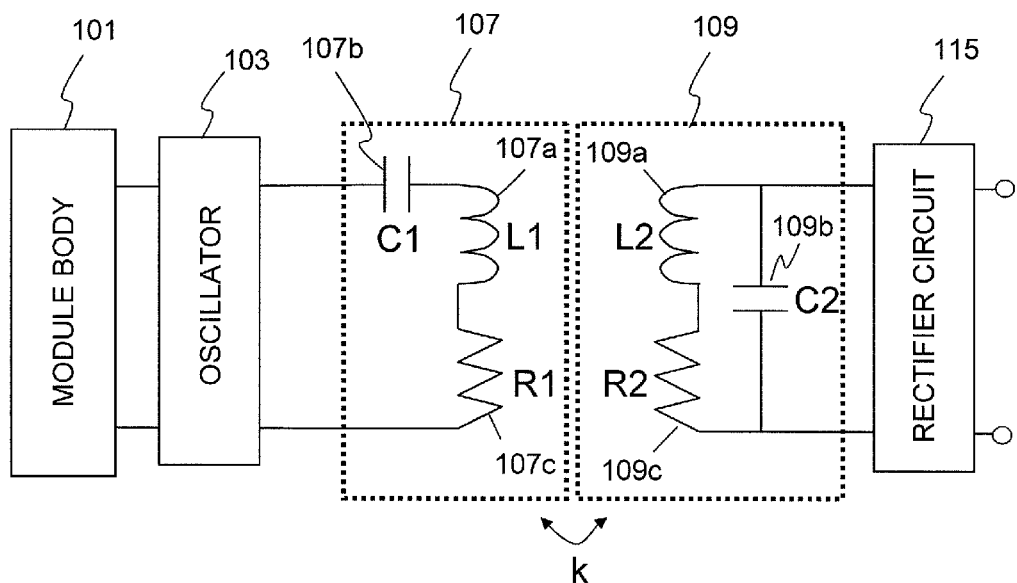
FIG. 7 illustrates an arrangement for another non-contact transmission section (with a rectifier circuit).

FIG. 7 illustrates an equivalent circuit for another non-contact transmission section according to another embodiment of the present invention. This non-contact transmission section includes a rectifier circuit (rectifier) 115 that follows the power receiving antenna 109, which is a difference from the non-contact transmission section shown in FIG. 6. Due to the action of this rectifier circuit 115, the non-contact transmission section of the embodiment of the present invention can output DC energy. Thus, even if the output voltage of the power generating module body 101 is low, the components of the solar power generation system of the embodiment of the present invention can still output DC energy with sufficiently increased voltage thanks to the voltage increase effect during the non-contact power transmission.

Supposing the voltage step-up ratio of the rectifier circuit 115 is identified by Vrr, if the rectifier circuit 115 is connected to the power receiving antenna 109, a voltage step-up ratio of two or more can be achieved by satisfying the following relation:

$$(L2/L1) \geq 4(k/(Voc \times Vrr))^2$$

This point will also be described in detail later.

Figure 8:
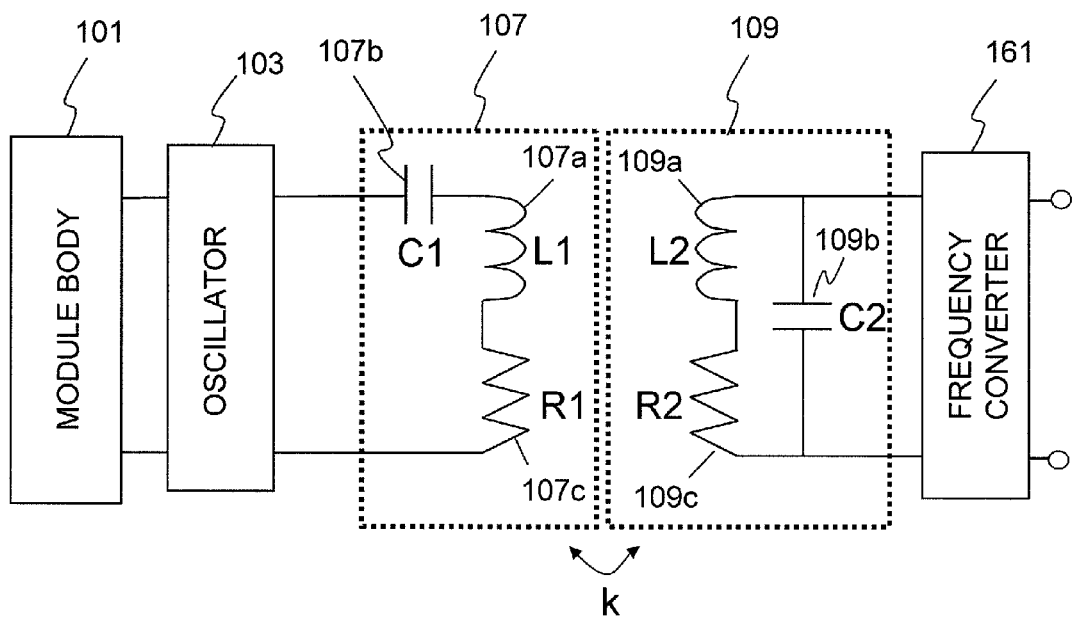
FIG. 8 illustrates an arrangement for another non-contact transmission section (with a frequency converter).

FIG. 8 illustrates an equivalent circuit for still another non-contact transmission section according to another embodiment of the present invention. This non-contact transmission section includes a frequency converter (RF/AC converter) 161 that follows the power receiving antenna 109, which is a difference from the non-contact transmission sections shown in FIGS. 6 and 7. Due to the action of this frequency converter 161, the non-contact transmission section of the embodiment of the present invention can output AC energy. Thus, even if the output voltage of the power generating module body 101 is low, the components of the solar power generation system of the embodiment of the present invention can still output AC energy with sufficiently increased voltage thanks to the voltage increase effect during the non-contact power transmission.

Supposing the voltage step-up ratio of the frequency converter 161 is identified by Vtr, if the frequency converter 161 is connected to the power receiving antenna 109, a voltage step-up ratio of two or more can be achieved by satisfying the following relation:

$$(L2/L1) \geq 4(k/(Voc \times Vtr))^2$$

This point will also be described in detail later.

Hereinafter, preferred embodiments of the present invention will be described with reference to the accompanying drawings.

Embodiment 1

Figure 9:
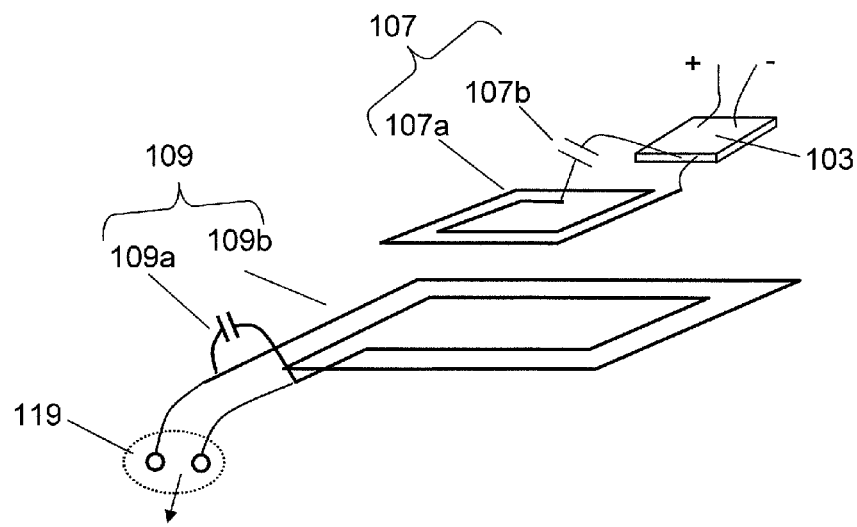
FIG. 9 is a schematic representation illustrating, on a larger scale, a non-contact transmission section and its surrounding members, which form part of the power generation system.
Figure 10:
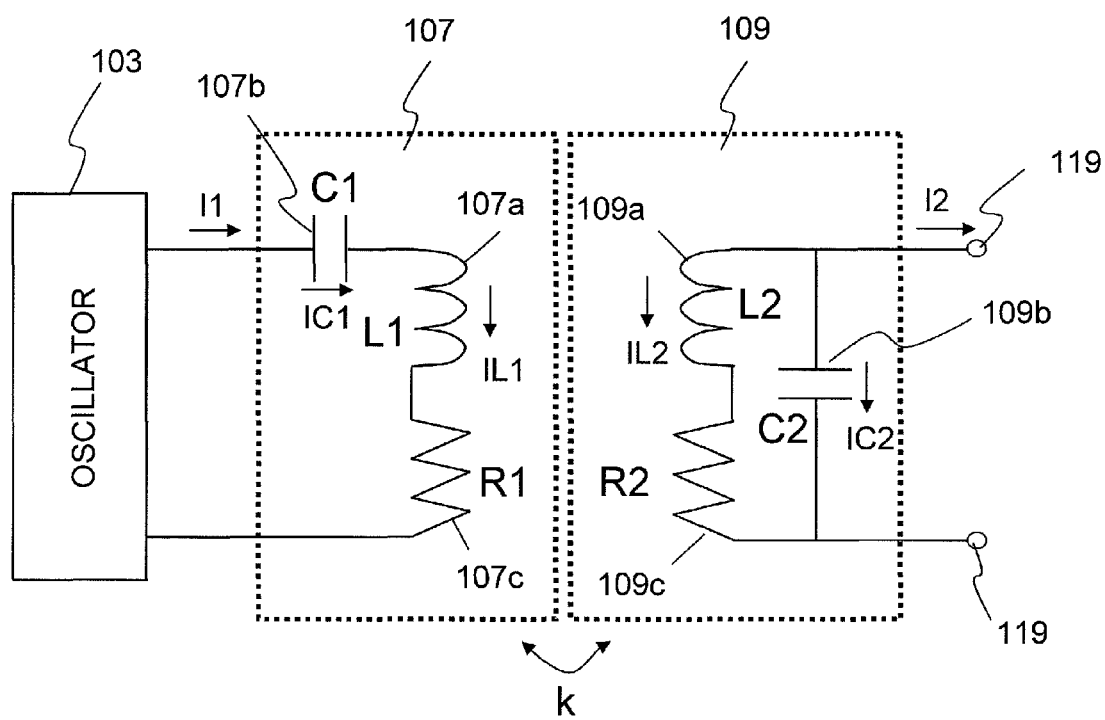
FIG. 10 is an equivalent circuit diagram of the non-contact transmission section shown in FIG. 9.

First of all, a first specific preferred embodiment of a power generation system according to the present invention will be described with reference to FIGS. 9 and 10. Specifically, FIG. 9 is a schematic representation illustrating, on a larger scale, a non-contact transmission section and its surrounding members, which form part of the power generation system shown in FIG. 1. FIG. 10 is an equivalent circuit diagram of the non-contact transmission section 105 shown in FIG. 9. In FIGS. 9 and 10, any component also shown in FIGS. 1 and 6 and having substantially the same function as its counterpart is identified by the same reference numeral.

The power generation system of this preferred embodiment is a "solar power generation system", of which each of the modules 10 includes an element that generates electric power using solar energy. As shown in FIG. 9, each module and its associated members of the solar power generation system of this preferred embodiment include at least an oscillator 103, a power transmitting antenna 107 and a power receiving antenna 109, which are connected together in series. The power transmitting and power receiving antennas 107 and 109 are physically out of contact with each other. To increase the reproducibility of the non-contact transmission characteristic between the antennas, it is effective to keep the distance between the power transmitting and power receiving antennas 107 and 109 constant by a simple method.

Figure 11A:
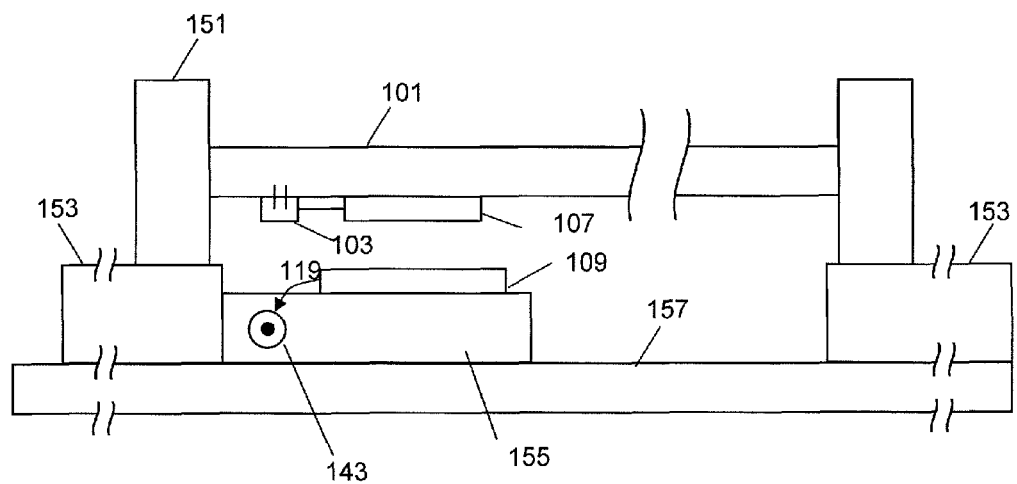
FIG. 11A is a side cross-sectional view schematically illustrating a power generation system.

Hereinafter, a preferred structure for keeping constant the distance between the power transmitting and power receiving antennas 107 and 109 that face each other will be described with reference to FIG. 11A and other drawings that follow it. FIG. 11A schematically illustrates a cross section of a portion of the solar power generation system of this preferred embodiment, which is associated with only one module 10.

The power generating module body 101 includes a structure in which groups of solar cells, sealing members and surface glass plates are stacked one upon the other in multiple layers and a module frame 151 that surrounds that structure. The module frame 151 is made of a conductor such as aluminum and forms the outer framework of the module 10.

The module frame 151 is fixed onto a first fixing member 153, which is fixed on an installation plane 157 such as a roof as in an ordinary installation process. The distance between the installation plane 157 and the power transmitting antenna 107 that face each other becomes constant by fixing the power transmitting antenna 107 onto the power generating module body 101.

Next, a second fixing member 155 is also fixed onto the installation plane 157. And by fixing the power receiving antenna 109 onto the second fixing member 155, the distance between the installation plane 157 and the power receiving antenna 109 that face each other becomes constant, too. Thus, by carrying out such simple and easy installation work, the power transmitting and power receiving antennas 107 and 109 that face each other can have their relative arrangement defined so as to maintain a constant distance between them, which may fall within the range of a few millimeters through several ten centimeters, for example.

In this case, the cable 143 may be embedded in the second fixing member 155 as shown in FIG. 11A or fixed on the surface of the second fixing member 155. Alternatively, the cable 143 may also be embedded in the first fixing member 153 or fixed on its surface. Optionally, if the first and second fixing members 153 and 155 are integrated together, the number of times the work of fixing the fixing member onto the installation plane 157 has to be done can be further reduced.

Figure 11B:
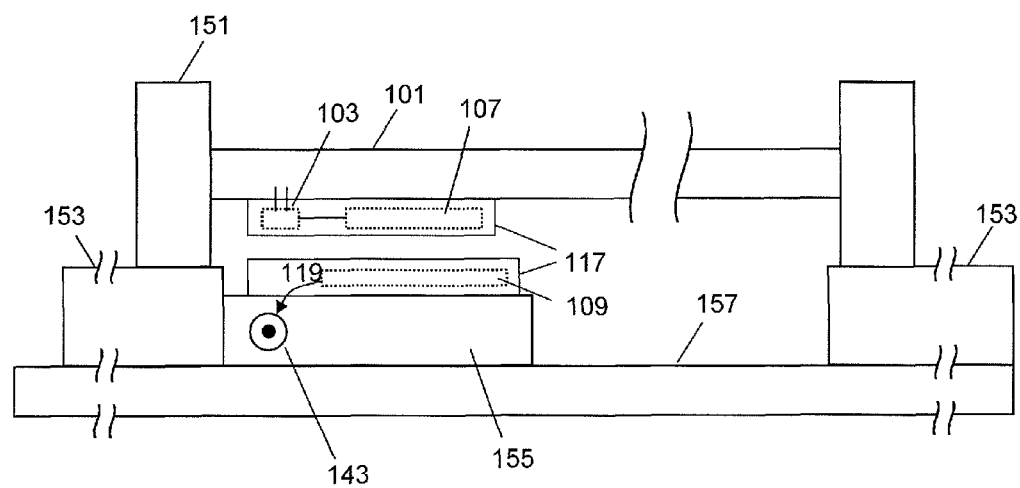
FIG. 11B is a side cross-sectional view schematically illustrating another power generation system.

FIG. 11B illustrates a preferred embodiment in which the antennas 107 and 109 are covered with a protective member 117, which is the only difference from the arrangement shown in FIG. 11A.

Figure 12:
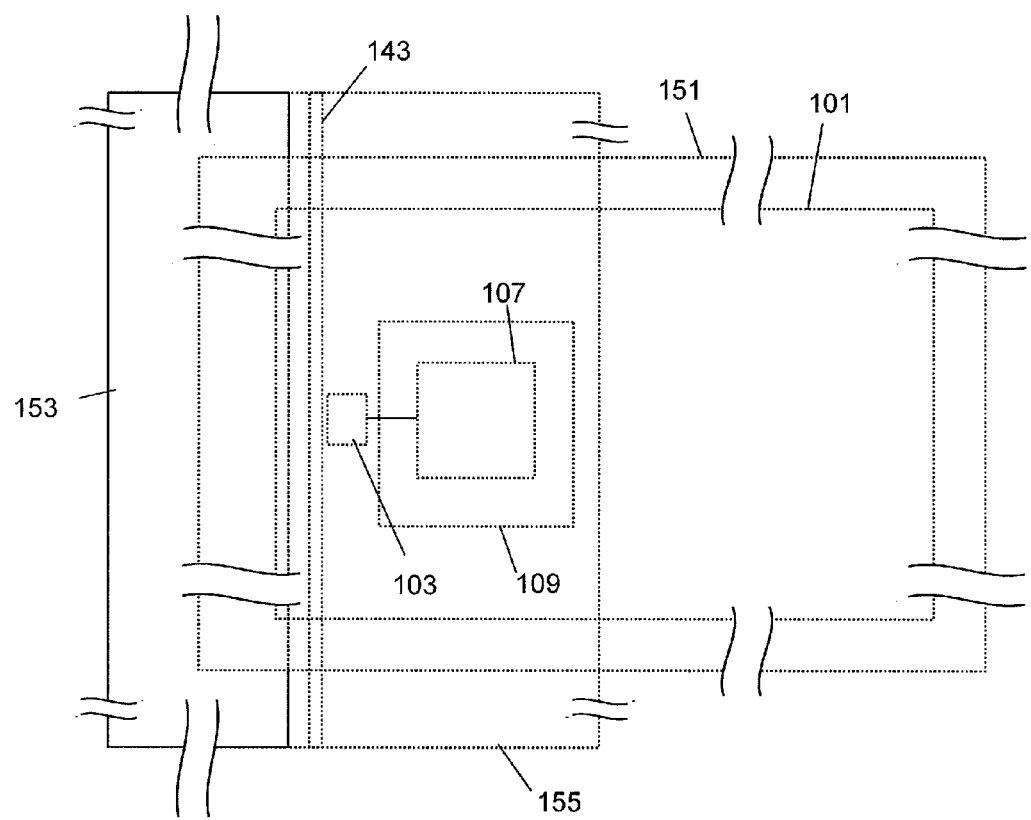
FIG. 12 is a schematic representation illustrating see-through a power generation system as viewed from over its upper surface.
Figure 13:
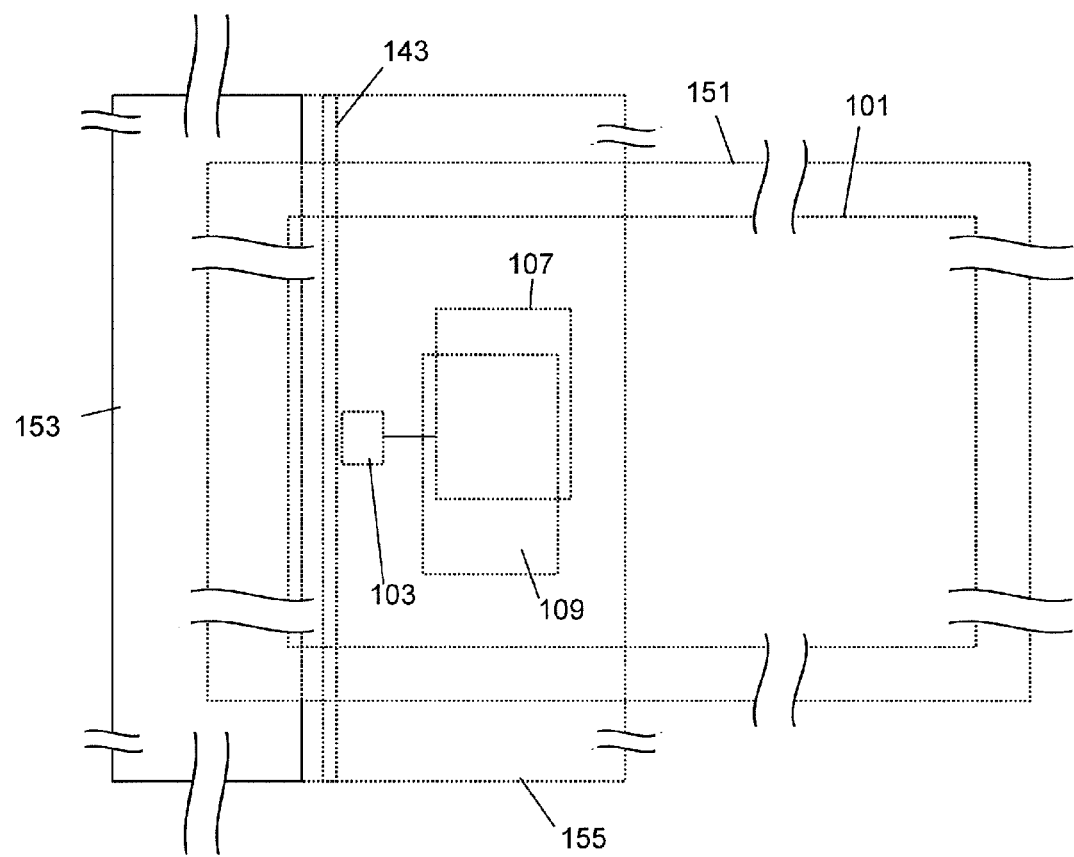
FIG. 13 is a schematic representation illustrating see-through a power generation system as viewed from over its upper surface.

FIGS. 12 and 13 are see-through plan views illustrating exemplary arrangements of the power transmitting and power receiving antennas 107 and 109. The arrangements shown in FIGS. 12 and 13 will be described in detail later.

In the two cross-sectional views shown in FIGS. 11A and 11B, the lower surface of the second fixing member 155 is in contact with the installation plane 157. The relative arrangement of the second fixing member 155 with respect to the installation plane 157 may be determined by the processing step of fixing the first fixing member 153. In the fixing member 141 shown in FIGS. 1C, 3, 4 and 5, the first and second fixing members 153 and 155 are illustrated as being integrated together.

To maintain high transfer efficiency, the power transmitting and power receiving antennas 107 and 109 are preferably arranged so as to face each other at least partially. Nevertheless, these antennas 107 and 109 do not always have to face each other but may also be arranged at any other positions as long as they cross each other at right angles. The power transmitting antenna 107 is a series resonant circuit, which is made up of a first inductor 107a and a first capacitor 107b. On the other hand, the power receiving antenna 109 is a parallel resonant circuit, which is made up of a second inductor 109a and a second capacitor 109b.

Three Methods for Reducing k

FIG. 12 is a schematic representation illustrating see-through a power generation system according to this preferred embodiment as viewed from over its upper surface. As will be described later, in order to achieve the voltage increase effect of the present invention, the coupling coefficient k between the antennas should be reduced. And to reduce k, it is effective to use any of the following three methods.

One method is to increase the distance between the two antennas that face each other. On the other hand, if the two antennas should be arranged to face each other over a short distance (which varies according to the area of the antennas but may fall within the range of a few millimeters to several ten centimeters), then it is effective to make the sizes of the antennas asymmetric according to another method or to reduce the area in which the two antennas face each other according to a third method. According to the conventional electromagnetic induction method, to increase k to its maximum value of one and thereby realize high efficiency transfer, the two antennas are often designed to have the same planar area and be arranged so as to cross each other entirely with their gap decreased. Furthermore, in order to reduce the leakage of the magnetic flux, a magnetic core is often introduced. That is why the arrangement of the antennas according to any of these three methods of the present invention is totally unexpected from the conventional electromagnetic induction method.

According to the second method, the power transmitting antenna 107 may be designed to have a smaller size than the power receiving antenna 109 as shown in FIG. 12, for example. Meanwhile, according to the third method, if the sizes (planar areas) of the first and second inductors 107a and 109a are either equal to each other or close to each other, then those inductors may be shifted from each other as shown in FIG. 13.

According to the conventional electromagnetic induction method, in order to increase the coupling coefficient between power transmitting and power receiving antennas, a magnetic body is often interposed between the power transmitting and power receiving antennas that are arranged close to each other. On the other hand, if the second or third method of the present invention is adopted, a magnetic body should not be interposed in the space between the power transmitting and power receiving antennas that are arranged close to each other. This is because if such a magnetic body were introduced, then the strength of the magnetic field would be excessively high inside the magnetic body and the loss property of the magnetic body would rather cause a decrease in transfer efficiency. Meanwhile, the increase in coupling coefficient between the power transmitting and power receiving antennas, for which the magnetic body is introduced, would rather decrease the voltage increase effect of the present invention. Consequently, in the power generation system of the present invention, the magnetic body should not be interposed in the space between the power transmitting and power receiving antennas. Likewise, introduction of a conductor into the space between the power transmitting and power receiving antennas would also cause a decrease in transfer efficiency. Therefore, in the power generation system of the present invention, the substance arranged between the power transmitting and power receiving antennas is preferably either the air or a dielectric including water.

The description of the second method will be further supplemented. In this example, both of the first and second inductors 107a and 109a are supposed to have at least a planar front surface.

FIG. 14(a) illustrates the arrangement area 113 of the power receiving antenna 109 that has been projected perpendicularly to the plane on which the power transmitting antenna 107 is arranged. As used herein, the "plane" on which the power transmitting antenna 107 is arranged is defined to be a single plane including the front side of the power transmitting inductor 107a (which will be referred to herein as a "first arrangement plane"). FIG. 14(b) is a cross-sectional view illustrating the arrangement plane 240 of the first inductor 107a. In the example illustrated in FIG. 14(b), the first inductor 107a is parallel to its arrangement plane 240. On the other hand, the power receiving antenna's arrangement area is defined herein to be an area that has been projected perpendicularly to the arrangement plane 240 of the power transmitting antenna 107 and that is surrounded with the projected profile of the second inductor 109a.

FIG. 14(a) illustrates the first inductor 107a that has projected perpendicularly to the arrangement plane of the power transmitting antenna 107. In the example illustrated in FIG. 14(a), the first inductor 107a that has been projected onto the arrangement plane of the power transmitting antenna 107 is present inside of, and close to an edge of, the arrangement area 113. By adopting such an arrangement, an even higher voltage step-up ratio is achieved.

To control the voltage step-up ratio of the non-contact transmission section 105, the shapes and sizes of the antennas may be defined to make an asymmetric combination and the power transmitting antenna may have a bigger size than the power receiving antenna.

Figure 14:
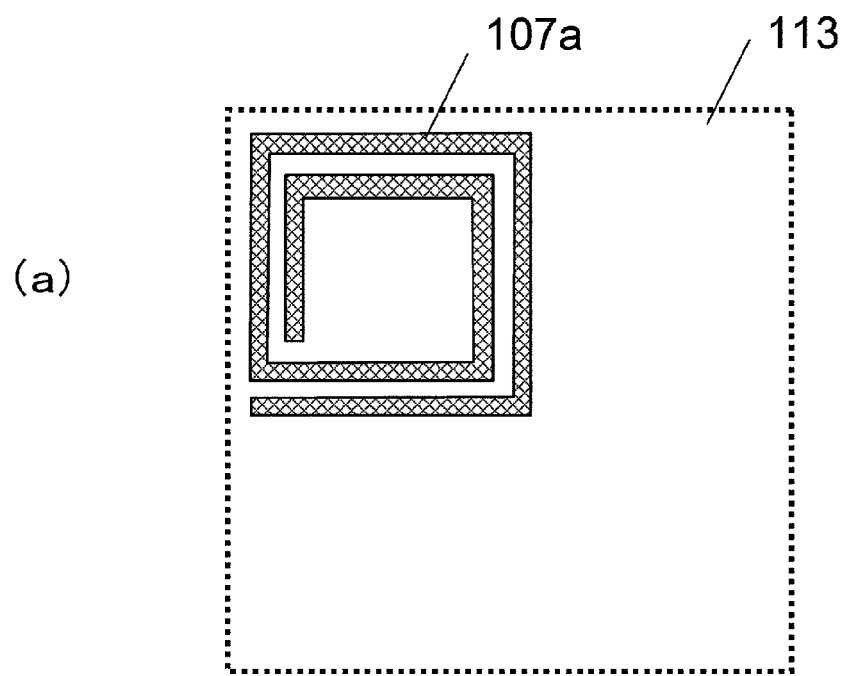
FIG. 14($a$) is a plan view illustrating an exemplary arrangement of two inductors and FIG. 14($b$) is a schematic cross-sectional view thereof.
Figure 14:
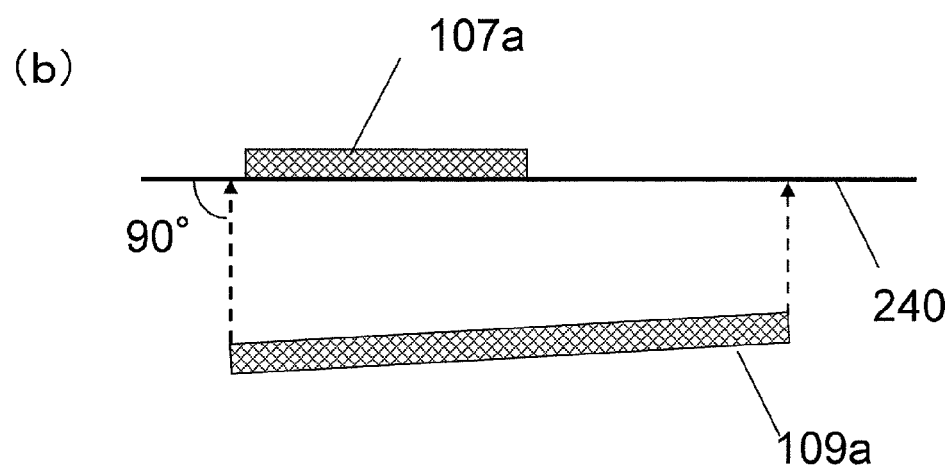

The power transmitting and power receiving antennas 107 and 109 are not required to be arranged as shown in FIG. 14 but may have their positions changed with each other. That is to say, the power transmitting antenna 107 shown in FIG. 14 may be replaced with the power receiving antenna 109 and the arrangement area 113 may be replaced with the arrangement area of the power transmitting antenna 107. In that case, the "arrangement area of the power transmitting antenna 107" refers to the area that has been projected onto the arrangement plane of the power receiving antenna 109 and that is surrounded with the projected profile of the inductor 107a. Also, the "arrangement plane of the power receiving antenna 109" is defined to be a single plane including the front side of the second inductor 109a (which will be referred to herein as a "second arrangement plane"). To achieve sufficiently high transfer efficiency, the first and second arrangement planes are preferably parallel to each other. But those planes are not required to be exactly parallel to each other. It should be noted that the first and second inductors 107a and 109a are not required to have a planar shape.

Figure 15:
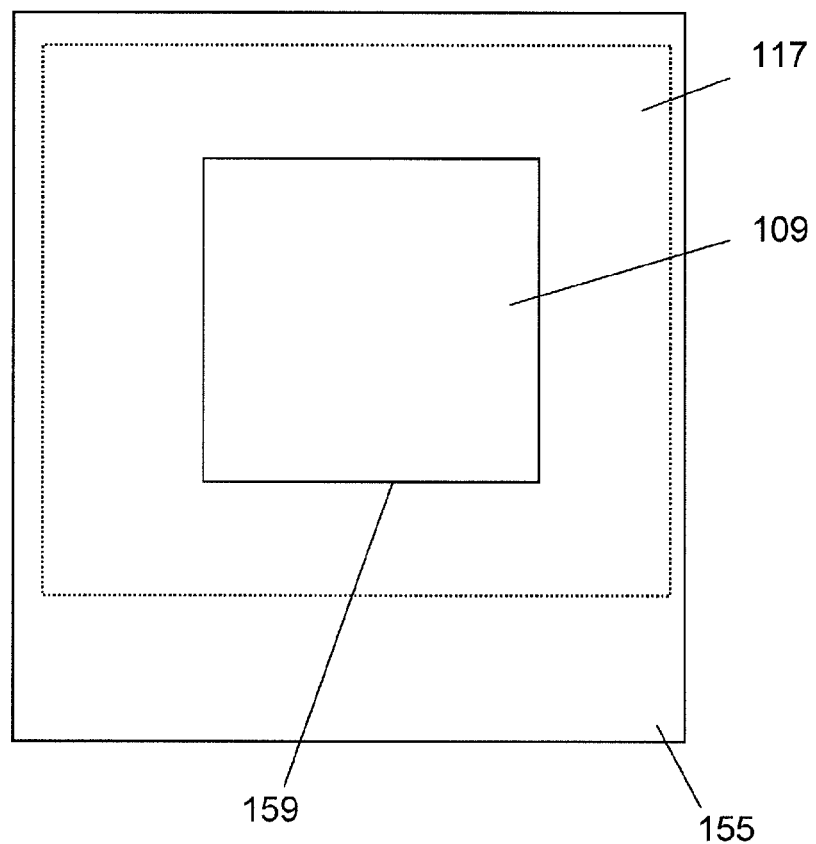
FIG. 15 illustrates another exemplary arrangement of antennas.

FIG. 15 illustrates another exemplary arrangement area 113 of the power receiving antenna 109 that has been projected perpendicularly to the arrangement plane of the power transmitting antenna 107.

Constraint on Second Fixing Member: Non-Magnetic Conductors Should not be Arranged Close to Each Other to Maintain High Efficiency To prevent the module 10 from dropping even in a strong wind, the first fixing member 153 is preferably made of stainless steel or any other suitable material that can maintain high mechanical strength for a long time. On the other hand, the second fixing member 155 is not directly subjected to the stress applied from the module or the cable connecting portion, and therefore, the range of materials to choose from for the second fixing member 155 is not as narrow as that of the first fixing member 153 as far as the mechanical strength is concerned. That is why the second fixing member 155 may be made of resin, for example.

Figure 16:
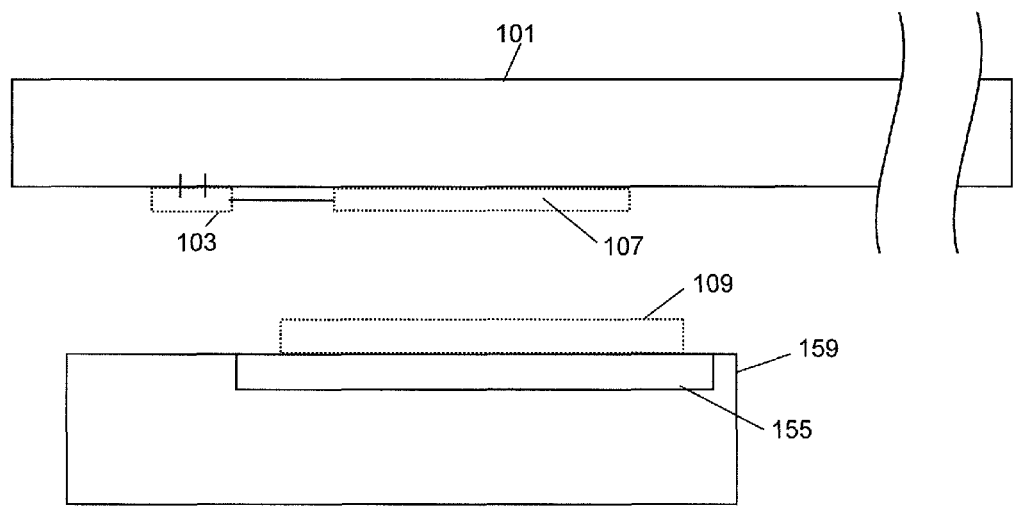
FIG. 16 is a side cross-sectional view schematically illustrating the arrangement of a power transmitting antenna, a power receiving antenna and a group of components that surround them.

FIG. 16 is a schematic cross-sectional view illustrating the power transmitting and power receiving antennas 107 and 109 and their surrounding members. As shown in FIG. 16, if an eddy current avoiding space 159 is produced on the surface of the second fixing member 155, which is located right under the power receiving antenna 109, the power transfer efficiency between the antennas can be kept high. By avoiding putting a conductor around the power receiving antenna, the occurrence of an eddy current, which should be induced in the surrounding conductor, if any, can be reduced. As a result, a decrease in transfer efficiency can be minimized.

The eddy current avoiding space 159 may be made of a magnetic body that will cause low loss and have high permeability such as a soft magnetic alloy like an Fe—Nb—Zr—B based alloy, an iron-based amorphous alloy, a silicon steel plate, or a ferrite or may also be made of a dielectric such as a resin or a ceramic. However, no normal non-magnetic conductor may be adopted. Meanwhile, the air is also a low-loss material and therefore can also be selected as a material for the eddy current avoiding space 159.

Figure 17:
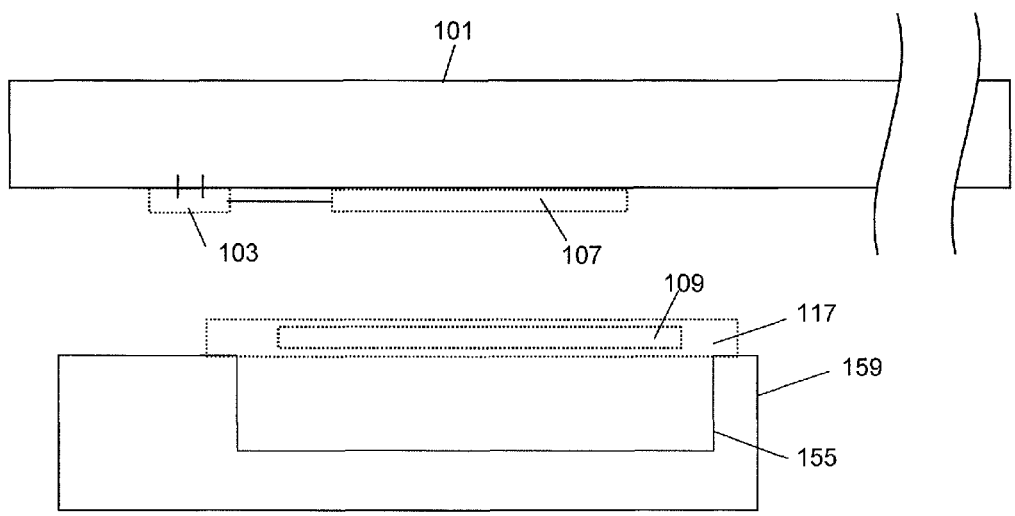
FIG. 17 is a side cross-sectional view schematically illustrating the arrangement of a power transmitting antenna, a power receiving antenna and a group of components that surround them.

FIG. 17 is a schematic cross-sectional view illustrating another exemplary arrangement. In this example, the second fixing member 155 is made of a non-magnetic conductor, and a recess has been cut to a certain depth under the surface so as to be located right under the power receiving antenna 109. Even so, by filling the recess with the air, an eddy current avoiding space 159 can also be produced. In that case, even if rain drops are collected in the eddy current avoiding space 159 when the system is operated outdoors, the transfer characteristic would not be affected seriously.

Figure 18:
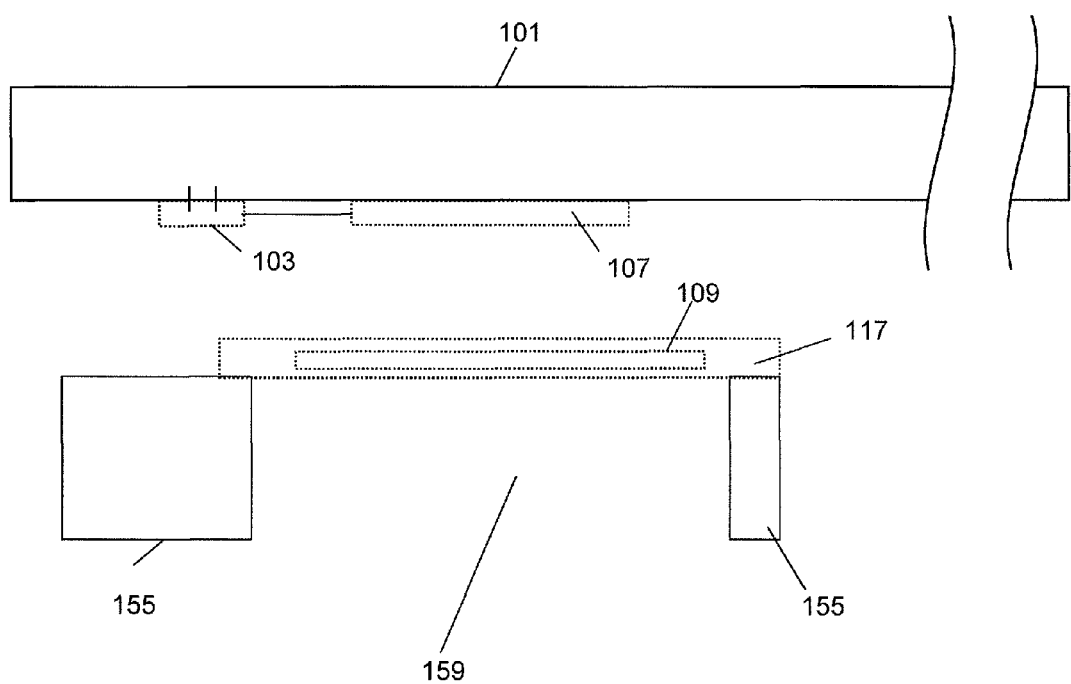
FIG. 18 is a side cross-sectional view schematically illustrating the arrangement of a power transmitting antenna, a power receiving antenna and a group of components that surround them.

FIG. 18 is a schematic cross-sectional view illustrating yet another exemplary arrangement. In this example, a hole is cut through the second fixing member 155 right under the power receiving antenna 109. In this manner, an eddy current avoiding space 159 can be provided with the weight of the second fixing member 155 reduced.

Optionally, the power receiving antenna 109, of which the core portion is often a spiral inductor, may be fixed and surrounded with a protective member 117, which is made of a resin material, for example. And the power receiving antenna 109 may be fixed onto the second fixing member 155 with such a protective member 117 interposed between them. In that case, the spatial position of the second antenna 109 can be fixed while avoiding an unnecessary contact between the second fixing member 155, which may possibly be made of a non-magnetic conductor, and the second antenna 109.

Meanwhile, unless the second fixing member 155 is made of a non-magnetic conductor, the second fixing member 155 itself could be regarded as an eddy current avoiding space. In that case, a low-loss power transmission is realized between the antennas without adding any extra member to the fixing member 155 or machining the surface of the second fixing member 155. For example, even if the second fixing member 155 is made of the same stainless steel but if the stainless steel is non-magnetic stainless steel such as austenitic steel, then the surface of the second fixing member 155 should be machined. However, if the second fixing member 155 is made of a ferromagnetic stainless steel such as martensitic or ferrite steel, a low-loss power transmission is also realized between the antennas even without machining the surface of the second fixing member 155.

The area in which the eddy current avoiding space 159 is produced preferably includes an area that faces the entire power receiving antenna 109. Also, if the distance between the power transmitting and power receiving antennas 107 and 109 that face each other is short, then the area in which the eddy current avoiding space 159 is produced preferably further includes an area that faces the power transmitting antenna 107. Furthermore, a broader area is preferably allocated to the eddy current avoiding space 159 than to the power receiving antenna 109.

As described above, in the solar power generation system of this preferred embodiment, it is preferred that the power receiving antenna 109 either have a broader area than, or be shifted with respect to, the power transmitting antenna 107. That is why unlike in the conventional electromagnetic induction method, a broader area is preferably allocated to the eddy current avoiding space 159 than to the power transmitting antenna 107.

Figure 19:
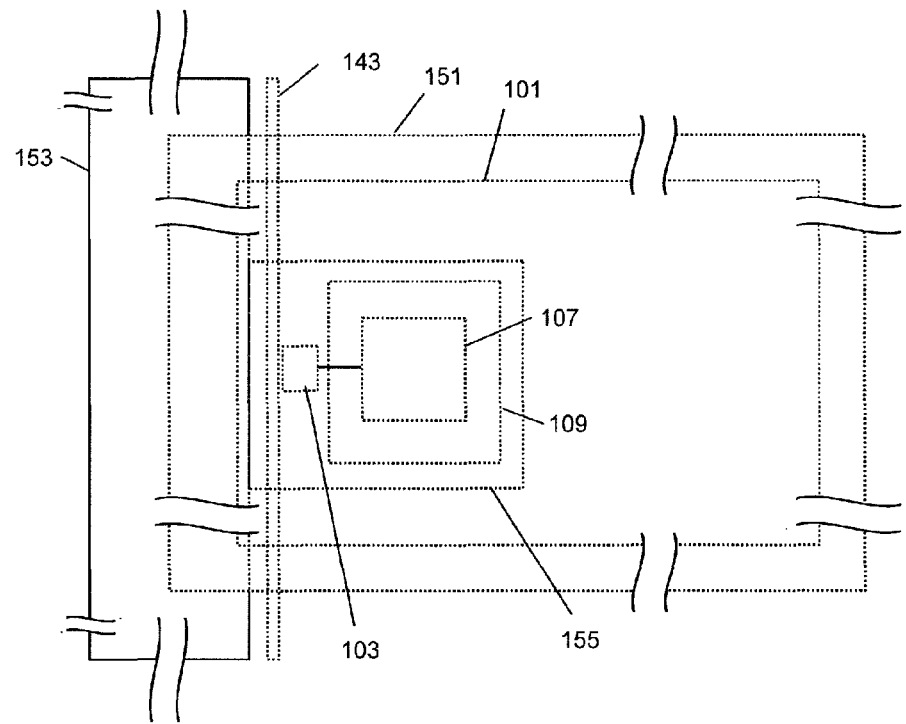
FIG. 19 is a schematic representation illustrating see-through a power generation system as viewed from over its upper surface.
Figure 20:
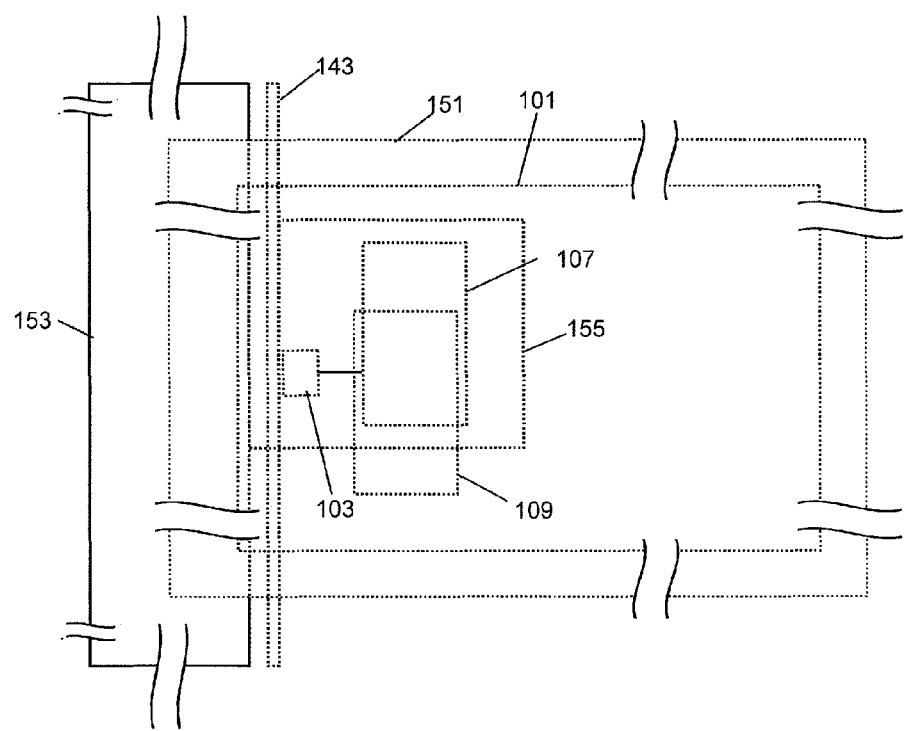
FIG. 20 is a schematic representation illustrating see-through a power generation system as viewed from over its upper surface.

As shown in FIGS. 12 and 13, the second fixing member 155 may be arranged adjacent to the first fixing member 153. But as shown in FIGS. 19 and 20, the area of the second fixing member 155 has only to be large enough to support the power receiving antenna 109 right under the power transmitting antenna 107. The input terminal of the cable 143 is preferably fixed where it is connected to the power receiving antenna 109. However, the cable 143 may be housed inside the second fixing member 155 over the whole length.

To ensure long-term reliability, the parts (including inductors and capacitors) that make up the power transmitting and power receiving antennas 107 and 109 are preferably housed inside the protective member 117 as shown in FIG. 11B. The protective member 117 is preferably subjected to waterproof treatment. If the oscillator is housed in the protected device on the transmitting end that includes the power transmitting antenna 107, the long-term reliability of connector terminals, RF cables and other members that connect the oscillator 103 and the power transmitting antenna 107 together can be increased. Also, if every circuit on the transmitting end of the non-contact transmission system is housed in the protected device on the transmitting end to be attached to the power generating module body 101, then the power generating module body 101 and the circuits on the transmitting end can be connected together simply by mechanically connecting the protected device (with screws, for example) and by connecting the DC output terminals (which are usually positive and negative terminals) of the power generating module body 101 and the DC input terminals to the oscillator 103 with a connector.

The protective member 117 may be directly fixed on an external member such as the module or the second fixing member 155. Optionally, unless the intensity of the resonant magnetic field coupling between the power transmitting and power receiving antennas 107 and 109 is affected, a ferromagnetic body and a magnet may be provided for the protective member 117 and the external member, respectively, so that the protective member 117 is attached to the external member in a readily removable state by using the magnetic force produced between the ferromagnetic body and the magnet. Alternatively, the protective member 117 may also be attached to the external member in a readily removable state by providing a sucker for either the protective member 117 or the external member. Still alternatively, the second fixing member 155 may also function as the protective member 117. Furthermore, the eddy current avoiding space 159 described above may be produced inside of the protective member 117 on the receiving end.

The power generating module body 101 of this preferred embodiment includes a number of solar cells (which will be sometimes simply referred to herein as "cells") that are connected in series together. To increase the power generation efficiency as much as possible, the solar cells are preferably crystalline silicon solar power generators. But the solar cells for use in the present invention may also be any of various other types of solar power generators that use a compound semiconductor material such as gallium arsenide or a CIS (copper-indium-selenium) based material. Or the solar cells may even be any of numerous kinds of solar power generators that use an organic material. The CIS-based material may include elements such as gallium and/or tin. If a semiconductor material is used, the crystal structure of the semiconductor may be a single crystalline, polycrystalline or amorphous one. Optionally, a tandem type solar power generator, in which several types of semiconductor materials are stacked one upon the other, may also be used.

As the oscillator 103, a class D, E or F amplifier that would realize high efficiency and low distortion may be used. Or a Doherty amplifier could also be used. Optionally, a sinusoidal wave may be produced with high efficiency by arranging either a low-pass filter or a band pass filter after a switching element that generates an output signal with a distortion component.

The DC energy that has been generated by the power generating module body 101 is converted with high efficiency into RF energy by the oscillator 103. That RF energy is transmitted wirelessly through the space by the non-contact transmission section 105 and then output through the output terminal 119. The respective resonant frequencies fT and fR of the power transmitting and power receiving antennas 107 and 109 are set to be substantially equal to the frequency f0 of the RF energy generated by the oscillator 103. Also, according to this preferred embodiment, the output impedance Zout of the power receiving antenna 109 is set to be higher than the input DC impedance Zidc of the oscillator 103.

To reduce multiple reflection of the RF energy between the circuit blocks and to improve the overall power generation efficiency, when the output terminal of the power receiving antenna 109 is connected to a load, the output impedance Zoc of the RF energy of the oscillator 103 is preferably matched to the input impedance Zic of the power transmitting antenna 107. Likewise, when the oscillator 103 is connected to the power transmitting antenna 107, the output impedance Zout of the power receiving antenna is preferably matched to the resistance value R of the connected load.

In this description, if two impedances are "equal to each other", then the impedances may naturally be exactly equal to each other but could also be just roughly equal to each other. Specifically, if the difference between the greater and smaller impedances is within 25% of the greater one, then those two impedances will also be regarded herein as being "equal to each other".

According to this preferred embodiment, the efficiency of the non-contact power transmission depends on the gap between the power transmitting and power receiving antennas 107 and 109 (which will be referred to herein as an "antenna-to-antenna gap") and on the magnitude of loss caused by circuit components that form the power transmitting and power receiving antennas 107 and 109. In this description, the "antenna-to-antenna gap" substantially means the gap between the two inductors 107a and 109a. The antenna-to-antenna gap can be estimated based on the feature size of the areas occupied by those antennas.

In one preferred embodiment of the present invention, the first and second inductors 107a and 109a both have the same planar pattern and are arranged so as to face each other and be parallel to each other. In this description, the "feature size" of the areas occupied by the antennas refers to an inductor size of the smallest one of the antennas. Specifically, if the inductor of an antenna has a circular planar pattern, then the feature size is defined to be the diameter of the inductor. On the other hand, if the inductor has a square planar pattern, the feature size is defined to be the length of each side thereof. And if the inductor has a rectangular planar pattern, the feature size is defined to be the length of its shorter sides. According to this preferred embodiment, even if the antenna-to-antenna gap is approximately 1.5 times as large as the feature size of the antenna's arrangement area, energy can also be transferred with a RF transfer efficiency of 90% or more. In addition, the output impedance of the non-contact transmission section 105 can be 7832 or more times as high as the input impedance.

In this preferred embodiment, the first and second inductors 107a and 109a have a spiral structure, of which the numbers of turns are N1 and N2, respectively, where N1>1 and N2>1. However, the first and second inductors 107a and 109a may also have a loop structure with a number of turns of one. These inductors 107a and 109a are not required to be made of a single-layer conductor pattern but may also be a series connection of multiple conductor patterns that have been stacked one upon the other.

The first and second inductors 107a and 109a are preferably made of copper, silver or any other conductor with good electrical conductivity. As RF current with RF energy flows mostly around the surface of a conductor, the surface of the conductor may be covered with a material with high electrical conductivity to increase the power generation efficiency. If the inductors 107a and 109a are designed so as to have a cavity in the middle of its cross section, their weight can be reduced. Furthermore, if the inductors 107a and 109a are formed by adopting a parallel wiring structure with Litz wires, for example, then the conductor loss per unit length can be reduced and the Q factors of the series resonant circuit and the parallel resonant circuit can be increased. As a result, power can be transmitted with even higher efficiency.

To cut down the manufacturing cost, the wiring may be formed at a time by ink printing technique. If necessary, a magnetic body may be arranged near the first and/or second inductor(s) 107a, 109a. However, the coupling coefficient between the first and second inductors 107a and 109a should not be set to be an excessively high value. For that reason, it is preferred that inductors with an air-core spiral structure, which can set the coupling coefficient between the inductors 107a and 109a to a moderate value, be used.

As the first and second capacitors 107b and 109b, any type of capacitors, which may have a chip shape, a lead shape or any other appropriate shape, may be used. Optionally, the capacitance produced between two levels of wires that interpose the air between them could also function as the first and second capacitors 107b and 109b. If the first and second capacitors 107b and 109b are implemented as MIM capacitors, a low-loss capacitor circuit can be formed by known semiconductor device processing or multilevel circuit board process.

Next, the voltage increase effect produced by the power generation system of this embodiment of the present invention will be described with reference to FIG. 10.

Suppose the power transmitting antenna 107 at the transmitting end and the power receiving antenna 109 at the receiving end are coupled with each other at a coupling coefficient k. By measuring the two resonant frequencies fL and fH to be isolated when two resonators (i.e., the antennas 107 and 109) that produce resonance at the same frequency f0 are arranged close to each other, the coupling coefficient k can be derived by the following Equation (2):

$$k=(fH^2-fL^2)/(fH^2+fL^2) \quad (2)$$

The frequency f0 of the oscillator 103 is preferably set to be close to the resonant frequencies fL and fH. More specifically, if the Q factors of the pair of coupled resonators at the resonant frequencies fL and fH are represented by QL and QH, respectively, f0 is preferably set so as to satisfy the following inequality (3):

$$fL-fL/QL \le f0 \le fH+fH/QH \quad (3)$$

Also, the mutual inductance M produced between the first inductor 107a with the inductance L1 and the second inductor 109a with the inductance L2 and the coupling coefficient k satisfy the following Equation (4):

$$M=k \times (L1 \times L2)^{0.5} \quad (4)$$

Supposing in the parallel resonant circuit of the power receiving antenna 109, the RF current flowing through the second inductor 109a is identified by IL2 and the RF current flowing through the second capacitor 109b is identified by IC2, the output RF current I2 flowing in the direction shown in FIG. 10 is represented by the following Equation (5):

$$I2=-IL2-IC2 \quad (5)$$

Also, supposing the RF current flowing through the first inductor 107a is identified by IL1, the following Equation (6) can be derived using the RF current IL2 flowing through the second inductor 109a, the RF current IC2 flowing through the second capacitor 109b, the inductance L2 of the second inductor 109a, the parasitic resistance R2 of the second inductor 109a, the inductance L1 of the first inductor 107a and the capacitance C2 of the second capacitor 109b:

$$(R2+j\omega L2) \times IL2+j\omega M \times IL1=IC2/(j\omega C2) \quad (6)$$

Since the resonance condition is satisfied by the power receiving antenna 109, the following Equation (7) is met:

$$\omega L2=1/(\omega C2) \quad (7)$$

The following Equation (8) can be derived from Equations (5), (6) and (7):

$$R2 \times IL2+j\omega M \times IL1=j\omega L2 \times I2 \quad (8)$$

By modifying this Equation (8), the following Equation (9) is obtained:

$$I2=k \times (L1/L2)^{0.5} \times IL1-j(R2/\omega L2) \times IL2 \quad (9)$$

On the other hand, an index Q factor for evaluating the degree of low loss of the resonator of the power transmitting antenna 107 is given by the following Equation (10):

$$Q2=\omega L2/R2 \quad (10)$$

In this case, if the Q factor of the resonator is very high, approximation that neglects the second term of the right side of Equation (6) is permitted. Thus, the magnitude of the RF current (output current) I2 produced by the power receiving antenna 109 is eventually derived by the following Equation (11):

$$I2=k \times (L1/L2)^{0.5} \times IL1 \quad (11)$$

In this case, the RF current I2 depends on the RF current I1 supplied to the resonator at the transmitting end (i.e., the power transmitting antenna 107), which will be the RF current IL1 flowing through the first inductor 107a, the coupling coefficient k between the resonators (antennas), and the inductances L1 and L2 of the first and second inductors.

As can be seen from Equation (11), the current step-up ratio Ir of the power generation system of this preferred embodiment is represented by the following Equation (12):

$$Ir=|I2/I1|/Voc=k/Voc \times (L1/L2)^{0.5} \quad (12)$$

Also, the voltage step-up ratio Vr and the impedance conversion ratio Zr are given by the following Equations (13) and (14), respectively:

$$Vr=(Voc/k) \times (L2/L1)^{0.5} \quad (13)$$

$$Zr=(Voc/k)^2 \times (L2/L1) \quad (14)$$

As can be seen from Equation (13), if $(L2/L1)>(k/Voc)^2$ is satisfied, the voltage step-up ratio Vr is greater than one. Thus, it can be seen that if the coupling coefficient k falls, the voltage step-up ratio Vr rises. According to the conventional energy transfer method by electromagnetic induction, a decrease in coupling coefficient k will lead to a steep decrease in transfer efficiency. According to the resonant magnetic coupling method of this preferred embodiment, however, any decrease in coupling coefficient k will never cause such a steep decrease in transfer efficiency. Particularly if the respective Q factors of the resonators that are used as the power transmitting and power receiving antennas 107 and 109 are set to be high values, non-contact transmission can get done with high efficiency with the voltage step-up ratio Vr increased. Although it depends on the transfer efficiency of antenna-to-antenna power transmission as required by the system and the k value, the Q factors of the resonators that are used as the power transmitting and power receiving antennas 107 and 109 should be at least 100, and are preferably set to be 200 or more, more preferably 500 or more, and even more preferably 1000 or more. To achieve such high Q factors, it is effective to adopt Litz wires as described above.

To avoid the influence of partial shading on a solar power generation system, a parallel connection of a plurality of solar power generating sections is preferred to a series connection of a lot of solar power generating sections. To make a parallel connection of two solar power generating sections realize the same voltage characteristic as what is normally achieved by a series connection of two solar power generating sections, the output voltages of the respective solar power generating sections need to be doubled.

As can be seen from Equation (12), the voltage step-up ratio Vr gets equal to two when $(L2/L1) \ge 4 \times (k/Voc)^2$ is satisfied. Since that relation $(L2/L1) \ge 4 \times (k/Voc)^2$ is satisfied according to this preferred embodiment, a voltage step-up ratio Vr of 2 or more can be achieved.

If $(L2/L1) \geq 100 \times (k/Voc)^2$ is satisfied, a voltage step-up ratio Vr of 10 or more is achieved. And if $(L2/L1) \geq 10000 \times (k/Voc)^2$ is satisfied, a voltage step-up ratio Vr of 100 or more is achieved.

It is possible for the non-contact transmission section of this preferred embodiment to set the k, Voc, L2 and L1 values so as to achieve such a high voltage step-up ratio Vr.

Hereinafter, the effects to be achieved by the solar power generation system of this preferred embodiment will be described in comparison with a conventional non-contact power transmission unit.

In the non-contact power transmission unit disclosed in United States Patent Application Publication No. 2008/0278264, energy is transferred between two resonant magnetic field couplers. However, as that non-contact power transmission unit uses the same resonant coupling method for the two resonators, the voltage is not increased while the energy is transferred. On the other hand, the increase in output voltage caused by the non-contact power transmission unit of this preferred embodiment is an effect that has never been achieved by any conventional power transmission unit and that is produced solely by adopting two different resonant structures (i.e., series and parallel resonant magnetic coupling structures) for the power transmitting and power receiving antennas, respectively, and by transferring energy between those two different resonant structures.

It should be noted that a series resonant circuit and a parallel resonant circuit could also be used in a conventional RF telecommunications system such as an RF tag. However, the terminal impedance at the terminal of a probe for use to test the characteristic of an RF block of such an RF telecommunications system and the characteristic impedance of its RF cable are basically set to be 50Ω. That is why at a point of connection with an antenna of such an RF telecommunications system, circuit blocks are normally connected together with the impedance matched to 50Ω in both of its transmitter and receiver.

On the other hand, in the wireless transmission section of this preferred embodiment, the input to output impedance conversion ratio Zr is defined to be as high as over 100, or sometimes more than 20000 depending on the conditions, as will be described later for specific examples of the present invention. And that high input to output impedance conversion ratio Zr would never have been imagined to be achievable by the conventional RF telecommunications system. Furthermore, to achieve the non-linear voltage increase effect that is not proportional to the turns ratio between the power transmitting and power receiving antennas, approximation that neglects the second term of the right side of Equation (6) must be satisfied and a resonant structure with a high Q factor must be coupled. However, such an assumption cannot be made with a low Q factor of an inductor circuit for use in a printed circuit board for a telecommunications unit.

On top of that, according to this preferred embodiment, the longer the distance between the two resonators (or antennas) and the lower the coupling coefficient k, the higher the voltage step-up ratio Vr achieved will be. This is also an effect that would never have been easily expected from the structure and functions of the wireless transmission section for a known telecommunications system.

In a transformer for use in a power circuit, for example, two inductors are arranged close to each other so as to function as a sort of non-contact power transmission unit. However, no resonant magnetic coupling is produced between those inductors. Also, such a transformer could achieve the voltage increase effect by increasing the ratio of the number of turns N2 of the second inductor to the number of turns N1 of the first inductor. However, if the transformer booster has to achieve a voltage step-up ratio of 10 or more, then the number of turns N2 should be increased to be at least ten times as large as the number of turns N1. Such a significant increase in the number of turns N2 would increase the parasitic resistance component R2 in the second inductor proportionally, thus causing a decrease in transfer efficiency after all. In this respect, according to this preferred embodiment, even if the numbers of turns N1 and N2 are the same, a high Zr can still be achieved.

Even according to the conventional electromagnetic induction technologies, a resonant circuit is sometimes introduced in order to increase the power factor. However, the conventional technology disclosed is nothing but a technique for realizing an ideal transformer characteristic in which the voltage step-up ratio depends linearly on the turns ratio. Also, according to another conventional technique, an additional circuit such as an inductor needs to be introduced into a resonant circuit in order to increase the voltage. On the other hand, according to this preferred embodiment, the voltage can be increased even without introducing such an additional circuit to the resonant circuit and the effect can be achieved non-linearly with respect to the turns ratio. Consequently, this is an effect that would never have been easily imagined from the known resonant electromagnetic induction technologies.

On top of that, to achieve such a non-linear voltage increase effect that is not proportional to the turns ratio between the power transmitting and power receiving antennas according to this preferred embodiment, approximation that neglects the second term of the right side of Equation (6) must be satisfied, and therefore, a resonant structure with a high Q factor must be coupled. However, such an assumption cannot be made with a low Q factor of a coil structure that uses an iron core in a conventional power electronic device.

What is more, according to this preferred embodiment, the more significantly the coupling coefficient k is decreased by either shifting the arrangements of the two resonators (or antennas) with respect to each other intentionally or making the dimensions of those two resonators (or antennas) asymmetric to each other on purpose, the higher the voltage step-up ratio Vr achieved can be. This is also an unexpected effect that would never have been easily achieved with the circuit configuration and functions that are employed in the conventional power electronics technologies.

It should be noted that according to this preferred embodiment, there is no need to set the respective inductances L1 and L2 of the first and second inductors 107a and 109a to be equal to each other. For example, if the inductance L2 is set to be greater than the inductance L1, the voltage step-up ratio Vr can be further increased. To increase L2, the number of turns N2 of the second inductor 109a is preferably set to be greater than the number of turns N1 of the first inductor 107a. If N2/N1 is greater than one, a high voltage step-up ratio can be achieved with smaller loss compared to a situation where the voltage is increased using a known transformer booster. The inductance L2 can also be greater than the inductance L1 by providing a larger area for the power receiving antenna 109 than the power transmitting antenna 105, instead of setting the N2/N1 ratio to be greater than one or with the N2/N1 ratio kept equal to one. According to this preferred embodiment, with that condition that decreases the coupling coefficient k adopted, the voltage step-up ratio can be certainly increased non-linearly, which is advantageous, but the transfer efficiency could decrease, which is disadvantageous. That is why it is preferred that L2 be set to be as high as possible as long as the Q factor of the power receiving antenna does not decrease.

Embodiment 2

Rectified at a Time after Parallel Outputs are Combined Together

Figure 21:
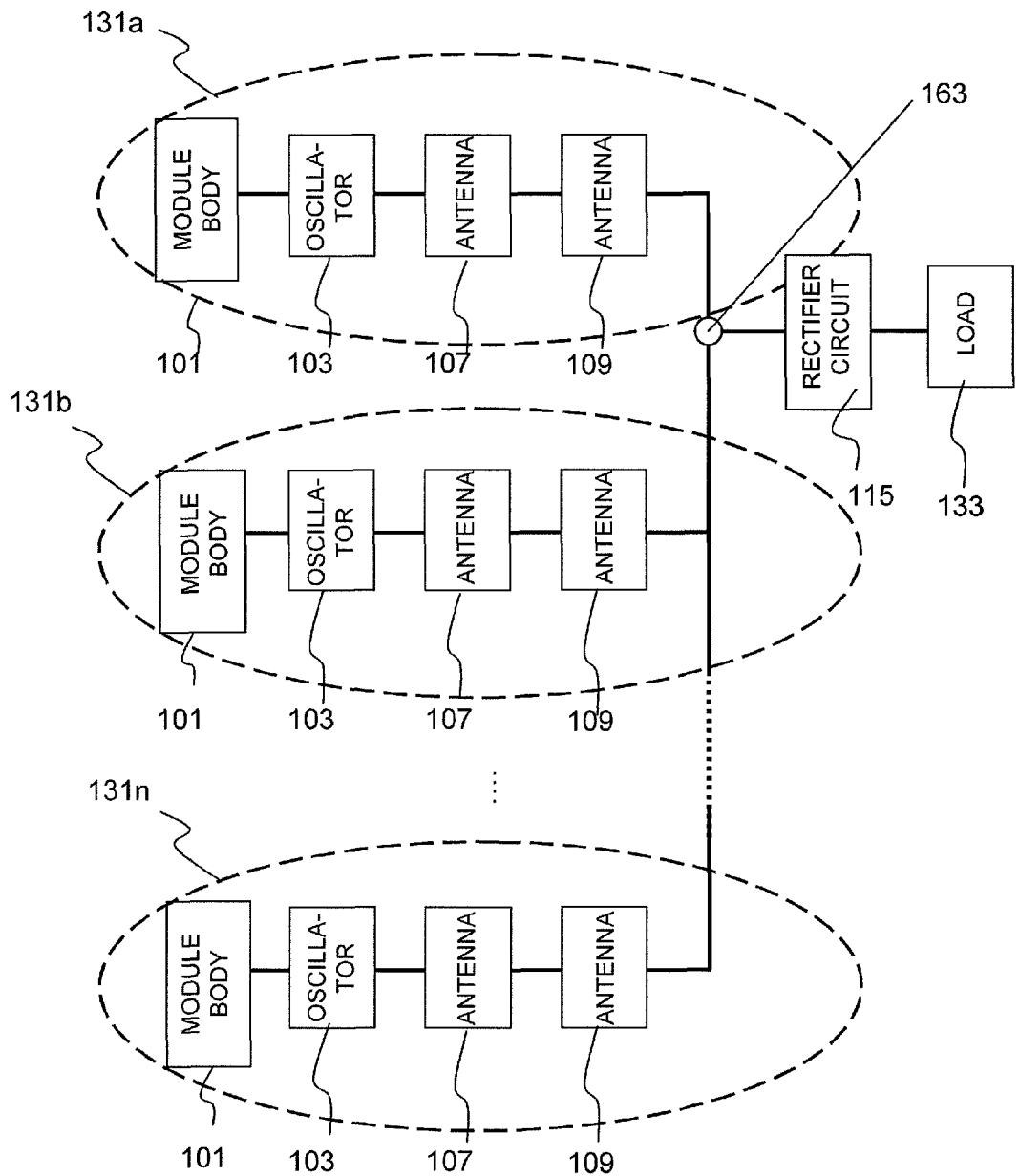
FIG. 21 is a block diagram illustrating the power generation system according to the second embodiment of the present invention.

Hereinafter, a second preferred embodiment of a solar power generation system according to the present invention will be described with reference to FIG. 21, which is a block diagram illustrating a basic arrangement for a solar power generation system according to this preferred embodiment. In FIG. 21, any component also included in the first preferred embodiment described above and having substantially the same function as its counterpart is identified by the same reference numeral and a detailed description thereof will be omitted herein.

A major difference between the solar power generation system of this preferred embodiment and its counterpart of the first preferred embodiment described above lies in that a rectifier circuit 115 is inserted according to this preferred embodiment between the point of parallel combination 163 at which the respective output powers of a plurality of power receiving antennas 109 are combined together and the load 133. The solar power generation system of this preferred embodiment can also achieve the same effects as what is achieved by the solar power generation system of the first preferred embodiment described above. In addition, according to this preferred embodiment, a DC power can be obtained as output.

The solar power generation system shown in FIG. 21 includes a number of power generation system components 131a, 131b, . . . and 131n, which are connected in parallel with each other.

Each of these power generation system components 131a through 131n includes a power generating module body 101, an oscillator 103, a power transmitting antenna 107, and a power receiving antenna 109, which are connected together in series.

The DC energy that has been generated by the power generating module body 101 is converted with high efficiency into RF energy by the oscillator 103. Then, the RF energy thus obtained is transferred by a non-contact method from the power transmitting antenna 107 on the transmitting end to the power receiving antenna 109 on the receiving end. After that, the RF energies (powers) supplied from the respective power generation system components 131a through 131n are combined together through parallel connection. And the combined energy (power) is converted by the rectifier circuit 115 into DC energy, which is then supplied to the load 133.

According to this preferred embodiment, the output voltage supplied by each of these power generation system components 131a through 131n is much higher than the output voltage of its own module. For that reason, even if the power generation system components 131a through 131n are connected in parallel with each other, a voltage value that is even closer to the value required by the load 133 can be obtained.

On top of that, since a number of power generation system components 131a through 131n are connected in parallel with each other, the performance of this solar power generation system should be more stabilized than the conventional power generation system even if any of those power generation system components 131a through 131n deteriorated or if some difference was produced in the condition for irradiating the power generation system components 131a through 131n with sunlight.

To reduce multiple reflection of the RF energy between the circuit blocks and to improve the overall power generation efficiency, when the output terminal of the rectifier circuit 115 is connected to a DC load or a DC load system (neither is shown), the output impedance Zoc of the RF energy output from the oscillator 103 is preferably substantially matched with the input impedance Zin of the power transmitting antenna 107. Likewise, when the oscillator 103 is connected to the power transmitting antenna 107, the output impedance Zout of the rectifier circuit 115 is preferably substantially matched to the resistance value R of the DC load or the DC load system (not shown).

As the rectifier circuit 115, various types of rectifier circuits, including full-wave rectifier circuits and bridge rectifier circuits, are available. FIG. 22(a) is a circuit diagram illustrating a half-wave voltage doubler rectifier circuit, while FIG. 22(b) is a circuit diagram illustrating a full-wave voltage doubler rectifier circuit. There are other types of high voltage step-up ratio rectifier circuits that can achieve a voltage step-up ratio of three or more. And any of those various rectifier circuits may be used in this preferred embodiment.

Figure 22:
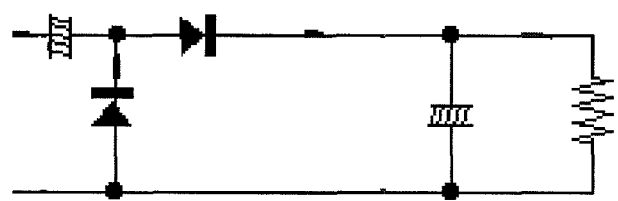
FIG. 22($a$) is a circuit diagram illustrating a half-wave voltage doubler rectifier circuit for use in a power generator as a second preferred embodiment of the present invention, while FIG. 22($b$) is a circuit diagram illustrating a full-wave voltage doubler rectifier circuit for also use in the second preferred embodiment.
Figure 22:
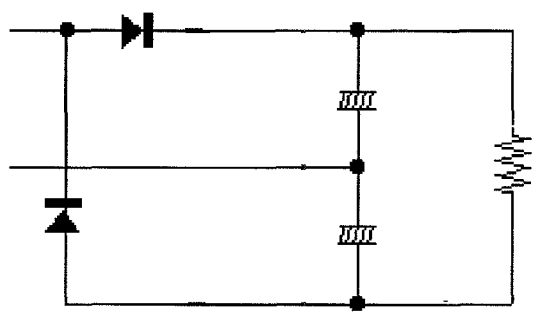

With the voltage doubler rectifier circuit shown in FIG. 22, a DC voltage, which is twice as high as the RF voltage supplied to the rectifier circuit 115, can be output. And by using such a rectifier circuit 115, the voltage that has already been increased by the non-contact transmission section 105 can be further raised.

It should be noted that the rectifier circuit is not required be a circuit including a passive element such as a diode mentioned above. Alternatively, a synchronous rectifier circuit, which makes rectification by performing ON/OFF state controls on an FET's gate using an external clock signal, may also be adopted.

According to this preferred embodiment, the voltage step-up ratio Vr and the impedance conversion ratio Zr that have been derived for the first preferred embodiment are rewritten with the voltage step-up ratio Vrr of the rectifier circuit 115 into the following Equations (15) and (16):

$$Vr = (Voc \times Vrr/k) \times (L2/L1)^{0.5} \quad (15)$$

$$Zr = (Voc \times Vrr/k)^2 \times (L2/L1) \quad (16)$$

According to this preferred embodiment, if the relation $(L2/L1) > (k/(Voc \times Vrr))^2$ is satisfied, the voltage step-up ratio can be greater than one as can be seen from Equation (15).

To achieve a voltage step-up ratio Vr of two or more, $(L2/L1) \geq 4 \times (k/(Voc \times Vrr))^2$ needs to be satisfied. If $(L2/L1) \geq 100 \times (k/(Voc \times Vrr))^2$ is satisfied, a voltage step-up ratio Vr of 10 or more is achieved. And if $(L2/L1) \geq 10000 \times (k/(Voc \times Vrr))^2$ is satisfied, a voltage step-up ratio Vr of 100 or more is achieved.

The solar power generation system of this preferred embodiment realizes a DC power supply system. If a DC power supply system with a working voltage Vo [V] is established using a module with an output Vc [V] as a power supply and if the solar power generation system of this preferred embodiment is applied to that system, the voltage can be increased from Vc [V] to Vo [V] by satisfying the relation $(L2/L1) = (Vo/Vc)^2 \times (k/Voc \times Vrr))^2$. For example, if Vc=300 and Vo=30, then $(L2/L1) = 100 \times (k/Voc \times Vrr))^2$ should be satisfied. Also, if Vc=400 and Vo=30, then $(L2/L1) = 178 \times (k/Voc \times Vrr))^2$ should be satisfied. And if Vc=24 and Vo=0.5, then $(L2/L1) = 2304 \times (k/Voc \times Vrr))^2$ should be satisfied. That is why if this preferred embodiment of the present invention is applied to a DC power supply system, $(L2/L1) \geq 100 \times (k/Voc \times Vrr))^2$ should be satisfied to say the least, $(L2/L1) \geq 178 \times (k/Voc \times Vrr))^2$ is preferably satisfied, and $(L2/L1) \geq 2304 \times (k/Voc \times Vrr))^2$ is more preferably satisfied.

It is preferred that the input terminal of the rectifier circuit 115 be connected to the output terminal 147 of the multi-input cable 143 of the first preferred embodiment described above. Also, in order to further cut down the cost of installation, an arrangement in which the rectifier circuit 115 is fixed on, and integrated with, the fixing member 141 is preferably adopted. Optionally, the rectifier circuit 115 may be housed in the protective member 117 of the first preferred embodiment described above.

Embodiment 3

DC Energies Rectified in Parallel are Combined Together (FIGS. 23 and 24))

Figure 23:
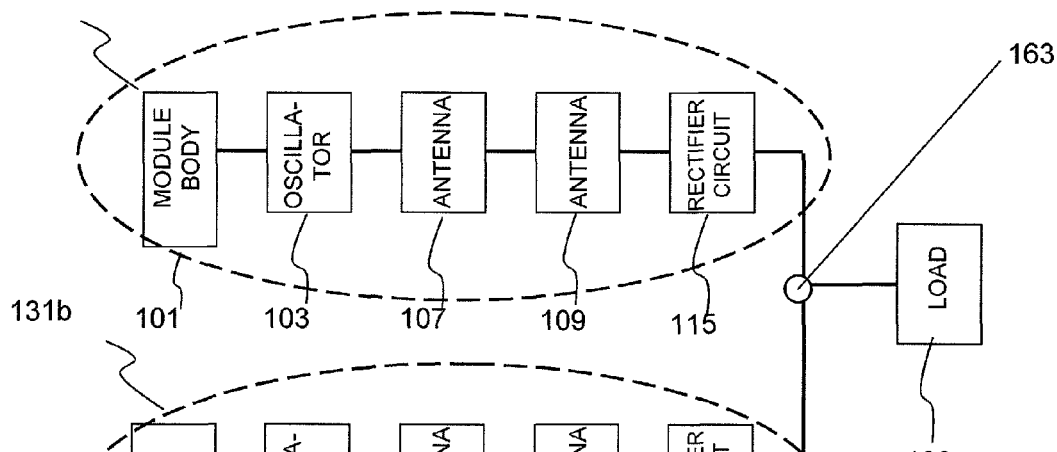
FIG. 23 is a block diagram illustrating the third preferred embodiment of a power generation system according to the present invention.
Figure 23:
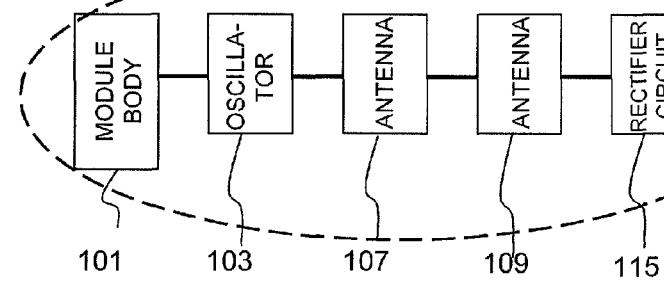
Figure 23:
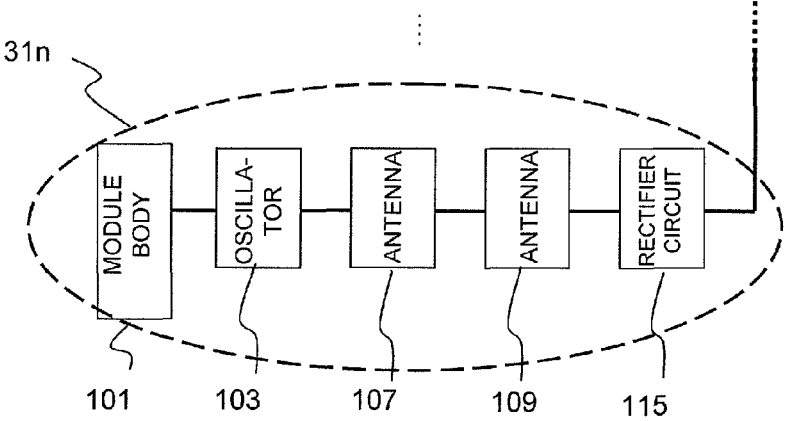
Figure 24:
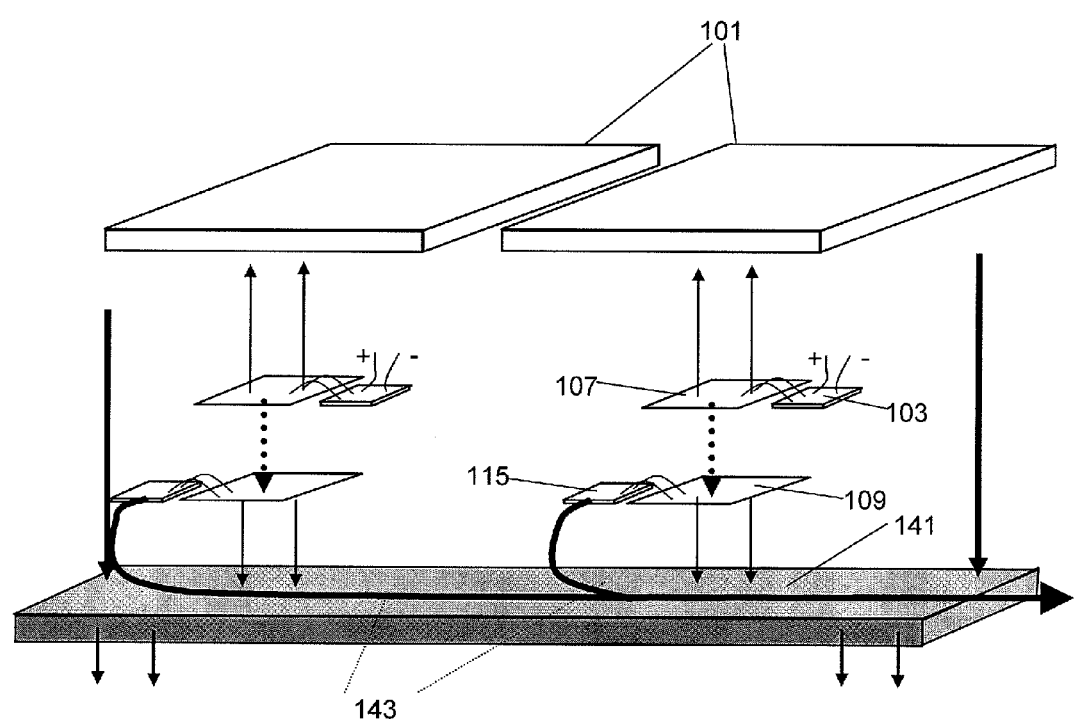
FIG. 24 is a schematic representation illustrating a basic arrangement for a power generation system as a third preferred embodiment of the present invention.

Hereinafter, a third preferred embodiment of a solar power generation system according to the present invention will be described with reference to FIGS. 23 and 24. FIG. 23 is a block diagram illustrating a basic arrangement for a solar power generation system according to this third preferred embodiment, while FIG. 24 is a schematic representation illustrating a solar power generation system according to this preferred embodiment. In FIGS. 23 and 24, any component also included in the first preferred embodiment described above and having substantially the same function as its counterpart is identified by the same reference numeral and a detailed description thereof will be omitted herein.

Unlike the solar power generation system of the first preferred embodiment described above, a rectifier circuit 115 is connected in series to the output section of each power receiving antenna 109 in the solar power generation system of this preferred embodiment. Also, compared to the solar power generation system of the second preferred embodiment described above, the rectifier circuit 115 is inserted closer to the output of its associated power receiving antenna according to this preferred embodiment with respect to the point of parallel combination 163.

The solar power generation system shown in FIG. 23 includes a number of power generation system components 131a, 131b, . . . and 131n, which are connected in parallel with each other. Each of these power generation system components 131a through 131n includes a power generating module body 101, an oscillator 103, a power transmitting antenna 107, a power receiving antenna 109, and a rectifier circuit 115, which are connected together in series.

The DC energy that has been generated by the power generating module body 101 is converted with high efficiency into RF energy by the oscillator 103. Next, the RF energy thus obtained is transferred by a non-contact method from the power transmitting antenna 107 on the transmitting end to the power receiving antenna 109 on the receiving end, and then converted into DC energy by the rectifier circuit 115. After that, the DC energies (powers) supplied from the respective power generation system components 131a through 131n are combined together through parallel connection. And the combined energy (power) is supplied to the load 133.

According to this preferred embodiment, the output voltage supplied by each of these power generation system components 131a through 131n is much higher than the output voltage of its own module. For that reason, even if the power generation system components 131a through 131n are connected in parallel with each other, a voltage value that is even closer to the value required by the load 133 can be obtained.

On top of that, since a number of power generation system components 131a through 131n are connected in parallel with each other, the performance of this solar power generation system should be more stabilized than the conventional power generation system even if any of those power generation system components 131a through 131n deteriorated or if some difference was produced in the condition for irradiating the power generation system components 131a through 131n with sunlight.

The solar power generation system of this preferred embodiment can achieve the same effects as what is achieved by the solar power generation system of the second preferred embodiment described above. On top of that, compared to the second preferred embodiment described above, the power to be handled by each rectifier circuit 115 can be much smaller, and therefore, such a system can be established even if inexpensive semiconductor devices with low power durability are used.

To reduce multiple reflection of the RF energy between the circuit blocks and to improve the overall power generation efficiency, when the output terminal of the rectifier circuit 115 is connected to a DC load or a DC load system (neither is shown), the output impedance Zoc of the RF energy output from the oscillator 103 is preferably substantially matched with the input impedance Zin of the power transmitting antenna 107. Likewise, when the oscillator 103 is connected to the power transmitting antenna 107, the output impedance Zout of the rectifier circuit 115 is preferably substantially matched to the resistance value R of the DC load or the DC load system (not shown).

According to this preferred embodiment, if the relation $(L2/L1) > (k/(Voc \times Vrr))^2$ is satisfied, the voltage step-up ratio can also be greater than one as can be seen from Equation (15).

To achieve a voltage step-up ratio Vr of two or more, $(L2/L1) \geq 4 \times (k/(Voc \times Vrr))^2$ needs to be satisfied. If $(L2/L1) \geq 100 \times ((Voc \times Vrr))^2$ is satisfied, a voltage step-up ratio Vr of 10 or more is achieved. And if $(L2/L1) \geq 10000 \times (k/(Voc \times Vrr))^2$ is satisfied, a voltage step-up ratio Vr of 100 or more is achieved.

The solar power generation system of this preferred embodiment realizes a DC power supply system. If a DC power supply system with a working voltage Vo [V] is established using a module with an output Vc [V] as a power supply and if the solar power generation system of this preferred embodiment of the present invention is applied to that system, the voltage can be increased from Vc [V] to Vo [V] by satisfying the relation $(L2/L1) = (Vo/Vc)^2 \times (k/Voc \times Vrr))^2$. For example, if Vc=300 and Vo=30, then $(L2/L1) = 100 \times (k/Voc \times Vrr))^2$ should be satisfied. Also, if Vc=30 and Vo=400, then $(L2/L1) = 178 \times (k/Voc \times Vrr))^2$ should be satisfied. And if Vc=24 and Vo=0.5, then $(L2/L1) = 2304 \times (k/Voc \times Vrr)))^2$ should be satisfied. That is why if this preferred embodiment of the present invention is applied to a DC power supply system, $(L2/L1) \geq 100 \times (k/Voc \times Vrr))^2$ should be satisfied to say the least, $(L2/L1) \geq 178 \times (k/Voc \times Vrr))^2$ is preferably satisfied, and $(L2/L1) \geq 2304 \times (k/Voc \times Vrr)))^2$ is more preferably satisfied.

In order to further cut down the cost of introducing such a system, an arrangement in which the rectifier circuit 115 is fixed on, and integrated with, the fixing member 141 is preferably adopted. Optionally, the rectifier circuit 115 may be housed in the protective member 117 of the first preferred embodiment described above.

Embodiment 4

Figure 25:
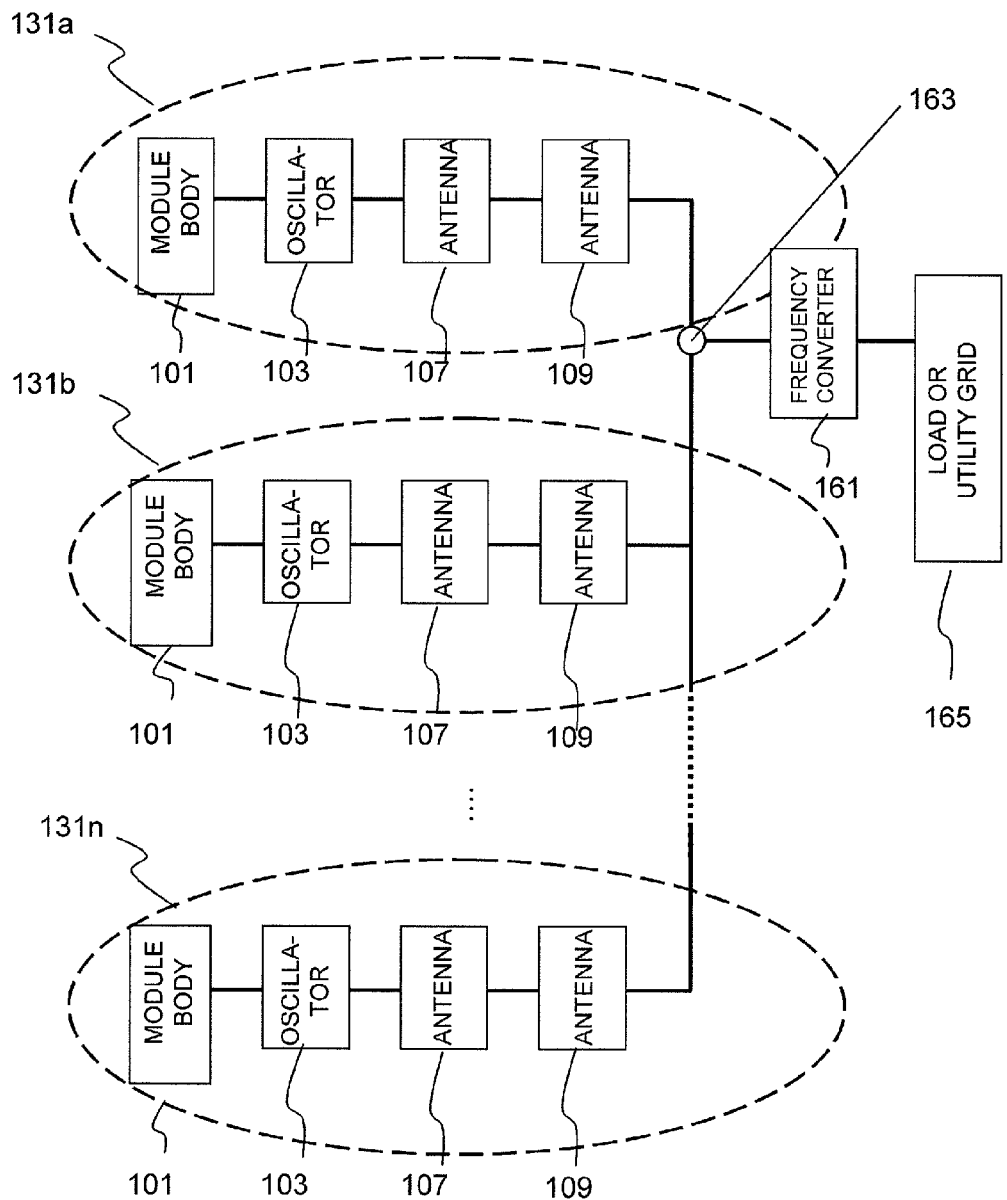
FIG. 25 is a block diagram illustrating a basic arrangement for a power generation system as a fourth preferred embodiment of the present invention.

Converted into AC Voltage at a Time after Parallel Outputs are Combined Together Hereinafter, a fourth preferred embodiment of a solar power generation system according to the present invention will be described with reference to FIG. 25, which is a block diagram illustrating a basic arrangement for a solar power generation system according to this preferred embodiment. In FIG. 25, any component also included in the first, second or third preferred embodiment described above and having substantially the same function as its counterpart is identified by the same reference numeral and a detailed description thereof will be omitted herein.

A major difference between the solar power generation system of this preferred embodiment and its counterparts of the first and second preferred embodiments described above lies in that a frequency converter (RF/AC converter) 115 is inserted according to this preferred embodiment between the point of parallel combination 163 at which the respective output powers of a plurality of power receiving antennas 109 are combined together and the load 133. The solar power generation system of this preferred embodiment can also achieve the same effects as what is achieved by the solar power generation system of the first preferred embodiment described above. In addition, according to this preferred embodiment, an AC power can be obtained as output.

The solar power generation system shown in FIG. 25 includes a number of power generation system components 131a, 131b, . . . and 131n, which are connected in parallel with each other. Each of these power generation system components 131a through 131n includes a power generating module body 101, an oscillator 103, a power transmitting antenna 107, and a power receiving antenna 109, which are connected together in series.

The DC energy that has been generated by the power generating module body 101 is converted with high efficiency into RF energy by the oscillator 103. Then, the RF energy thus obtained is transferred by a non-contact method from the power transmitting antenna 107 on the transmitting end to the power receiving antenna 109 on the receiving end. After that, the RF energies (powers) supplied from the respective power generation system components 131a through 131n are combined together through parallel connection. And the combined energy (power) is converted by the frequency converting circuit 161 into AC energy, which is then supplied to the load 133, which may be an electronic device or a utility grid that operates with an AC input.

According to this preferred embodiment, the output voltage supplied by each of these power generation system components 131a through 131n is much higher than the output voltage of its own module. For that reason, even if the power generation system components 131a through 131n are connected in parallel with each other, a voltage value that is even closer to the value required by the load 133 can be obtained.

On top of that, since a number of power generation system components 131a through 131n are connected in parallel with each other, the performance of this solar power generation system should be more stabilized than the conventional power generation system even if any of those power generation system components 131a through 131n deteriorated or if some difference was produced in the condition for irradiating the power generation system components 131a through 131n with sunlight.

To reduce multiple reflection of the RF energy between the circuit blocks and to improve the overall power generation efficiency, when the output terminal of the frequency converting section 161 is connected to an AC load, the output impedance Zoc of the RF energy provided by the oscillator 103 is preferably substantially matched to the input impedance Zin of the power transmitting antenna 107. Likewise, when the oscillator 103 is connected to the power transmitting antenna 107, the output impedance Zrout of the frequency converting section 161 is preferably substantially matched to an AC load to be connected.

The frequency converting section 161 is a circuit for converting the RF energy provided by the wireless transmission section 105 into an AC frequency fp and a voltage (V0±Vf) for the utility grid, for example. The AC frequency fq may be 50 Hz or 60 Hz, which is much lower than the frequency of the RF energy (which may be 3 MHz, for example). In this case, the voltage Vo is the center value of the utility grid voltage and Vf is a permissible variation from V0. V0±Vf represents the range from V0−Vf through V0+Vf.

Figure 26A:
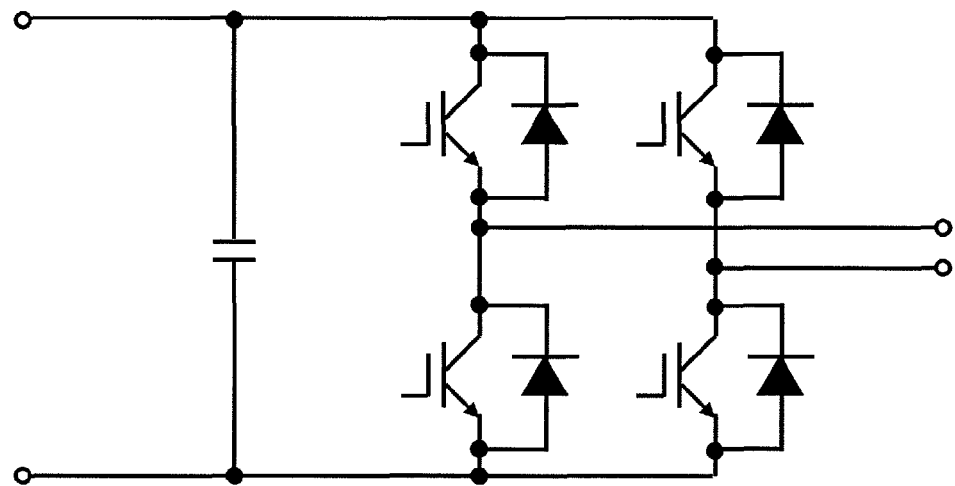
FIG. 26A is a circuit diagram illustrating a single-phase output inverter, which may be used in the power generation system of the fourth preferred embodiment of the present invention.
Figure 26B:
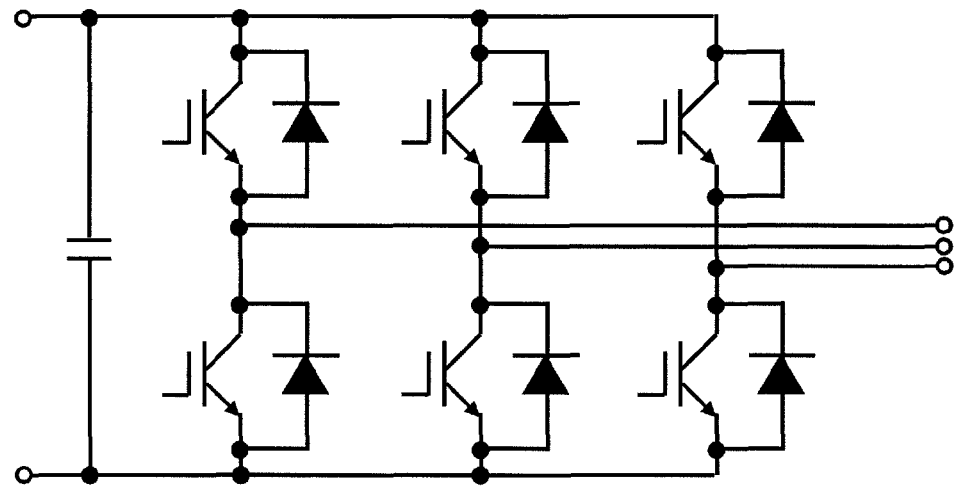
FIG. 26B is a circuit diagram illustrating a three-phase output inverter, which may be used in the power generation system of the fourth preferred embodiment of the present invention.
Figure 26C:
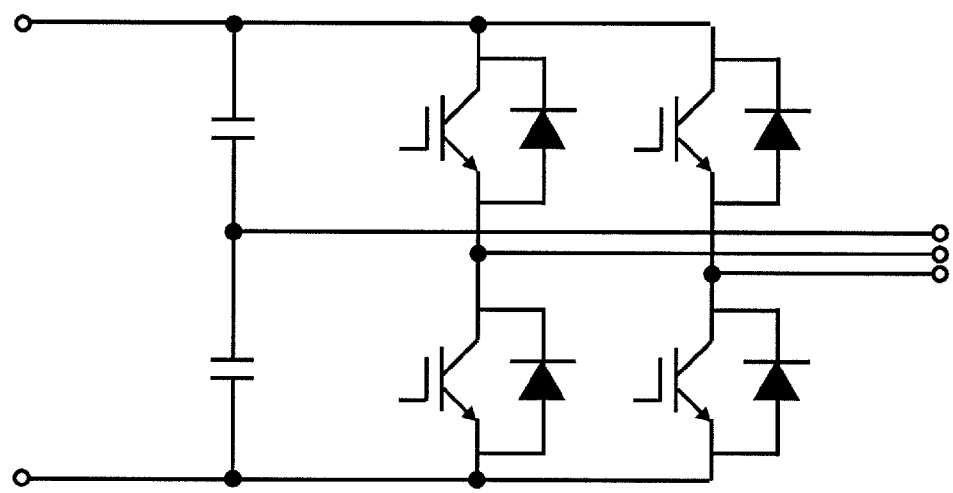
FIG. 26C is a circuit diagram illustrating a V-contact inverter, which may be used in the power generation system of the fourth preferred embodiment of the present invention.
Figure 27:
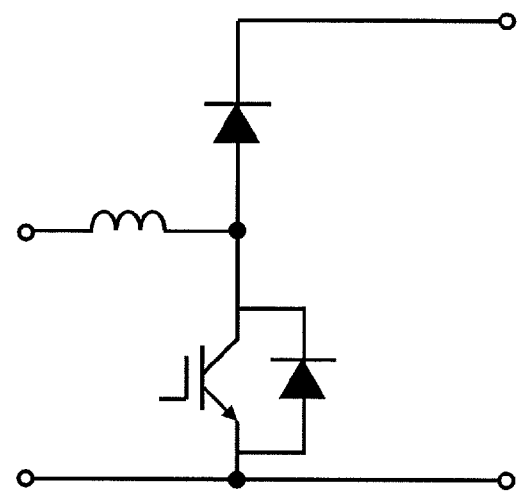
FIG. 27 is a circuit diagram illustrating a voltage step-up chopper circuit, which may be used in the fourth preferred embodiment of the present invention.

According to a method, the RF energy may be converted into AC energy with the frequency fp by once converting (i.e., rectifying) the RF energy into DC energy on the initial stage and then converting the DC energy into energy with the frequency fp on a stage that follows it. For example, a full-wave rectifier or a bridge rectifier as already described for the second preferred embodiment may be used as a circuit on the first stage. With the voltage doubler rectifier circuit shown in FIG. 22, a DC voltage, which is twice as high as the RF voltage supplied to the rectifier circuit 115, can be output. And by using such a rectifier circuit 115, the voltage that has already been increased by the non-contact transmission section 105 can be further raised. It should be noted that the rectifier circuit is not required be a circuit including a passive element such as a diode mentioned above. Alternatively, a synchronous rectifier circuit, which makes rectification by performing ON/OFF state controls on an FET's gate using an external clock signal, may also be adopted. As the circuit for converting the DC energy into AC energy with the frequency fp on a stage that follows the rectifier circuit, an inverter may be used, for example. FIGS. 26A, 26B and 26C are circuit diagrams illustrating a single-phase output inverter, a three-phase output inverter and a V-contact inverter, respectively. By using any of these inverters shown in FIGS. 26A, 26B and 26C, the DC energy that has been rectified on the initial stage of the frequency converting section 161 can be converted and output according to the frequency fp, the voltage V0±Vf and the number of phases of the utility grid. Optionally, after having been DC-AC converted on a following stage, the energy may be passed through an AC filter. By using such a filter, unwanted harmonics components under regulation can be filtered out of the energy flow to be supplied to the utility grid. Still alternatively, by arranging a voltage step-up chopper circuit such as the one shown in FIG. 27 before the inverter circuit, the DC energy may have its voltage increased in advance and then converted into AC energy by the inverter circuit.

Figure 28:
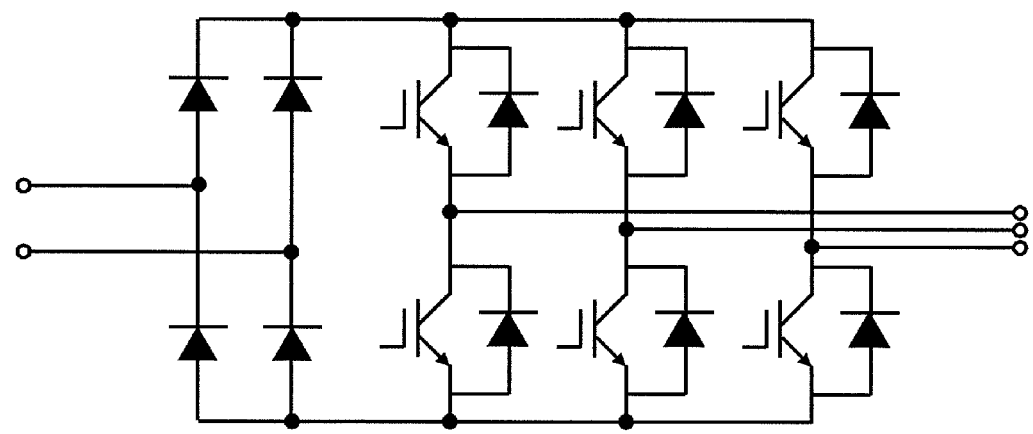
FIG. 28 is a circuit diagram illustrating an indirect matrix converter, which may be used in the fourth preferred embodiment of the present invention.

In the example described above, the frequency converting section 161 includes a rectifier circuit for converting RF energy into DC energy and an inverter for converting the DC energy into AC energy. However, this is just an example of the frequency converting section 161 that can be used in this preferred embodiment of the present invention. Alternatively, the same conversion can also get done even by using an indirect matrix converter shown in FIG. 28. As for details of such a matrix converter, see P. Tenti, L. Malesani, L. Rossetto, "Optimum Control of N-Input K-Output Matrix Converters", IEEE Transactions on Power Electronics, Vol. 7, No. 4, pp. 707-713, October. 1992, the entire disclosure of which is hereby incorporated by reference.

Figure 29:
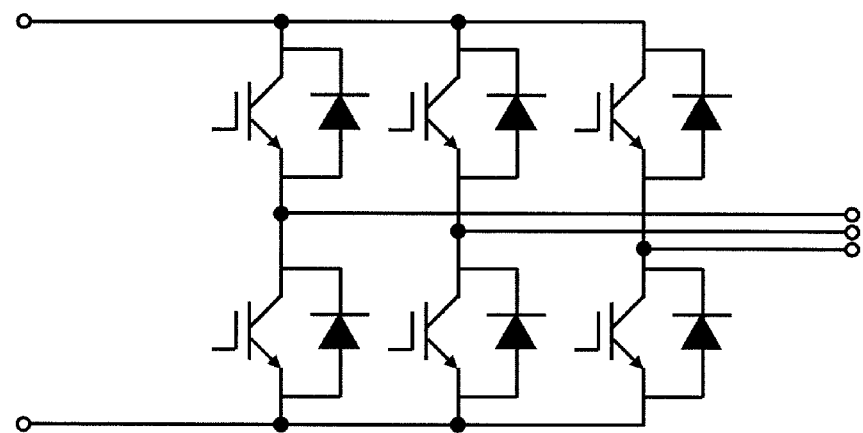
FIG. 29 is a circuit diagram illustrating a direct matrix converter, which may be used in the fourth preferred embodiment of the present invention.

Optionally, the frequency converting section 161 may also be a circuit for converting the RF energy directly into AC energy. If a direct matrix converter such as the one shown in FIG. 29 is used, the RF energy provided by the wireless transmission section can be directly converted into the frequency fp, the voltage V0±Vf and the number of phases of the utility grid. Also, by arranging an RF filter before the matrix converter, unwanted band energy components can be filtered out of the energy to be converted into the AC frequency fp.

With the solar power generation system of this preferred embodiment, power can be sold to, and bought from, a utility grid system. If a solar power generation system according to this preferred embodiment is established using a module with an output Vc [V] as a power supply and connected to a utility grid system with a working voltage Vo [V], the voltage can be increased from Vc [V] to Vo [V] by satisfying the relation $(L2/L1)=(Vo/Vc)^2 \times (k/(Voc \times Vrr))^2$. For example, if Vc=30 and Vo=200, then $(L2/L1)=44 \times (k/(Voc \times Vrr))^2$ should be satisfied. Also, if Vc=60 and Vo=200, then $(L2/L1)=11 \times (k/(Voc \times Vrr)))^2$ should be satisfied. And if Vc=100 and Vo=0.5, then $(L2/L1)=40000 \times (k/(Voc \times Vrr))^2$ should be satisfied. That is why if this preferred embodiment of the present invention is applied to a DC power supply system, $(L2/L1) \geq 11 \times (k/(Voc \times Vrr))^2$ should be satisfied to say the least, $(L2/L1) \geq 44 \times (k/(Voc \times Vrr)))^2$ is preferably satisfied, $(L2/L1) \geq 100 \times (k/(Voc \times Vrr)))^2$ is more preferably satisfied, $(L2/L1) \geq 10000 \times (k/(Voc \times Vrr))^2$ is even more preferably satisfied, and $(L2/L1) \geq 40000 \times (k/(Voc \times Vrr))^2$ is most preferably satisfied.

Also, if a variation in the voltage of the utility grid system within the range of V0−Vf [V]≤Vo [V]≤Vo+Vf [V] is permitted, then $$((V0-Vf)/Vc)^2 \times (k/(Voc \times Vrr))^2 \leq (L2/L1) \leq ((V0+Vf)/Vc)^2 \times (k/(Voc \times Vrr))^2 \qquad (17)$$

is preferably satisfied.

It is preferred that the input terminal of the frequency converter 161 be connected to the output terminal 147 of the multi-input cable 143 of the first preferred embodiment described above. Also, in order to further cut down the cost of installation, an arrangement in which the frequency converter 161 is fixed on, and integrated with, the fixing member 141 is preferably adopted. Optionally, the frequency converter 161 may be housed in the protective member 117 of the first preferred embodiment described above.

The load 133 may be an ordinary electronic device that operates with an AC input. To match the impedance to that of the load 133, the power generating module bodies 101 may be connected in series in a part of the solar power generation system of this preferred embodiment.

Embodiment 5

Figure 30:
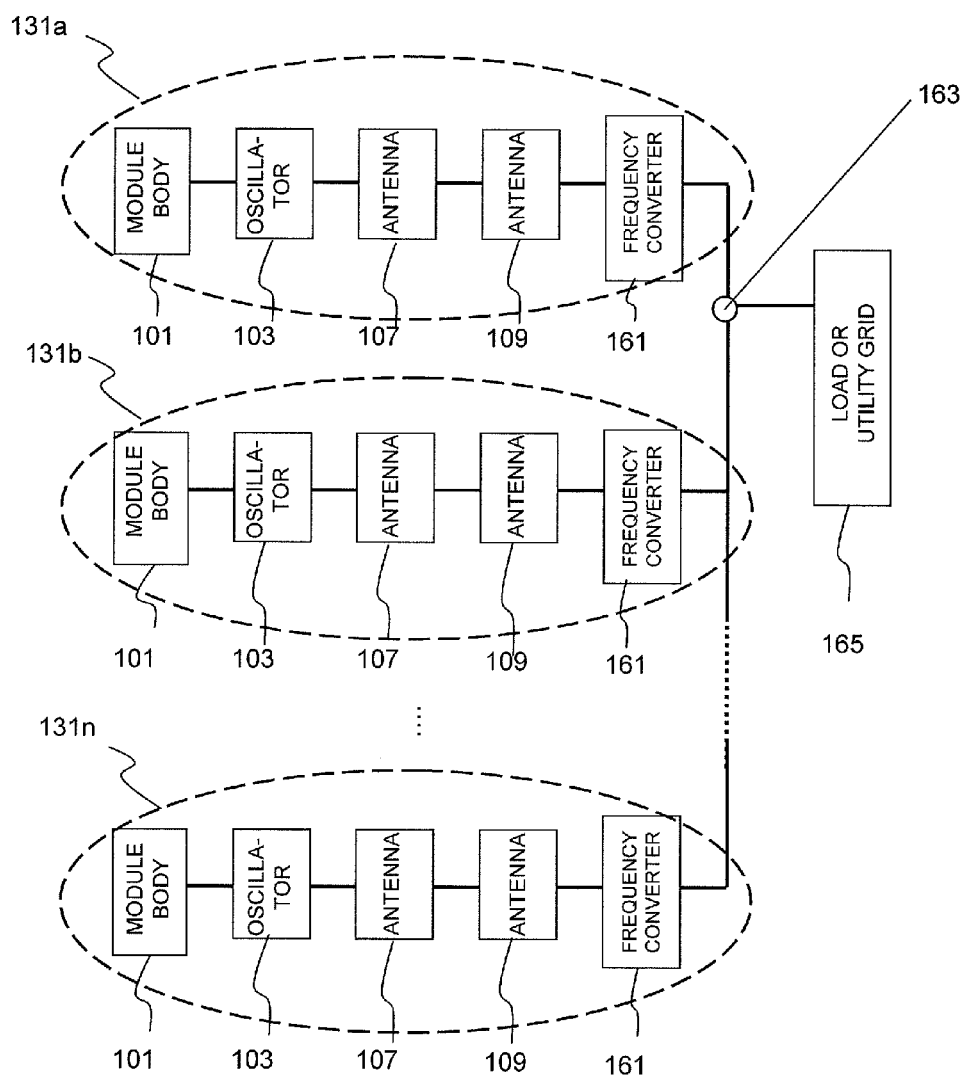
FIG. 30 is a block diagram illustrating a basic arrangement for a power generation system as a fifth preferred embodiment of the present invention.
Figure 31:
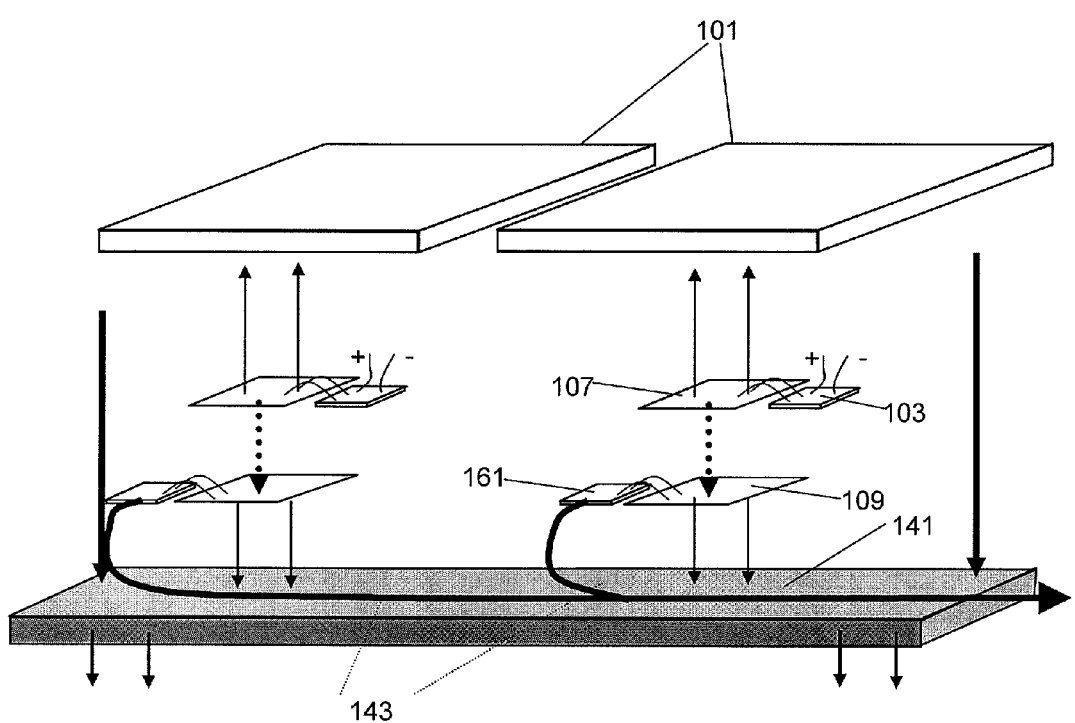
FIG. 31 is a schematic representation illustrating the power generation system of the fifth preferred embodiment of the present invention.

Hereinafter, a fifth preferred embodiment of a solar power generation system according to the present invention will be described with reference to FIG. 30, which is a block diagram illustrating a basic arrangement for a solar power generation system according to this fifth preferred embodiment, while FIG. 31 is a schematic representation illustrating a solar power generation system according to this preferred embodiment. In FIGS. 30 and 31, any component also included in the first, second, third or fourth preferred embodiment described above and having substantially the same function as its counterpart is identified by the same reference numeral and a detailed description thereof will be omitted herein.

Unlike the solar power generation system of the first preferred embodiment described above, a frequency converter 161 is connected in series to the output section of each power receiving antenna 109 in the solar power generation system of this preferred embodiment. Also, compared to the solar power generation system of the third preferred embodiment described above, the circuit to be inserted closer to the output of its associated power receiving antenna with respect to the point of parallel combination 163 is not a rectifier circuit 115 but a frequency converter 161 according to this preferred embodiment. Furthermore, compared to the solar power generation system of the fourth preferred embodiment described above, the frequency converter 161 is inserted closer to the output of its associated power receiving antenna with respect to the point of parallel combination 163.

The solar power generation system shown in FIG. 30 includes a number of power generation system components 131a, 131b, . . . and 131n, which are connected in parallel with each other. Each of these power generation system components 131a through 131n includes a power generating module body 101, an oscillator 103, a power transmitting antenna 107, a power receiving antenna 109, and a frequency converter 161, which are connected together in series.

The DC energy that has been generated by the power generating module body 101 is converted with high efficiency into RF energy by the oscillator 103. Next, the RF energy thus obtained is transferred by a non-contact method from the power transmitting antenna 107 on the transmitting end to the power receiving antenna 109 on the receiving end, and then converted into AC energy by the frequency converter 161. After that, the AC energies (powers) supplied from the respective power generation system components 131a through 131n are combined together through parallel connection. And the combined energy (power) is supplied to the load or utility grid 165.

According to this preferred embodiment, the output voltage supplied by each of these power generation system components 131a through 131n is much higher than the output voltage of its own module. For that reason, even if the power generation system components 131a through 131n are connected in parallel with each other, a voltage value that is even closer to the value required by the load or utility grid 165 can be obtained.

On top of that, since a number of power generation system components 131a through 131n are connected in parallel with each other, the performance of this solar power generation system should be more stabilized than the conventional power generation system even if any of those power generation system components 131a through 131n deteriorated or if some difference was produced in the condition for irradiating the power generation system components 131a through 131n with sunlight.

The solar power generation system of this preferred embodiment can achieve the same effects as what is achieved by the solar power generation system of the fourth preferred embodiment described above. On top of that, compared to the fourth preferred embodiment described above, the power to be handled by each frequency converter 161 can be much smaller, and therefore, such a system can be established even if inexpensive semiconductor devices with a low breakdown voltage are used.

To reduce multiple reflection of the RF energy between the circuit blocks and to improve the overall power generation efficiency, when the output terminal of the frequency converting section 161 is connected to an AC load or a utility grid system, the output impedance Zoc of the RF energy provided by the oscillator 103 is preferably substantially matched to the input impedance Zin of the power transmitting antenna 107. Likewise, when the oscillator 103 is connected to the power transmitting antenna 107, the output impedance Zrout of the frequency converting section 161 is preferably substantially matched to an AC load to be connected or the resistance value R of the utility grid system.

According to this preferred embodiment, if the relation $(L2/L1)>(k/(Vc \times Vtr))^2$ is satisfied, the voltage step-up ratio can also be greater than one as can be seen from Equation (15).

To achieve a voltage step-up ratio Vr of two or more, $(L2/L1) \geq 4 \times (k/(Vc \times Vtr))^2$ needs to be satisfied. If $(L2/L1) \geq 100 \times (k/(Vc \times Vtr))^2$ is satisfied, a voltage step-up ratio Vr of 10 or more is achieved. And if $(L2/L1) \geq 10000 \times (k/(Vc \times Vtr))^2$ is satisfied, a voltage step-up ratio Vr of 100 or more is achieved.

With the solar power generation system of this preferred embodiment, power can be sold to, and bought from, a utility grid system. If a solar power generation system according to this preferred embodiment is established using a module with an output Vc [V] as a power supply and connected to a utility grid system with a working voltage Vo [V], the voltage can be increased from Vc [V] to Vo [V] by satisfying the relation $(L2/L1)=(Vo/Vc)^2 \times (k/(Vc \times Vrr))^2$. For example, if Vc=30 and Vo=200, then $(L2/L1)=44 \times (k/(Vc \times Vrr))^2$ should be satisfied. Also, if Vc=60 and Vo=200, then $(L2/L1)=11 \times (k/(Vc \times Vrr))^2$ should be satisfied. And if Vc=100 and Vo=0.5, then $(L2/L1)=40000 \times (k/(Vc \times Vrr))^2$ should be satisfied. That is why if this preferred embodiment is applied to a DC power supply system, $(L2/L1) \geq 11 \times (k/(Vc \times Vrr))^2$ should be satisfied to say the least, $(L2/L1) \geq 44 \times (k/(Vc \times Vrr))^2$ is preferably satisfied, $(L2/L1) \geq 100 \times (k/(Vc \times Vrr))^2$ is more preferably satisfied, $(L2/L1) \leq 10000 \times (k/(Vc \times Vrr))^2$ is even more preferably satisfied, and $(L2/L1) \geq 40000 \times (k/(Vc \times Vrr))^2$ is most preferably satisfied.

Also, if a voltage of the utility grid system within the range of V1 [V]≥Vo [V]≥V2 [V] is permitted, then $$(V1/Vc)^2 \times (k/(Vc \times Vrr))^2 \leq (L2/L1) \leq (V2/Vc)^2 \times (k/(Vc \times Vrr))^2 \quad (18)$$

is preferably satisfied.

In order to further cut down the cost of introducing such a system, an arrangement in which the frequency converter 161 is fixed on, and integrated with, the fixing member 141 is preferably adopted. Optionally, the frequency converter 161 may be housed in the protective member 117 of the first preferred embodiment described above.

Embodiment 6

Figure 32:
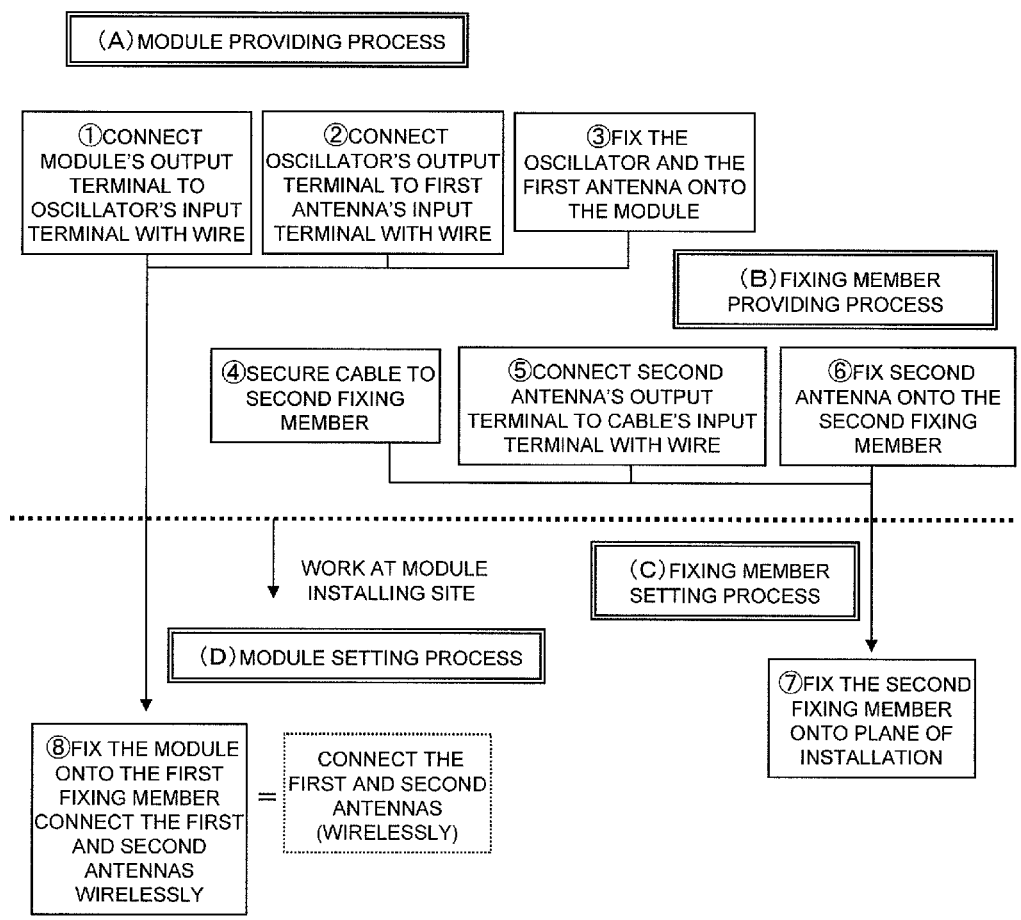
FIG. 32 is a flowchart showing the procedure of installing a power generation system according to the sixth preferred embodiment of the present invention.

Next, a method for installing a solar power generation system according to the present invention will be described with reference to FIG. 32 as a sixth preferred embodiment of the present invention. FIG. 32 is a flowchart showing the procedure of installing a solar power generation system according to any of the first through fifth preferred embodiments of the present invention described above.

According to the installation method of this preferred embodiment, the overall procedure is roughly divided into four processes A through D and may be more finely divided into eight processing steps.

The four processes consist of a module providing process (A), a fixing member providing process (B), a fixing member setting process (C) and a module setting process (D). According to the installation method of this preferred embodiment, most or all of the providing processes (A) and (B) is carried out before the setting processes. As a result, the work of setting the modules at a predetermined site, including a height, can be further simplified.

Specifically, the module providing process includes the steps of: (1) connecting the output terminal of the module to the input terminal of an oscillator with a wire; (2) connecting the output terminal of the oscillator to the input terminal of a power transmitting antenna with a wire; and (3) fixing the oscillator and the power transmitting antenna onto the module. In this process (A), these three processing steps do not always have to be performed in this order but may also be performed in any other order.

The fixing member providing process (B) includes the steps of: (4) securing a cable to a second fixing member; (5) connecting the output terminal of power receiving antenna to the input terminal of the cable with a wire; and (6) fixing the power receiving antenna onto the second fixing member. In this process (B), these three processing steps do not always have to be performed in this order but may also be performed in any other order.

These six processing steps can get done in advance during the stage of provision, not on the spot where the module needs to be actually set. Optionally, the two processes (A) and (B) may also be performed in reverse order.

However, the subsequent processes (C) and (D) should be carried out on the spot where the module is actually set. Specifically, the fixing member setting process (C) includes the step of (7) fixing the second fixing member onto the plane of installation. And the module setting process (D) includes the step of (8) fixing the module onto the first fixing member, thereby forming a high-efficiency power transmission path between the power transmitting and power receiving antennas, although these two antennas are out of contact with each other mechanically.

Figure 33:
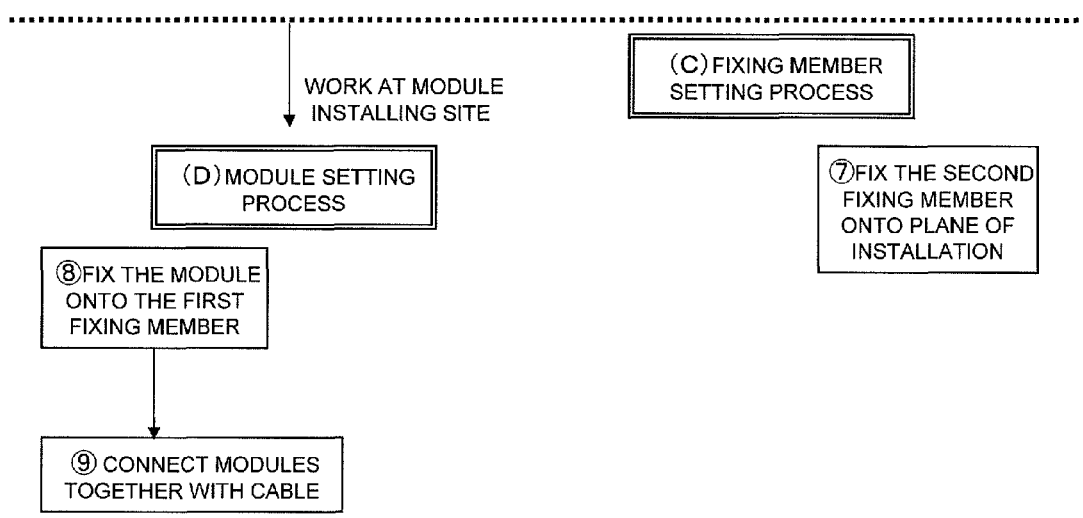
FIG. 33 is a flowchart showing an example of a conventional power generation system installation method.

FIG. 33 is a flowchart showing an example of a conventional installation method. As shown in FIG. 33, the process (D) of the conventional installation method includes an additional processing step of connecting the modules together with a wire, which is very difficult to carry out at a height. The narrower the gap left between adjacent modules in order to maximize the power generated by the system, the more difficult it is to connect the output terminal of one module on the back surface to the input terminal of an adjacent module on the back surface. Also, as for the number of processing steps to carry out, the number of wiring processing steps to get done actually should be approximately as large as the number of modules to be connected together in series.

According to the installation method of this preferred embodiment of the present invention, the step of connecting the modules together with a wire can be eliminated, and therefore, the cost of installing the solar power generation system can be cut down effectively. In the flowchart shown in FIG. 32, the members on the fixing member side are supposed to be only the fixing members, cables and power receiving antennas as in the example of the solar power generation system of the first preferred embodiment described above. However, not only those components but also some other components including a rectifier and a frequency converter may also be connected to the additional components with a wire in the fixing member providing process (B).

Embodiment 7

Figure 34:
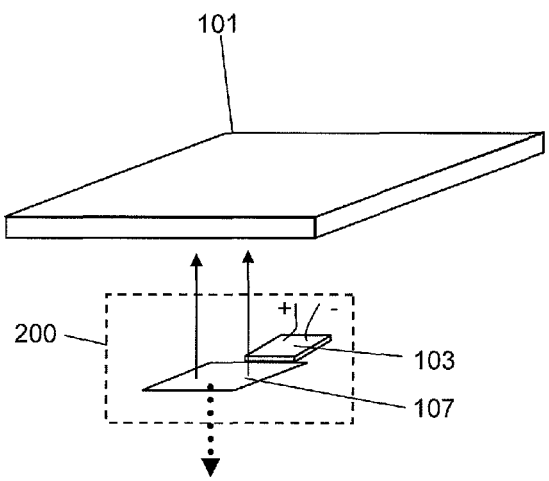
FIG. 34 is a schematic representation illustrating a power generator as a seventh preferred embodiment of the present invention.

Next, another solar power generating module according to the present invention will be described with reference to FIG. 34 as a seventh preferred embodiment of the present invention. FIG. 34 illustrates an example of a solar power generating module, which is installed by the installation method of the sixth preferred embodiment of the present invention just described and which can be used in the solar power generation system of any of the first through fifth preferred embodiments of the present invention described above.

The solar power generating module of this preferred embodiment includes a power generating module body 101 with a power generator that generates DC energy, and a power transmitter 200, which is attached to the power generating module body 101. The power transmitter 200 includes an oscillator 103 that converts the DC energy into RF energy with a frequency f0 and a power transmitting antenna 107 that receives the RF energy from the oscillator 103 and transmits the RF energy into the space as a resonant magnetic field. The power transmitting antenna 107 is a series resonant circuit in which a first inductor and a first capacitor are connected together in series.

Since the power generating module 101 and the power transmitter 200 are integrated together, the power transmitting antenna 107 and the power receiving antenna 109 of the solar power generation system of any of the first through fifth preferred embodiments of the present invention described above can share the majority of their operating resonant frequency ranges with each other. As can be seen easily from Equation (12), the coupling coefficient k between the power transmitting and power receiving antennas 107 and 109 may actually be lower than the coupling coefficient k that was expected in advance for the system. Even so, if the resonant frequency of the power transmitting antenna 107 is set to be equal to that of the power receiving antenna 109, the resonant magnetic field energy generated by the power transmitting antenna 107 can be transmitted by a non-contact method with a voltage step-up ratio that is higher than the one expected for the system.

In addition, if the power generating module 101 and the power transmitter 200 have been integrated together in advance, just the power generating module 101 needs to be fixed to get the installation done. As a result, the distance between the power transmitting and power receiving antennas can be set with the range of variation reduced significantly.

By introducing the solar power generating module of this preferred embodiment, the problems with conventional solar power generation systems, including reducing the cost of installation by non-contact power transmission, improving the low-voltage characteristic of the modules by increasing the voltage of the power being transmitted, and maintaining high enough output energy even when partial shading or local failure occurs, can all be overcome.

Embodiment 8

Hereinafter, an exemplary configuration for a module fixing device that can be used effectively in a solar power generation system according to the present invention will be described with reference to FIG. 35, which is a perspective view illustrating a configuration for a module fixing device to be installed by the installation method of the sixth preferred embodiment of the present invention described above. This module fixing device includes a fixing member 141 and a cable 143. And power receiving antennas 109 have already been fixed on this module fixing device. A rectifier or a frequency converter may be connected to each of those power receiving antennas 109 so as to follow it. Optionally, this fixing member 141 and another fixing member for fixing the modules mechanically may be integrated together. In that case, the module fixing member will include a first fixing member for fixing a plurality of power generating modules onto an object and a second fixing member for fixing a plurality of power receiving antennas onto the object.

Figure 35:
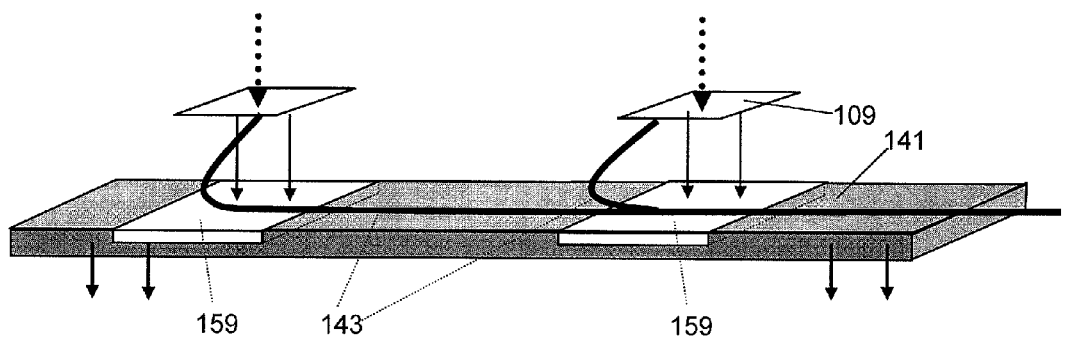
FIG. 35 is a schematic representation illustrating a power generator fixing member as an eighth preferred embodiment of the present invention.

In the example illustrated in FIG. 35, only two power receiving antennas 109 are attached to the fixing member 141. Actually, however, a lot more power receiving antennas 109 may be attached to the fixing member 141. As for the shape of the fixing member 141, the fixing member 141 is not required be an elongate one that runs in one direction. Instead, a grating structure may also be formed by combining a number of fixing members 141 that have the shape shown in FIG. 35.

When a module fixing device with such a configuration is adopted, the relative arrangement of the power transmitting and power receiving antennas and the distance between the power transmitting and power receiving antennas can be substantially the same between multiple modules just by attaching the solar power generating module of the seventh preferred embodiment to the module fixing device. Then, the installation work can get done more easily and its cost can be cut down. On top of that, even if the solar power generating modules are replaced on a module basis, the relative arrangement of the power transmitting and power receiving antennas and the distance between them can be easily kept proper and unchanged before and after the replacement. As a result, a variation in characteristic between the modules can be reduced.

As can be seen from the foregoing description, by introducing the solar power generation system of this preferred embodiment, the installation cost can be cut down thanks to the non-contact transmission. In addition, by transmitting power while increasing its voltage, the voltage of the solar power generating modules that tend to be low in the prior art can be increased significantly and a sufficiently high output energy can be maintained even when partial shading or local failure occurs.

EXAMPLES

Example 1

Hereinafter, a first specific example of the present invention will be described.

First of all, 36 single-crystal silicon based solar power generating elements (i.e., solar cells), of which the photosensitive plane had a square surface with a size of 12 cm each side, were connected together in series to obtain a solar power generating module with an output voltage of 18 V, an output current of 4 A, and an output impedance of 4.5Ω. An aluminum portion with a width of 12.5 cm was arranged around a power generating cell arrangement area with a size of 75 cm each side in order to provide the function of fixing the module to the first fixing member. As a result, the module occupied an area of 100 cm square. And an oscillator with an output frequency of 1 MHz and an output impedance Zoc of 5Ω was connected to the output terminal of that module with a DC cable. The oscillator, which was implemented as a class F amplifier, achieved an efficiency of 97.8%. In this first specific example, the oscillator has a voltage step-up ratio Zoc of 1.05.

The power transmitting and power receiving antennas were designed so as to have a resonant frequency of 1 MHz, which was equal to the output frequency of the oscillator. Specifically, the power transmitting antenna was fabricated by connecting a first inductor with an inductance of 6.0 µH and a first capacitor with a capacitance of 2500 pF in series together. On the other hand, the power receiving antenna was fabricated by connecting a second inductor with an inductance of 6.0 µH and a second capacitor with a capacitance of 2500 pF in parallel with each other. Each of the first and second inductors was a Litz wire that had been formed by arranging multiple sets of 120 copper wires, each having a diameter of 75 µm, in parallel with each other so that those sets were electrically insulated from each other. The two inductors both had a square shape with a size of 20 cm each side and their number of turns was 14. In the power transmitting antenna, the inductor circuit and its surrounding area were molded with an ABS resin with a dielectric constant of 3 so that its final outer shape would be a rectangular parallelepiped with dimensions of 30 cm×30 cm×3 cm (thickness). The power transmitting antenna, along with the oscillator, was mechanically fixed on the back surface of the module. Specifically, its position was set so that the power transmitting antenna would contact with an aluminum member on the end face of the module. In this case, the width of the molding resin was set to be 5 cm so that the molding resin arranged around the inductor circuit would prevent the power transmitting antenna from coming too close to the end face of the module made of a non-magnetic conductor. In such a state, the power transmitting antenna (resonator) had a non-loaded Q factor of 1680. The RF input terminal of the power transmitting antenna was connected to the output terminal of the oscillator to finish the module providing process. In this specific example, three modules were provided.

In the power receiving antenna, the inductor circuit and its surrounding area were also molded with an ABS resin with a dielectric constant of 3 so that its final outer shape would be a rectangular parallelepiped with dimensions of 32 cm×32 cm×4 cm (thickness). The power receiving antenna was mechanically fixed on a second fixing member of stainless steel with a length of 2 m and a thickness of 1 cm. Through holes were cut through the second fixing member in an area where the power receiving antenna was going to be fixed. Each of those through holes had a square shape with a size of 30 cm each side. Due to the presence of the molding resin around the inductor, the power receiving antenna could be fixed on the second fixing member without dropping into the through holes. The inductor portion of the power receiving antenna was projected onto the fixing member at the respective centers of the through holes. By adopting such an arrangement, the power receiving antenna could avoid coming too close to the non-magnetic conductor. An RF cable was also secured to the second fixing member and had its input terminal connected to the output terminal of the power receiving antenna. Three power receiving antennas were arranged along the second fixing member at an interval of 100 cm. The RF cable had a three-input, one-output configuration so that the outputs through the three output terminals could all be combined together within the RF cable and that the combined output could be provided. In such a state, the power receiving antenna (resonator) had a non-loaded Q factor of 1620. In this manner, the second fixing member providing processing step was done. By securing the second fixing member to a stainless steel member that had been provided as the first fixing member in order to fix the module, the second fixing member was arranged with respect to the module installation plane. The arrangement of the second fixing member was adjusted so that the height of the power receiving antenna as measured from the module installation plane became 10 cm, thereby getting the fixing member installation processing step done. Finally, the module was fixed onto the first fixing member, thereby completing every processing step to introduce the system. In this specific example, by providing a height adjustment function for the first fixing member, the relative distance between the power transmitting and power receiving antennas could be changed.

The power transmitting and power receiving antennas were arranged so that their front sides faced each other and were parallel to each other with a gap of g (cm) left between them. And with that gap g varied within the range of 5 cm through 75 cm, the best input and output impedances Zin and Zout that would maximize the RF transfer efficiency between the resonators with respect to each g value were derived in the following two steps: First of all, the RF characteristic between the input and output terminals of the two antennas (or resonators) was measured with a network analyzer with a terminal impedance of 50Ω, thereby obtaining measurement data with a reference impedance of 50Ω. In this processing step, when the measurement was carried out, the input terminal of the power transmitting antenna was not connected to the oscillator but used as a terminal for measurement. Next, based on the measurement data thus collected, the impedance conditions Zin and Zout for the input and output terminals that would minimize signal reflection at the terminals were derived by making circuit simulations.

Figure 36:
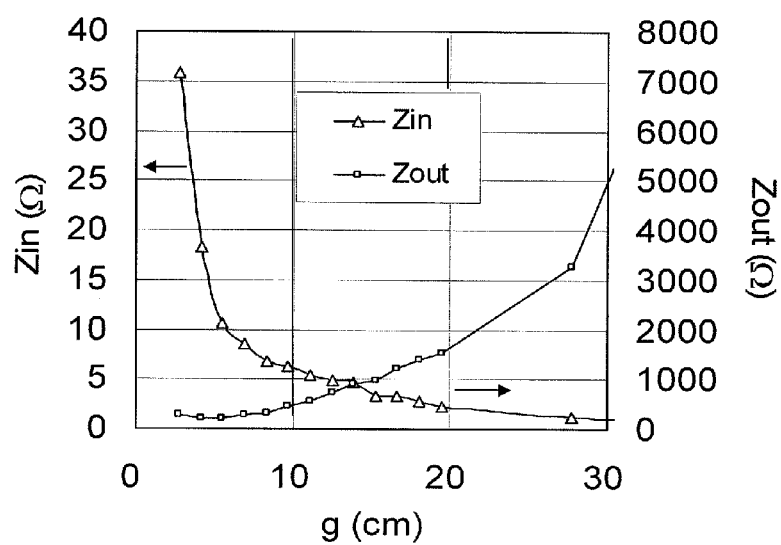
FIG. 36 is a graph showing the dependences of the input and output impedances Zin and Zout of the non-contact transmission section on the antenna-to-antenna gap in the first specific example of the present invention.
Figure 37:
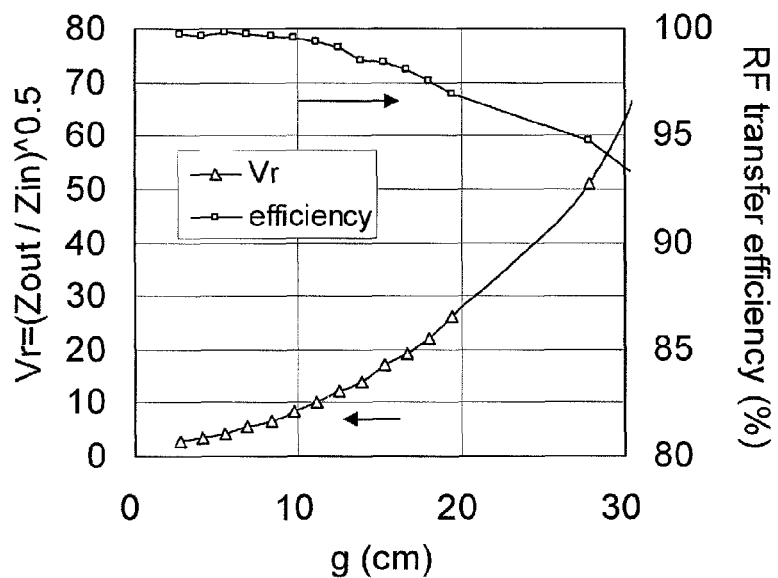
FIG. 37 is a graph showing how the input/output impedance conversion ratio Zr and the RF transfer efficiency of the non-contact transmission section depend on the antenna-to-antenna gap in the first specific example of the present invention.

FIG. 36 is a graph showing the g dependences of Zin and Zout derived. On the other hand, FIG. 37 is a graph showing the g dependences of the voltage step-up ratio V and the transfer efficiency of the wireless transmission section. As shown in FIG. 37, it was discovered that the Vr value was more than one through the entire range of the gap g and that the greater the gap g, the more steeply Vr increased. More specifically, when g=2.75 cm, Vr was 2.8. When g=4.2 cm, Vr was 3.5. And when g=42 cm, Vr was as large as 152. Also, when g=2.75 cm, the coupling coefficient k between the resonators was 0.376, which is just 4% greater than the k value of 0.361 to be derived for only the wireless transmission section by substituting Voc=1 for Equation (14). These results demonstrated the validity of Equation (14).

Furthermore, when g=11.1 cm, the Vr value obtained was 10.1. And when the height was increased to 16.67 cm, the Vr value was as high as 19.1. To get a high Vr value of 12.1, which was obtained when g=12.5, achieved by a conventional transformer, the ratio of the number of turns of secondary coil to that of primary coil should be set to be 12.1. In a specific example of the present invention, Vr could be increased to 12.1 while using the first and second inductors that had a number of turns ratio of one.

The forward pass characteristic to be obtained by matching the input and output terminal impedances to the input and output impedances Zin and Zout derived by the method described above corresponds to the RF transfer efficiency in the power generation system of the present invention. As shown in FIG. 37, even when g=11.1 cm, a RF transfer efficiency of as high as 99.4% could also be achieved.

According to the first specific example of the present invention, by connecting the oscillator described above to the wireless transmission section with g=11.1 cm, RF output could be obtained with an efficiency of as high as 97.2% from the input DC voltage in one set of solar power generation system. The voltage step-up ratio with respect to the input DC voltage was 11.7. Only a part of the input power would have changed into heat due to the loss that had been caused by slight mismatch between the circuit blocks. Also, when the respective outputs of three sets of solar power generation systems were combined together, the RF output was 209 W and the overall power efficiency was 97.1% with respect to a power of 215 W that has been generated by the module. Furthermore, with respect to a voltage of 18 V of the power generated by the module, the RF output power had an effective voltage value of 211 V and a voltage step-up ratio of 11.7.

Comparative Examples 1 to 3

As in Example 1 described above, two power generation systems, of which the wireless transmission section also included resonators with a resonant frequency of 1 MHz on both the transmitting and receiving ends, were made as Comparative Examples 1 and 2. The only difference between Example 1 and Comparative Examples 1 and 2 was that the two antennas (or resonators) of Comparative Examples 1 and 2 were of the same resonance type. More specifically, in Comparative Example 1, the two antennas thereof were both LC series resonant circuits. On the other hand, in Comparative Example 2, the two antennas thereof were both LC parallel resonant circuits. The circuit constants of each of these resonators were the same as those of Example 1. Meanwhile, Comparative Example 3, which was designed so that no resonance would be produced between the two antennas, was also made.

Example 2

In Example 1, the number of turns N1 of the first inductor of the power transmitting antenna was set to be equal to the number of turns N2 of the second inductor of the power receiving antenna. In a power generation system as Example 2 of the present invention, on the other hand, their numbers of turns were set to be different from each other. Specifically, in this Example 2, the number of turns N2 was increased from 14 to 28. However, the outer dimensions of those two antennas were the same as in Example 1.

Example 3

In Example 1, the power transmitting and power receiving antennas had the same size. In a power generation system as Example 3 of the present invention, on the other hand, the size of the power receiving antenna was set to be larger than that of the power transmitting antenna. Specifically, in this Example 3, the square defining the profile of the power receiving antenna was supposed to have a size of 40 cm each side. The molding resin surrounding the second inductor was supposed to have a width of 7 cm as in Example 1. And the through holes that had been cut through the second fixing member were supposed to have a size of 50 cm each side. In Example 3, the power transmitting and power receiving antennas were arranged so that the line segment connecting together the respective centers of mass of the power transmitting and power receiving antennas intersected with their arrangement planes at right angles.

The following Table 1 summarizes the structures of the resonators of Examples 1, 2 and 3 and Comparative Examples 1 to 3, and also shows the wireless transmission section characteristic when g=11.5 cm.

TABLE 1

| | Resonator on transmitting end | Resonator on receiving end | Zin (Ω) | Zout (Ω) | Vr | Wireless transfer efficiency (%) |
|---|---|---|---|---|---|---|
| Ex. 1 | Series resonance | Parallel resonance | 5.02 | 730 | 10.1 | 99.4 |
| Cmp. Ex. 1 | Series resonance | Series resonance | 6.4 | 6.4 | 1 | 99.3 |
| Cmp. Ex. 2 | Parallel resonance | Parallel resonance | 635 | 635 | 1 | 99.4 |
| Cmp. Ex. 3 | No resonance | No resonance | 60 | 60 | 1 | 1.1 |
| Ex. 2 | Series resonance | Parallel resonance | 5.21 | 1230 | 15.4 | 99.2 |
| Ex. 3 | Series resonance | Parallel resonance | 9.02 | 2530 | 16.7 | 98.8 |

As can be seen easily from Table 1, in Example 1, a very high voltage step-up ratio Vr could be achieved with high-efficiency power transmission realized by a non-contact method. On the other hand, in Examples 2 and 3, the Vr ratio achieved was even higher than in Example 1.

Example 4

As Example 4 of the present invention, a solar power generation system was made by connecting a voltage doubler rectifier circuit to the output of the power receiving antenna with the arrangement of Example 1 so as to combine the powers that have been output after that in parallel with each other. The half-wave voltage doubler rectifier circuit thus obtained achieved a DC conversion efficiency of as high as 97.4% with respect to an input with a frequency of 1 MHz. The rectifier circuit thus introduced realized a voltage boosting function with a voltage step-up ratio Vrr of two, at which the output DC voltage would be twice as high as the input RF voltage. And with respect to the output energy of the solar power generating section, the output DC energy provided by the power generation system of this example still had an intensity of 94.7%. The overall voltage step-up ratio was 21.2.

Example 5

As Example 5 of the present invention, a power generation system was made by connecting a bridge rectifier circuit to the output of the power receiving antenna with the arrangement of Example 1. The bridge rectifier circuit thus obtained achieved a DC conversion efficiency of as high as 97.3% at a resonant frequency of 1 MHz. With such a rectifier circuit introduced, the output DC energy provided by the power generation system of this example had an intensity of 94.5% with respect to the output energy of the solar power generating section.

Example 6 and Comparative Example 4

As Example 6 of the present invention, three power generation systems of Example 4 were further connected in parallel with each other and the powers that were collected from nine modules in total (corresponding to 324 cells) were combined together. In the same way, as Comparative Example 4, a solar power generation system was made by connecting the modules of the solar power generation system of Example 5 so that all cells were connected together in series without passing through any non-contact power transmission section. The following Table 2 summarizes the characteristics of Example 6 and Comparative Example 4:

TABLE 2

| | Total number of cells used | Number of cells connected in parallel | Number of cells connected in series | Output voltage (V) | Generated power (W) |
|---|---|---|---|---|---|
| Ex. 6 | 324 | 9 | 36 | 308 | 613 |
| Cmp. Ex. 4 | 324 | 1 | 324 | 160 | 642 |

Although the cells were internally connected in parallel with each other as many as nine times in Example 6, the output voltage achieved by Example 6 was 2.38 times as high as in Comparative Example 4. Consequently, this Example 6 realizes a power generation system that provides the best voltage value for a DC power supply system with a working voltage of 380 V. Also, when one of those component cells had its surface shielded with an obstacle, the generated power output decreased by as much as 78% in Comparative Example 4, although the quantity of the power generated had been maximized by the MPPT control. In Example 6, however, the generated power output decreased just by 8.3% and the voltage of the power generated could be maintained.

Example 7

Example 7 of the present invention is a different type of solar power generation system from any of Examples 1 through 6 described above. Specifically, in Example 7, the resonant frequency and transmission frequency of the power transmitting antenna were both set to be 100 kHz. The inductors of the power transmitting and power receiving antennas had a rectangular shape of 15 cm×30 cm (and the same thickness as in Example 1). The number of turns of parallel Litz wires that were used to form the inductor circuit was set to be 600. In the power transmitting antenna, the first inductor had a number of turns of 10 and the second inductor had a number of turns of 20. In Example 7, the distance g between the power transmitting and power receiving antennas that faced each other was set to be 1 cm. To achieve a low k characteristic even when the power transmitting and power receiving antennas were arranged that close to each other, the solar power generation system was established by shifting the power transmitting and power receiving antennas relative to each other so as to reduce the area of the overlapping portion between the respective projections of the power transmitting and power receiving antennas. Specifically, the wireless characteristic only in the non-contact transmission area was checked out with the power transmitting antenna slid along the longer side of the inductor shape. In this case, the magnitude of the relative slide is obtained by standardizing the length of the slide with the longer side length (of 30 cm) of the inductor. Specifically, if the magnitude of the relative slide is one, then it means that the respective inductors of the power transmitting and power receiving antennas do not overlap with each other. On the other hand, if the magnitude of the relative slide is zero, then it means that the respective inductors of the power transmitting and power receiving antennas completely overlap with each other.

Figure 38:
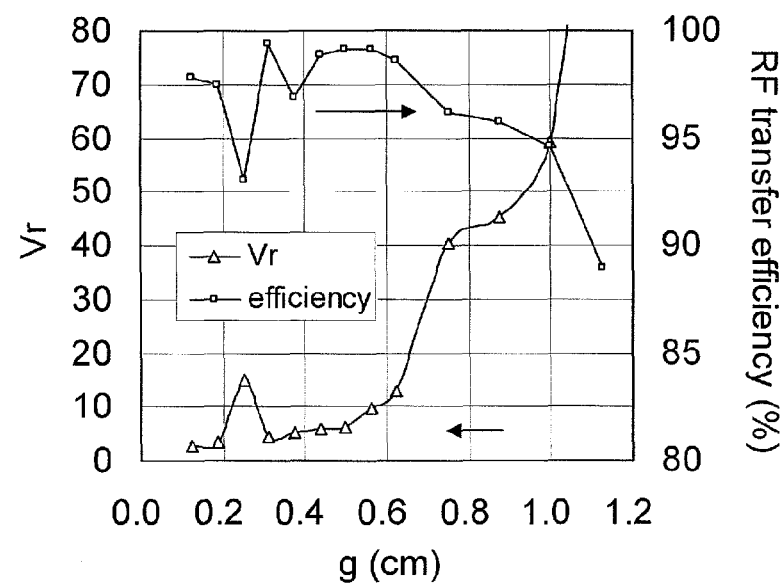
FIG. 38 is a graph showing how the voltage step-up ratio Vr and the RF transfer efficiency of the non-contact transmission section depend on the magnitude of relative slide in Example 7 of the present invention.

In FIG. 38, the abscissa represents the magnitude of the relative slide, the ordinate on the left-hand side represents Vr, and the ordinate on the right-hand side represents the transfer efficiency. As can be seen from FIG. 38, high voltage step-up ratio and high transfer efficiency were achieved at the same time in a broad range of the magnitude of the relative slide. For example, it can be seen that when the magnitude of relative slide was 0.563, a voltage step-up ratio of as high as 9.9 and a transfer efficiency of as high as 99.2% were achieved at the same time. On this condition, Zin was 5.1Ω and Zout was 500Ω. As for the property of connection with modules that followed, the non-contact transmission area under the magnitude of relative slide described above was used. When the oscillator arrangement (with a conversion efficiency of 98.3%) and the rectifier circuit (with a conversion efficiency of 97.6%) that were also used in Example 4 were adopted, the intensity of the output DC energy of this power generation system was 95.1% of that of the output energy of the solar power generating section. The overall voltage step-up ratio was 20.8. The results of this Example 7 proved that the voltage increased transmission of an embodiment of the present invention would be realized by not only increasing the distance between the power transmitting and power receiving antennas but also shifting one of the two antennas relative to the other and that the same effect would be achieved even by lowering the frequency.

According to the present invention, the output voltage of power generating elements of a power generating module can be increased easily. Thus, the present invention can be used effectively in not only a solar power generation system but also a fuel cell system or any other power generation system that generates low power.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

This application is based on U.S. Provisional Application No. 61/434,617 filed on Jan. 20, 2011, the entire contents of which are hereby incorporated by reference.

What is claimed is:

1. A power generation system comprising:
a plurality of power generating modules;
a module fixing device configured to fix the power generating modules onto an object; and
a combining section,
wherein each of the plurality of power generating modules includes
a power generating module body including a power generator configured to generate DC energy, and
a power transmitter attached to the power generating module body, the power transmitter including an oscillator that converts the DC energy into RF energy with a frequency f0 and a power transmitting antenna that is supplied with the RF energy from the oscillator and that transmits the RF energy as a resonant magnetic field, and
wherein the module fixing device includes
a first fixing member configured to fix the power generating modules,
a plurality of power receiving antennas, each of the plurality of power receiving antennas corresponding to one of the plurality of power generating modules and configured to receive at least a part of the RF energy transmitted by a corresponding power transmitting antenna, and
a second fixing member configured to fix the power receiving antennas, and
wherein the first fixing member and the second fixing member are configured to fix the plurality of power generating modules and the plurality of power receiving antennas, respectively, such that each of the power receiving antennas faces at least partially the corresponding power transmitting antenna, and
wherein the combining section is configured to combine the respective outputs of the power receiving antennas in parallel, and
wherein the power transmitting antenna is a series resonant circuit in which a first inductor and a first capacitor are connected in series, and
wherein the power receiving antenna is a parallel resonant circuit in which a second inductor and a second capacitor are connected in parallel, and
wherein a resonant frequency fT of the power transmitting antenna and a resonant frequency fR of the power receiving antenna are set to be equal to the frequency f0 of the RF energy, and
wherein the voltage step-up ratio Voc of the oscillator, the respective inductances L1 and L2 of the first inductor and the second inductor, and a coupling coefficient k between the power transmitting antenna and the power receiving antenna satisfy $(L2/L1) \geq 4\ (k/Voc)^2$.

2. The power generation system of claim 1, wherein an eddy current avoiding space, which occupies a broader area than the power transmitting antenna does, is defined on the surface of the second fixing member in an area surrounding the other side of the power receiving antenna that does not face the power transmitting antenna.

3. The power generation system of claim 2, wherein the eddy current avoiding space occupies a broader area than the power receiving antenna does.

4. The power generation system of claim 2, wherein the eddy current avoiding space occupies a broader area than any of projections of the power transmitting antenna and the power receiving antenna onto the same plane does.

5. The power generation system of one of claim 2, wherein the eddy current avoiding space comprises at least one of a magnetic body, a magnetic conductor, the air, water and a dielectric.

6. The power generation system of claim 1, wherein the gap between the power transmitting antenna and the power receiving antenna is filled with a dielectric including at least one of the air and water.

7. The power generation system of claim 1, wherein the power generating modules are solar power generating modules.

8. The power generation system of claim 7, wherein the solar power generating modules comprises crystalline silicon.

9. The power generation system of claim 7, wherein the solar power generating modules comprises a CIS-based material.

10. The power generation system of claim 2, wherein when an output terminal of the power receiving antenna is connected to a load that follows the power receiving antenna, the output impedance Zoc of the RF energy output from the oscillator is equal to the input impedance Zin of the power transmitting antenna.

11. The power generation system of claim 2, wherein when an output terminal of the oscillator is connected to an input terminal of the power transmitting antenna, the output impedance Zout of the power receiving antenna is equal to the input impedance of a load that follows the power receiving antenna.

12. The power generation system of claim 1, wherein $(L2/L1) \geq 100 \times (k/Voc)^2$ is satisfied.

13. The power generation system of claim 12, wherein $(L2/L1) \geq 10000 \times (k/Voc)^2$ is satisfied.

14. The power generation system of claim 1, wherein the first inductor and the second inductor have an air-core spiral structure.

15. The power generation system of claim 1, wherein $L1 < L2$ is satisfied.

16. The power generation system of claim 1, wherein the number N2 of turns of the second inductor is greater than the number N1 of turns of the first inductor.

17. The power generation system of claim 1, wherein the second inductor is larger in area than the first inductor.

18. A power generation system comprising:
a plurality of power generating modules;
a module fixing device configured to fix the power generating modules;
a combining section; and
a rectifier,
wherein each of the plurality of power generating modules includes
a power generating module body including a power generator configured to generate DC energy, and
a power transmitter attached to the power generating module body, the power transmitter including an oscillator that converts the DC energy into RF energy with a frequency f0 and a power transmitting antenna that is supplied with the RF energy from the oscillator and that transmits the RF energy as a resonant magnetic field, and
wherein the module fixing device includes
a first fixing member configured to fix the power generating modules,
a plurality of power receiving antennas, each of the plurality of power receiving antennas corresponding to one of the plurality of power generating modules and configured to receive at least a part of the RF energy transmitted by the corresponding power transmitting antenna, and
a second fixing member configured to fix the plurality of power receiving antennas, and
wherein the first fixing member and the second fixing member are configured to fix the plurality of power generating modules and the plurality of power receiving antennas, respectively, such that each of the power receiving antennas faces at least partially the corresponding power transmitting antenna, and
wherein the combining section is configured to combine the respective outputs of the power receiving antennas in parallel, and
wherein the rectifier is configured to rectify the combined output of the combining section, and
wherein the power transmitting antenna is a series resonant circuit in which a first inductor and a first capacitor are connected in series, and
wherein the power receiving antenna is a parallel resonant circuit in which a second inductor and a second capacitor are connected in parallel, and
wherein a resonant frequency fT of the power transmitting antenna and a resonant frequency fR of the power receiving antenna are set to be equal to the frequency f0 of the RF energy, and
wherein the voltage step-up ratio Voc of the oscillator, the voltage step-up ratio Vrr of the rectifier, the respective inductances L1 and L2 of the first inductor and the second inductor, and a coupling coefficient k between the power transmitting antenna and the power receiving antenna satisfy $(L2/L1) \geq 4 \, (k/(Voc \times Vrr))^2$.

19. The power generation system of claim 17, wherein the power generating section is a solar power generating section.

20. The power generation system of claim 18, wherein when an output terminal of the rectifier is connected to a load that follows the rectifier, the output impedance Zoc of the RF energy output from the oscillator is equal to the input impedance Zin of the power transmitting antenna.

21. The power generation system of claim 17, wherein when an output terminal of the oscillator is connected to an input terminal of the power transmitting antenna, the output impedance Zout of the rectifier is equal to the input impedance of a load that follows the rectifier.

22. The power generation system of claim 18, wherein $(L2/L1) \geq 100 \times (k/(Voc \times Vrr))^2$ is satisfied.

23. The power generation system of claim 18, wherein $(L2/L1) \geq 2304 \times (k/Voc)^2$ is satisfied.

24. The power generation system of claim 23, wherein $(L2/L1) \geq 10000 \times (k/Voc)^2$ is satisfied.

25. The power generation system of claim 18, wherein the rectifier is a voltage doubler rectifier circuit with a voltage step-up ratio Vrr of at least two.

26. A power generation system comprising:
a plurality of power generating modules;
a module fixing device configured to fix the power generating modules;

a combining section; and
a plurality of rectifiers,
wherein each of the plurality of power generating modules includes
a power generating module body including a power generator configured to generate DC energy, and
a power transmitter attached to the power generating module body, the power transmitter including an oscillator that converts the DC energy into RF energy with a frequency f0 and a power transmitting antenna that is supplied with the RF energy from the oscillator and that transmits the RF energy as a resonant magnetic field, and
wherein the module fixing device includes
a first fixing member configured to fix the power generating modules,
a plurality of power receiving antennas, each of the plurality of power receiving antennas corresponding to one of the plurality of power generating modules and configured to receive at least a part of the RF energy transmitted by the corresponding power transmitting antenna, and
a second fixing member configured to fix the power receiving antennas, and
wherein the first fixing member and the second fixing member are configured to fix the plurality of power generating modules and the plurality of power receiving antennas, respectively, such that each of the plurality of power receiving antennas faces at least partially the corresponding power transmitting antenna, and
wherein the plurality of rectifiers is configured to rectify the respective outputs of the plurality of power receiving antennas, and
wherein the combining section is configured to combine the respective outputs of the rectifiers in parallel, and
wherein the power transmitting antenna is a series resonant circuit in which a first inductor and a first capacitor are connected in series, and
wherein the power receiving antenna is a parallel resonant circuit in which a second inductor and a second capacitor are connected in parallel, and
wherein a resonant frequency fT of the power transmitting antenna and a resonant frequency fR of the power receiving antenna are set to be equal to the frequency f0 of the RF energy, and
wherein the voltage step-up ratio Voc of the oscillator, the voltage step-up ratio Vrr of the plurality of rectifiers, the respective inductances L1 and L2 of the first inductor and the second inductor, and a coupling coefficient k between the power transmitting antenna and the power receiving antenna satisfy $(L2/L1) \geq 4\ (k/(Voc \times Vrr))^2$.

27. A power generation system comprising:
a plurality of power generating modules;
a module fixing device configured to fix the power generating modules;
a combining section; and
a frequency converter,
wherein each of the plurality of power generating modules includes
a power generating module body including a power generator configured to generate DC energy, and
a power transmitter attached to the power generating module body, the power transmitter including an oscillator that converts the DC energy into RF energy with a frequency f0 and a power transmitting antenna that is supplied with the RF energy from the oscillator and that transmits the RF energy as a resonant magnetic field, and
wherein the module fixing device includes
a first fixing member configured to fix the power generating modules,
a plurality of power receiving antennas, each of the plurality of power receiving antennas corresponding to one of the plurality of power generating modules and configured to receive at least a part of the RF energy transmitted by the corresponding power transmitting antenna, and
a second fixing member configured to fix the power receiving antennas, and
wherein the first fixing member and the second fixing member are configured to fix the plurality of power generating modules and the plurality of power receiving antennas, respectively, such that each of the plurality of power receiving antennas faces at least partially the corresponding power transmitting antenna, and
wherein the combining section is configured to combine the respective outputs of the power receiving antennas in parallel, and
wherein the frequency converter is configured to convert the frequency of the combined output of the combining section, and
wherein the power transmitting antenna is a series resonant circuit in which a first inductor and a first capacitor are connected in series, and
wherein the power receiving antenna is a parallel resonant circuit in which a second inductor and a second capacitor are connected in parallel, and
wherein a resonant frequency fT of the power transmitting antenna and a resonant frequency fR of the power receiving antenna are set to be equal to the frequency f0 of the RF energy, and
wherein the voltage step-up ratio Voc of the oscillator, the voltage step-up ratio Vtr of the frequency converter, the respective inductances L1 and L2 of the first inductor and the second inductor, and a coupling coefficient k between the power transmitting antenna and the power receiving antenna satisfy $(L2/L1) \geq 4\ (k/(Voc \times Vtr))^2$.

28. The power generation system of claim 26, wherein the frequency converter converts the RF energy and the AC energy at a time.

29. A power generation system comprising:
a plurality of power generating modules;
a module fixing device, which fixes the power generating modules;
a combining section; and
a plurality of frequency converters,
wherein each of the plurality of power generating modules includes
a power generating module body including a power generator configured to generate DC energy, and
a power transmitter attached to the power generating module body, the power transmitter including an oscillator that converts the DC energy into RF energy with a frequency f0 and a power transmitting antenna that is supplied with the RF energy from the oscillator and that transmits the RF energy as a resonant magnetic field, and
wherein the module fixing device includes
a first fixing member configured to fix the plurality of power generating modules,
a plurality of power receiving antennas, each of the plurality of receiving antennas corresponding to one of the plurality of power generating modules and configured to receive at least a part of the RF energy transmitted by the corresponding power transmitting antenna, and a second fixing member configured to fix the power receiving antennas, and wherein the first fixing member and the second fixing member are configured to fix the plurality of power generating modules and the plurality of power receiving antennas, respectively, such that each of the plurality of power receiving antennas faces at least partially the corresponding power transmitting antenna, and wherein the plurality of frequency converters are configured to convert the respective frequencies of the outputs of the power receiving antennas, and wherein the combining section is configured to combine the respective outputs of the frequency converters in parallel, and wherein the power transmitting antenna is a series resonant circuit in which a first inductor and a first capacitor are connected in series, and wherein the power receiving antenna is a parallel resonant circuit in which a second inductor and a second capacitor are connected in parallel, and wherein a resonant frequency fT of the power transmitting antenna and a resonant frequency fR of the power receiving antenna are set to be equal to the frequency f0 of the RF energy, and wherein the voltage step-up ratio Voc of the oscillator, the voltage step-up ratio Vtr of the frequency converters, the respective inductances L1 and L2 of the first inductor and the second inductor, and a coupling coefficient k between the power transmitting antenna and the power receiving antenna satisfy $(L2/L1) \geq 4 (k/(Voc \times Vtr))^2$.

30. The power generation system of claim 29, wherein each said frequency converter converts the RF energy and the AC energy at a time.

31. A power generating module configured to operate in a power generating system including a plurality of power generating modules, the power generating module comprising:
a power generating module body including a power generator configured to generate DC energy;
a power transmitter attached to the power generating module body, the power transmitter including an oscillator that converts the DC energy into RF energy with a frequency f0 and a power transmitting antenna that is supplied with RF energy from the oscillator and that transmits the RF energy as a resonant magnetic field;
wherein the power transmitting antenna is a series resonant circuit in which a first inductor and a first capacitor are connected in series; and
a module frame configured to be fixed to a module fixing device of the power generating system, the module fixing device configured to fix the plurality of power generating modules onto an object, wherein the module fixing device includes:
a first fixing member configured to fix the plurality of power generating modules,
a plurality of power receiving antennas, each of the plurality of power receiving antennas corresponding to one of the plurality of power generating modules and configured to receive at least a part of the RF energy transmitted by a corresponding power transmitting antenna, and
a second fixing member configured to fix the power receiving antennas, and
wherein the first fixing member and the second fixing member are configured to fix the plurality of power generating modules and the plurality of power receiving antennas, respectively, such that each of the power receiving antennas faces at least partially the corresponding power transmitting antenna.

32. A module fixing device comprising:
a first fixing member configured to fix a plurality of power generating modules, each of the plurality of power generating modules including a power generating module body including a power generator configured to generate DC energy, and a power transmitter attached to the power generating module body, the power transmitter including an oscillator that converts the DC energy into RF energy with a frequency f0 and a power transmitting antenna that is supplied with the RF energy from the oscillator and that transmits the RF energy as a resonant magnetic field and that is a series resonant circuit in which a first inductor and a first capacitor are connected in series;
a plurality of power receiving antennas, each of the plurality of power receiving antennas corresponding to one of the plurality of power generating modules and configured to receive at least a part of the RF energy transmitted by the corresponding power transmitting antenna, and being a parallel resonant circuit in which a second inductor and a second capacitor are connected in parallel;
a second fixing member configured to fix the power receiving antennas, wherein each of the plurality of power receiving antennas faces at least partially the corresponding power transmitting antenna; and
a cable, to which the outputs of at least two of the plurality of power receiving antennas are input in parallel, and
wherein the first fixing member and the second fixing member are configured to fix the plurality of power generating modules and the plurality of power receiving antennas, respectively, such that each of the power receiving antennas faces at least partially the corresponding power transmitting antenna.

33. The module fixing device of claim 32, comprising
at least one first elongate member, which runs in a first direction and which is provided with the cable, and
a plurality of second elongate members, which run in the first direction but which are not provided with the cable,
wherein the first elongate member is interposed between two of the second elongate members, and
wherein powers that have been received from the power transmitting antennas of the power generating modules that are arranged on both sides of the elongate member of the first type are combined together through the cable that is provided for the elongate member of the first type.

34. A method for installing the power generation system of claim 1, the method comprising:
providing the module fixing device;
putting the module fixing device on the object;
providing the power generating modules; and
fixing the power generating modules onto the object with the first fixing member of the module fixing device.

35. The method of claim 34, wherein at least one of the step of providing the module fixing device and the step of providing the power generating modules is finished before the step of fixing the power generating modules onto the object with the first fixing member.

36. A power generating module of claim 31, further comprising a combining section that combines the respective outputs of the power receiving antennas in parallel, wherein;
the power receiving antenna is a parallel resonant circuit in which a second inductor and a second capacitor are connected in parallel;

a resonant frequency fT of the power transmitting antenna is set to be equal to a resonant frequency fR of the power receiving antenna and the frequency f0 of the RF energy; and the voltage step-up ratio Voc of the oscillator and the inductance L1 of the first inductor are set to satisfy $(L2/L1) \geq 4(k/Voc)^2$ where L2 is the inductance of the second inductor and k is a coupling coefficient between the power transmitting antenna and the power receiving antenna.

\* \* \* \* \*